United States Patent
Rosenblum et al.

(10) Patent No.: US 8,900,366 B2
(45) Date of Patent: Dec. 2, 2014

(54) APPARATUS FOR DEPOSITING A MULTILAYER COATING ON DISCRETE SHEETS

(75) Inventors: Martin Philip Rosenblum, Menlo Park, CA (US); Xi Chu, Fremont, CA (US); Lorenza Moro, San Carlos, CA (US); Kenneth Jeffrey Nelson, Sunnyvale, CA (US); Paul Burrows, Kennewick, WA (US); Mark E. Gross, Pasco, WA (US); Mac R. Zumhoff, Kennewick, WA (US); Peter M. Martin, Kennewick, WA (US); Charles C. Bonham, Richland, WA (US); Gordon L. Graff, West Richland, WA (US)

(73) Assignee: Samsung Display Co., Ltd., Yongin (KR)

( * ) Notice: Subject to any disclaimer, the term of this patent is extended or adjusted under 35 U.S.C. 154(b) by 1428 days.

(21) Appl. No.: 11/112,880

(22) Filed: Apr. 22, 2005

(65) Prior Publication Data
US 2005/0239294 A1    Oct. 27, 2005

Related U.S. Application Data

(63) Continuation-in-part of application No. 10/412,133, filed on Apr. 11, 2003.

(60) Provisional application No. 60/372,559, filed on Apr. 15, 2002.

(51) Int. Cl.
*C23C 14/00*    (2006.01)
(Continued)

(52) U.S. Cl.
CPC ........... *C23C 14/568* (2013.01); *H01L 51/0001* (2013.01); *H01L 51/5237* (2013.01);
(Continued)

(58) Field of Classification Search
USPC ........................................ 118/719, 724–726
See application file for complete search history.

(56) References Cited

U.S. PATENT DOCUMENTS

| 2,382,432 A | 8/1945 | McManus et al. |
| 2,384,500 A | 9/1945 | Stoll |

(Continued)

FOREIGN PATENT DOCUMENTS

| BE | 704 297 | 2/1968 |
| CA | 2353506 A1 | 5/2000 |

(Continued)

OTHER PUBLICATIONS

Wong, F.L., et al., "Long-lifetime thin-film encapsulated organic light-emitting diodes," Journal of Applied Physics 104, pp. 014509-1-4 (2008).

(Continued)

*Primary Examiner* — Karla Moore
(74) *Attorney, Agent, or Firm* — Dinsmore & Shohl LLP

(57) ABSTRACT

A tool for depositing multilayer coatings onto a substrate. In one configuration, the tool includes a includes an in-line organic material deposition station operating under at least one of a pressure or temperature controlled environment. In another, it further is of a hybrid design that incorporates both in-line and cluster tool features. In this latter configuration, at least one of the deposition stations is configured to deposit an inorganic layer, while at least one other deposition station is configured to deposit an organic layer. The tool is particularly well-suited to depositing multilayer coatings onto discrete substrates, as well as to encapsulating environmentally-sensitive devices placed on the flexible substrate.

47 Claims, 25 Drawing Sheets

(51) Int. Cl.

| | |
|---|---|
| *C23C 16/00* | (2006.01) |
| *H01L 51/52* | (2006.01) |
| *H01L 21/67* | (2006.01) |
| *B05D 3/06* | (2006.01) |
| *C23C 14/56* | (2006.01) |
| *B05D 7/00* | (2006.01) |
| *B05D 1/00* | (2006.01) |
| *H01L 51/00* | (2006.01) |
| *H01L 51/56* | (2006.01) |

(52) U.S. Cl.
CPC .......... *H01L 21/67155* (2013.01); *H01L 51/56* (2013.01); *B05D 3/067* (2013.01); *H01L 21/67236* (2013.01); *H01L 2251/5338* (2013.01); *H01L 21/67207* (2013.01); *B05D 7/52* (2013.01); *B05D 1/60* (2013.01); *H01L 51/001* (2013.01)
USPC .......................... 118/719; 118/724; 118/726

(56) References Cited

U.S. PATENT DOCUMENTS

| | | | |
|---|---|---|---|
| 3,475,307 A | 10/1969 | Knox et al. | |
| 3,607,365 A | 9/1971 | Lindlof | |
| 3,661,117 A * | 5/1972 | Cornelius et al. | 118/724 |
| 3,941,630 A | 3/1976 | Larrabee | |
| 4,061,835 A | 12/1977 | Poppe et al. | |
| 4,098,965 A | 7/1978 | Kinsman | |
| 4,266,223 A | 5/1981 | Frame | |
| 4,283,482 A | 8/1981 | Hattori et al. | |
| 4,313,254 A * | 2/1982 | Feldman et al. | 438/72 |
| 4,426,275 A | 1/1984 | Meckel et al. | |
| 4,521,458 A | 6/1985 | Nelson | |
| 4,537,814 A | 8/1985 | Itoh et al. | |
| 4,555,274 A | 11/1985 | Kitajima et al. | |
| 4,557,978 A | 12/1985 | Mason | |
| 4,572,845 A | 2/1986 | Dietrich et al. | |
| 4,581,337 A | 4/1986 | Frey et al. | |
| 4,624,867 A | 11/1986 | Iijima et al. | |
| 4,695,618 A | 9/1987 | Mowrer | |
| 4,710,426 A | 12/1987 | Stephens | |
| 4,722,515 A | 2/1988 | Ham | |
| 4,768,666 A | 9/1988 | Kessler | |
| 4,842,893 A * | 6/1989 | Yializis et al. | 427/497 |
| 4,843,036 A | 6/1989 | Schmidt et al. | |
| 4,855,186 A | 8/1989 | Grolig et al. | |
| 4,889,609 A | 12/1989 | Cannella | |
| 4,913,090 A | 4/1990 | Harada et al. | |
| 4,931,158 A | 6/1990 | Bunshah et al. | |
| 4,934,315 A | 6/1990 | Linnebach et al. | |
| 4,954,371 A | 9/1990 | Yializis | |
| 4,977,013 A | 12/1990 | Ritchie et al. | |
| 5,032,461 A | 7/1991 | Shaw et al. | |
| 5,036,249 A | 7/1991 | Pike-Biegunski et al. | |
| 5,047,131 A | 9/1991 | Wolfe et al. | |
| 5,059,861 A | 10/1991 | Littman et al. | |
| 5,124,204 A | 6/1992 | Yamashita et al. | |
| 5,189,405 A | 2/1993 | Yamashita et al. | |
| 5,203,898 A | 4/1993 | Carpenter et al. | |
| 5,204,314 A | 4/1993 | Kirlin et al. | |
| 5,237,439 A | 8/1993 | Misono et al. | |
| 5,260,095 A | 11/1993 | Affinito | |
| 5,336,324 A | 8/1994 | Stall et al. | |
| 5,354,497 A | 10/1994 | Fukuchi et al. | |
| 5,356,947 A | 10/1994 | Ali et al. | |
| 5,357,063 A | 10/1994 | House et al. | |
| 5,376,467 A | 12/1994 | Abe et al. | |
| 5,393,607 A | 2/1995 | Kawasaki et al. | |
| 5,395,644 A | 3/1995 | Affinito | |
| 5,402,314 A | 3/1995 | Amago et al. | |
| 5,427,638 A | 6/1995 | Goetz et al. | |
| 5,440,446 A | 8/1995 | Shaw et al. | |
| 5,451,449 A | 9/1995 | Shetty et al. | |
| 5,461,545 A | 10/1995 | Leroy et al. | |
| 5,464,667 A | 11/1995 | Kohler et al. | |
| 5,510,173 A | 4/1996 | Pass et al. | |
| 5,512,320 A | 4/1996 | Turner et al. | |
| 5,536,323 A | 7/1996 | Kirlin et al. | |
| 5,547,508 A | 8/1996 | Affinito | |
| 5,554,220 A | 9/1996 | Forrest et al. | |
| 5,576,101 A | 11/1996 | Saitoh et al. | |
| 5,578,141 A | 11/1996 | Mori et al. | |
| 5,607,789 A | 3/1997 | Treger et al. | |
| 5,620,524 A | 4/1997 | Fan et al. | |
| 5,629,389 A | 5/1997 | Roitman et al. | |
| 5,652,192 A | 7/1997 | Matson et al. | |
| 5,654,084 A | 8/1997 | Egert | |
| 5,660,961 A | 8/1997 | Yu | |
| 5,665,280 A | 9/1997 | Tropsha | |
| 5,681,615 A | 10/1997 | Affinito et al. | |
| 5,681,666 A | 10/1997 | Treger et al. | |
| 5,684,084 A | 11/1997 | Lewin et al. | |
| 5,686,360 A | 11/1997 | Harvey, III et al. | |
| 5,693,956 A | 12/1997 | Shi et al. | |
| 5,695,564 A | 12/1997 | Imahashi | |
| 5,711,816 A | 1/1998 | Kirlin et al. | |
| 5,725,909 A | 3/1998 | Shaw et al. | |
| 5,731,661 A | 3/1998 | So et al. | |
| 5,736,207 A | 4/1998 | Walther et al. | |
| 5,747,182 A | 5/1998 | Friend et al. | |
| 5,757,126 A | 5/1998 | Harvey, III et al. | |
| 5,759,329 A | 6/1998 | Krause et al. | |
| 5,771,177 A | 6/1998 | Tada et al. | |
| 5,771,562 A | 6/1998 | Harvey, III et al. | |
| 5,782,355 A | 7/1998 | Katagiri et al. | |
| 5,792,550 A | 8/1998 | Phillips et al. | |
| 5,795,399 A | 8/1998 | Hasegawa et al. | |
| 5,811,177 A | 9/1998 | Shi et al. | |
| 5,811,183 A | 9/1998 | Shaw et al. | |
| 5,821,138 A | 10/1998 | Yamazaki et al. | |
| 5,821,692 A | 10/1998 | Rogers et al. | |
| 5,844,363 A | 12/1998 | Gu et al. | |
| 5,869,791 A | 2/1999 | Young | |
| 5,872,355 A | 2/1999 | Hueschen | |
| 5,891,554 A | 4/1999 | Hosokawa et al. | |
| 5,895,228 A | 4/1999 | Biebuyck et al. | |
| 5,902,641 A | 5/1999 | Affinito et al. | |
| 5,902,688 A | 5/1999 | Antoniadis et al. | |
| 5,904,958 A * | 5/1999 | Dick et al. | 427/248.1 |
| 5,912,069 A | 6/1999 | Yializis et al. | |
| 5,919,328 A | 7/1999 | Tropsha et al. | |
| 5,920,080 A | 7/1999 | Jones | |
| 5,922,161 A | 7/1999 | Wu et al. | |
| 5,929,562 A | 7/1999 | Pichler | |
| 5,934,856 A | 8/1999 | Asakawa et al. | |
| 5,945,174 A | 8/1999 | Shaw et al. | |
| 5,948,552 A | 9/1999 | Antoniadis et al. | |
| 5,952,778 A | 9/1999 | Haskal et al. | |
| 5,955,161 A | 9/1999 | Tropsha | |
| 5,965,907 A | 10/1999 | Huang et al. | |
| 5,968,620 A | 10/1999 | Harvey et al. | |
| 5,994,174 A | 11/1999 | Carey et al. | |
| 5,996,498 A | 12/1999 | Lewis | |
| 6,013,337 A | 1/2000 | Knors | |
| 6,040,017 A | 3/2000 | Mikhael et al. | |
| 6,045,864 A | 4/2000 | Lyons et al. | |
| 6,066,826 A | 5/2000 | Yializis | |
| 6,083,313 A | 7/2000 | Venkatraman et al. | |
| 6,083,628 A | 7/2000 | Yializis | |
| 6,084,702 A | 7/2000 | Byker et al. | |
| 6,087,007 A | 7/2000 | Fuji et al. | |
| 6,092,269 A | 7/2000 | Yializis et al. | |
| 6,106,627 A | 8/2000 | Yializis et al. | |
| 6,117,266 A | 9/2000 | Horzel et al. | |
| 6,118,218 A | 9/2000 | Yializis et al. | |
| 6,137,221 A | 10/2000 | Roitman et al. | |
| 6,146,225 A | 11/2000 | Sheats et al. | |
| 6,146,462 A | 11/2000 | Yializis et al. | |
| 6,150,187 A | 11/2000 | Zyung et al. | |
| 6,165,566 A | 12/2000 | Tropsha | |
| 6,178,082 B1 | 1/2001 | Farooq et al. | |
| 6,195,142 B1 | 2/2001 | Gyotoku et al. | |
| 6,198,217 B1 | 3/2001 | Suzuki et al. | |

(56) References Cited

U.S. PATENT DOCUMENTS

| | | |
|---|---|---|
| 6,198,220 B1 | 3/2001 | Jones et al. |
| 6,203,898 B1 | 3/2001 | Kohler et al. |
| 6,207,238 B1 | 3/2001 | Affinito |
| 6,207,239 B1 | 3/2001 | Affinito |
| 6,214,422 B1 | 4/2001 | Yializis |
| 6,217,947 B1 | 4/2001 | Affinito |
| 6,224,948 B1 | 5/2001 | Affinito |
| 6,228,434 B1 | 5/2001 | Affinito |
| 6,228,436 B1 | 5/2001 | Affinito |
| 6,231,939 B1 | 5/2001 | Shaw et al. |
| 6,264,747 B1 | 7/2001 | Shaw et al. |
| 6,268,695 B1 | 7/2001 | Affinito |
| 6,274,204 B1 | 8/2001 | Affinito |
| 6,322,860 B1 | 11/2001 | Stein et al. |
| 6,333,065 B1 | 12/2001 | Arai et al. |
| 6,348,237 B2 | 2/2002 | Kohler et al. |
| 6,350,034 B1 | 2/2002 | Fleming et al. |
| 6,352,777 B1 | 3/2002 | Bulovic et al. |
| 6,358,570 B1 | 3/2002 | Affinito |
| 6,361,885 B1 | 3/2002 | Chou |
| 6,387,732 B1 | 5/2002 | Akram |
| 6,397,776 B1 | 6/2002 | Yang et al. |
| 6,413,645 B1 | 7/2002 | Graff et al. |
| 6,416,872 B1 | 7/2002 | Maschwitz |
| 6,420,003 B2 | 7/2002 | Shaw et al. |
| 6,436,544 B1 | 8/2002 | Veyrat et al. |
| 6,440,277 B1 | 8/2002 | D'Amato |
| 6,465,953 B1 | 10/2002 | Duggal |
| 6,468,595 B1 | 10/2002 | Mikhael et al. |
| 6,469,437 B1 | 10/2002 | Parthasarathy et al. |
| 6,492,026 B1 | 12/2002 | Graff et al. |
| 6,497,598 B2 | 12/2002 | Affinito |
| 6,497,924 B2 | 12/2002 | Affinito et al. |
| 6,509,065 B2 | 1/2003 | Affinito |
| 6,512,561 B1 | 1/2003 | Terashita et al. |
| 6,522,067 B1 | 2/2003 | Graff et al. |
| 6,537,688 B2 | 3/2003 | Silvernail et al. |
| 6,544,600 B2 | 4/2003 | Affinito et al. |
| 6,548,912 B1 | 4/2003 | Graff et al. |
| 6,569,515 B2 | 5/2003 | Hebrink et al. |
| 6,570,325 B2 | 5/2003 | Graff et al. |
| 6,573,652 B1 | 6/2003 | Graff et al. |
| 6,576,351 B2 | 6/2003 | Silvernail |
| 6,592,969 B1 | 7/2003 | Burroughes et al. |
| 6,597,111 B2 | 7/2003 | Silvernail et al. |
| 6,613,395 B2 | 9/2003 | Affinito et al. |
| 6,614,057 B2 | 9/2003 | Silvernail et al. |
| 6,624,568 B2 | 9/2003 | Silvernail |
| 6,627,267 B2 | 9/2003 | Affinito |
| 6,628,071 B1 | 9/2003 | Su |
| 6,653,780 B2 | 11/2003 | Sugimoto et al. |
| 6,656,537 B2 | 12/2003 | Affinito et al. |
| 6,660,409 B1 | 12/2003 | Komatsu et al. |
| 6,664,137 B2 | 12/2003 | Weaver |
| 6,681,716 B2 | 1/2004 | Schaepkens |
| 6,710,542 B2 | 3/2004 | Chun et al. |
| 6,720,203 B2 | 4/2004 | Carcia et al. |
| 6,734,625 B2 | 5/2004 | Vong et al. |
| 6,737,753 B2 | 5/2004 | Kumar et al. |
| 6,743,524 B2 | 6/2004 | Schaepkens |
| 6,749,940 B1 | 6/2004 | Terasaki et al. |
| 6,765,351 B2 | 7/2004 | Forrest et al. |
| 6,803,245 B2 | 10/2004 | Auch et al. |
| 6,811,829 B2 | 11/2004 | Affinito et al. |
| 6,815,887 B2 | 11/2004 | Lee et al. |
| 6,818,291 B2 | 11/2004 | Funkenbusch et al. |
| 6,822,391 B2 | 11/2004 | Yamazaki et al. |
| 6,827,788 B2 * | 12/2004 | Takahashi ............ 118/719 |
| 6,835,950 B2 | 12/2004 | Brown et al. |
| 6,836,070 B2 | 12/2004 | Chung et al. |
| 6,837,950 B1 | 1/2005 | Berard |
| 6,864,629 B2 | 3/2005 | Miyaguchi et al. |
| 6,866,901 B2 | 3/2005 | Burrows et al. |
| 6,867,539 B1 | 3/2005 | McCormick et al. |
| 6,872,114 B2 | 3/2005 | Chung et al. |
| 6,872,248 B2 | 3/2005 | Mizutani et al. |
| 6,872,428 B2 | 3/2005 | Yang et al. |
| 6,878,467 B2 | 4/2005 | Chung et al. |
| 6,888,305 B2 | 5/2005 | Weaver |
| 6,888,307 B2 | 5/2005 | Silvernail et al. |
| 6,891,330 B2 | 5/2005 | Duggal et al. |
| 6,897,474 B2 | 5/2005 | Brown et al. |
| 6,897,607 B2 | 5/2005 | Sugimoto et al. |
| 6,905,769 B2 | 6/2005 | Komada |
| 6,923,702 B2 | 8/2005 | Graff et al. |
| 6,936,131 B2 | 8/2005 | McCormick et al. |
| 6,975,067 B2 | 12/2005 | McCormick et al. |
| 6,994,933 B1 | 2/2006 | Bates |
| 6,998,648 B2 | 2/2006 | Silvernail |
| 7,002,294 B2 | 2/2006 | Forrest et al. |
| 7,012,363 B2 | 3/2006 | Weaver et al. |
| 7,015,640 B2 | 3/2006 | Schaepkens et al. |
| 7,018,713 B2 | 3/2006 | Padiyath et al. |
| 7,029,765 B2 | 4/2006 | Kwong et al. |
| 7,033,850 B2 | 4/2006 | Tyan et al. |
| 7,056,584 B2 | 6/2006 | Iacovangelo |
| 7,074,501 B2 | 7/2006 | Czeremuszkin et al. |
| 7,086,918 B2 | 8/2006 | Hsiao et al. |
| 7,112,351 B2 | 9/2006 | Affinito |
| 7,156,942 B2 | 1/2007 | McCormick et al. |
| 7,166,007 B2 | 1/2007 | Auch et al. |
| 7,183,197 B2 | 2/2007 | Won et al. |
| 7,186,465 B2 | 3/2007 | Bright |
| 7,198,832 B2 | 4/2007 | Burrows et al. |
| 7,221,093 B2 | 5/2007 | Auch et al. |
| 7,255,823 B1 | 8/2007 | Guenther et al. |
| 7,298,072 B2 | 11/2007 | Czeremuszkin et al. |
| 7,429,300 B2 * | 9/2008 | Kido et al. ............ 118/719 |
| 2001/0006827 A1 | 7/2001 | Yamazaki et al. |
| 2001/0015074 A1 | 8/2001 | Hosokawa |
| 2001/0015620 A1 | 8/2001 | Affinito |
| 2001/0044035 A1 | 11/2001 | Morii |
| 2002/0015818 A1 | 2/2002 | Takahashi et al. |
| 2002/0022156 A1 | 2/2002 | Bright |
| 2002/0025444 A1 | 2/2002 | Hebgrink et al. |
| 2002/0068143 A1 | 6/2002 | Silvernail |
| 2002/0069826 A1 | 6/2002 | Hunt et al. |
| 2002/0102363 A1 | 8/2002 | Affinito et al. |
| 2002/0102818 A1 | 8/2002 | Sandhu et al. |
| 2002/0125822 A1 | 9/2002 | Graff et al. |
| 2002/0139303 A1 | 10/2002 | Yamazaki et al. |
| 2002/0140347 A1 | 10/2002 | Weaver |
| 2003/0038590 A1 | 2/2003 | Silvernail et al. |
| 2003/0045021 A1 | 3/2003 | Akai |
| 2003/0085652 A1 | 5/2003 | Weaver |
| 2003/0098647 A1 | 5/2003 | Silvernail et al. |
| 2003/0117068 A1 | 6/2003 | Forrest et al. |
| 2003/0124392 A1 | 7/2003 | Bright |
| 2003/0127973 A1 | 7/2003 | Weaver et al. |
| 2003/0134487 A1 | 7/2003 | Breen et al. |
| 2003/0184222 A1 | 10/2003 | Nilsson et al. |
| 2003/0197197 A1 | 10/2003 | Brown et al. |
| 2003/0218422 A1 | 11/2003 | Park et al. |
| 2003/0235648 A1 | 12/2003 | Affinito et al. |
| 2004/0018305 A1 | 1/2004 | Pagano et al. |
| 2004/0029334 A1 | 2/2004 | Bijker et al. |
| 2004/0046497 A1 | 3/2004 | Schaepkens et al. |
| 2004/0071971 A1 | 4/2004 | Iacovangelo |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0209090 A1 | 10/2004 | Iwanaga |
| 2004/0212759 A1 | 10/2004 | Hayashi |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0051094 A1 | 3/2005 | Schaepkens et al. |
| 2005/0079295 A1 | 4/2005 | Schaepkens |

(56) References Cited

U.S. PATENT DOCUMENTS

| | | |
|---|---|---|
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0115603 A1 | 6/2005 | Yoshhida et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0174045 A1 | 8/2005 | Lee et al. |
| 2005/0176181 A1 | 8/2005 | Burrows et al. |
| 2005/0202646 A1 | 9/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2006/0001040 A1 | 1/2006 | Kim et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |
| 2006/0063015 A1 | 3/2006 | McCormick et al. |
| 2006/0132461 A1 | 6/2006 | Furukawa et al. |
| 2006/0216951 A1 | 9/2006 | Moro et al. |
| 2006/0246811 A1 | 11/2006 | Winters et al. |
| 2006/0250084 A1 | 11/2006 | Cok et al. |
| 2006/0291034 A1 | 12/2006 | Patry et al. |
| 2007/0009674 A1 | 1/2007 | Okubo et al. |
| 2007/0033965 A1 | 2/2007 | Lifson et al. |
| 2007/0281089 A1 | 12/2007 | Heller et al. |
| 2010/0193468 A1 | 8/2010 | Burrows et al. |

FOREIGN PATENT DOCUMENTS

| | | |
|---|---|---|
| DE | 196 03 746 A1 | 4/1997 |
| DE | 696 15 510 T2 | 5/2002 |
| EP | 0 147 696 B1 | 7/1985 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 722 787 A2 | 7/1996 |
| EP | 0 777 280 B1 | 6/1997 |
| EP | 0 777 281 A2 | 6/1997 |
| EP | 0 787 824 A2 | 6/1997 |
| EP | 0 787 826 A1 | 6/1997 |
| EP | 0 916 394 A2 | 5/1998 |
| EP | 0 915 105 A1 | 5/1999 |
| EP | 0 931 850 A1 | 7/1999 |
| EP | 0 977 469 A2 | 2/2000 |
| EP | 1 021 070 A1 | 7/2000 |
| EP | 1 127 381 A1 | 8/2001 |
| EP | 1 130 420 A1 | 9/2001 |
| EP | 1 278 244 A2 | 1/2003 |
| EP | 1 426 813 A2 | 6/2004 |
| EP | 1 514 317 A1 | 3/2005 |
| GB | 2 210 826 A | 6/1989 |
| JP | S63-96895 | 4/1988 |
| JP | 63136316 | 6/1988 |
| JP | 64-18441 | 1/1989 |
| JP | 01041067 | 2/1989 |
| JP | S64-41192 | 2/1989 |
| JP | 2-183230 | 7/1990 |
| JP | 3-183759 | 8/1991 |
| JP | 3-290375 | 12/1991 |
| JP | 4-14440 | 1/1992 |
| JP | 4-48515 | 2/1992 |
| JP | 4-1440 | 4/1992 |
| JP | 04267097 | 9/1992 |
| JP | 05-217158 | 1/1993 |
| JP | 5-147678 | 6/1993 |
| JP | 05182759 | 7/1993 |
| JP | 06-104206 | 4/1994 |
| JP | 06-136159 | 5/1994 |
| JP | 61-79644 | 6/1994 |
| JP | 06158305 | 6/1994 |
| JP | 06-196260 | 7/1994 |
| JP | 06-223966 | 8/1994 |
| JP | 6-234186 | 8/1994 |
| JP | 07-074378 | 3/1995 |
| JP | 7147189 | 6/1995 |
| JP | 07192866 | 7/1995 |
| JP | 8-72188 | 3/1996 |
| JP | 8-179292 | 7/1996 |
| JP | 08171988 | 7/1996 |
| JP | 08-203669 | 8/1996 |
| JP | 08325713 | 10/1996 |
| JP | 8-318590 | 12/1996 |
| JP | 09059763 | 4/1997 |
| JP | 09-232553 | 5/1997 |
| JP | 09132774 | 5/1997 |
| JP | 09-161967 | 6/1997 |
| JP | 9-161967 | 6/1997 |
| JP | 9-201897 | 8/1997 |
| JP | 09-232553 | 9/1997 |
| JP | 10-725 | 1/1998 |
| JP | 10-013083 | 1/1998 |
| JP | 10-016150 | 1/1998 |
| JP | 10312883 | 11/1998 |
| JP | 10-334744 | 12/1998 |
| JP | 11-017106 | 1/1999 |
| JP | 11-040344 | 2/1999 |
| JP | 11-149826 | 6/1999 |
| JP | 11-255923 | 9/1999 |
| JP | 2000-058258 | 2/2000 |
| JP | 2002/505969 | 2/2002 |
| JP | 2002-117973 | 4/2002 |
| JP | 2002-151254 | 5/2002 |
| JP | 2003-123969 | 4/2003 |
| JP | 2003-217845 | 7/2003 |
| JP | 2004-176111 A | 6/2004 |
| JP | 2004-294601 | 10/2004 |
| JP | 3579556 B2 | 10/2004 |
| JP | 2004-309932 | 11/2004 |
| JP | 2004-353021 | 12/2004 |
| JP | 2006-294780 | 10/2006 |
| JP | 2008-275737 | 11/2008 |
| WO | WO 87/07848 | 12/1987 |
| WO | WO 89/00337 | 1/1989 |
| WO | WO 95/10117 | 4/1995 |
| WO | WO 96/23217 | 8/1996 |
| WO | WO 97/04885 | 2/1997 |
| WO | WO 97/16053 | 5/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | WO 99/46120 | 9/1999 |
| WO | WO 00/26973 | 5/2000 |
| WO | WO 00/35603 | 6/2000 |
| WO | WO 00/35604 | 6/2000 |
| WO | WO 00/35993 | 6/2000 |
| WO | WO 00/36661 | 6/2000 |
| WO | WO 00/36665 | 6/2000 |
| WO | 00/53423 A1 | 9/2000 |
| WO | 0157904 A1 | 8/2001 |
| WO | WO 00/68360 | 9/2001 |
| WO | WO 01/81649 A1 | 11/2001 |
| WO | WO 01/82336 A2 | 11/2001 |
| WO | WO 01/82389 A1 | 11/2001 |
| WO | WO 01/87825 A1 | 11/2001 |
| WO | WO 01/89006 A1 | 11/2001 |
| WO | WO 02/26973 A1 | 4/2002 |
| WO | WO 03/016589 A1 | 2/2003 |
| WO | 03/090260 A2 | 10/2003 |
| WO | WO 03/098716 A1 | 11/2003 |

(56) References Cited

FOREIGN PATENT DOCUMENTS

| WO | WO 2004/006199 A2 | 1/2004 |
|---|---|---|
| WO | WO 2004/016992 A1 | 2/2004 |
| WO | WO 2004/070840 A1 | 8/2004 |
| WO | WO 2004/089620 A2 | 10/2004 |
| WO | 2004/112165 A1 | 12/2004 |
| WO | WO 2005/015655 A1 | 2/2005 |
| WO | WO 2005/045947 A2 | 5/2005 |
| WO | WO 2005/048368 A1 | 5/2005 |
| WO | 2005050754 A1 | 6/2005 |
| WO | WO 2006/036492 A1 | 4/2006 |

OTHER PUBLICATIONS otb Engineering Organic Light Emitting Diodes; 6th Annual Display Search US FPD Conference; JA Eindhoven, The Netherlands, website: www.otb.nl.

Akedo et al., "LP-5: Lake-News Poster: Plasma-CVD SiNx/Plasma-Polymerized CNx:H Multi-layer Passivation Films for Organic Light Emmitting Diods", SID 03 Digest.

Chwang et al., "Thin Film encapsulated flexible organic electroluminescent displays", American Institute of Physics, 2003.

Clark I. Bright, et al., Transparent Barrier Coatings Based on ITO for Flexible Plastic Displays, Oct. 17-19, 1999, pp. 247-264, Tucson, Arizona.

Kim, Han-Ki et al., "Magnetic Field Shape Effect on Electrical Properties of TOLEDs in the Deposition of ITO Top Cathode Layer", Electrochemical and Solid-State Letters, 8 (12), (2005), pp. H103-H105.

Moro, L. et al., "Process and design of a multilayer thin film encapsulation of passive matrix OLED displays", Organic Light-Emitting Materials and Devices VII, Proceedings of SPIE vol. 5214, 2004, pp. 83-93.

otb Engineering Organic Light Emitting Diodes; JA Eindhoven; The Netherlands, website: www.otb.nl; $6^{th}$ Annual Display Search US FPD Conference; Mar. 30-Apr. 1, 2004.

Affinito, J.D. et al.; "A new method for fabricating transparent barrier layers" $23^{rd}$ International Conference on Metallurgical Coatings and Thin Films; San Diego, CA, USA Apr. 22-26, 1996; vol. 290-291; pp. 63-67; XP004173291 Thin Solid Films; Dec. 15, 1996; Elsevier, Switzerland, ISSN: 0040-6090.

Graupner, W. et al.; "High Resolution Color Organic Light Emitting Diode Microdisplay Fabrication Method" SPIE Proceedings 4207; 11-19, 2000 pp. 1-9.

Yializis, A.; "High Oxygen Barrier Polypropylene Films Using Transparent Acrylate-$A_xO_{c3}$ and Opaque Al-Acrylate Coatings" 1995 Society of Vacuum Coaters; $38^{th}$ Annual Technical Conference Proceedings; Dec. 1995; pp. 95-102.

Brunshah, R.F. et al.; "Deposition Technologies for Films and Coatings" Noyes Publications; Park Ridge, New Jersey; 1982; p. 339.

Affinito, J.D.; Energy Res. Abstr. 18(6); #17171; 1993.

Czeremuszkin, G. et al.; "Permeation Through Defects in Transparent Barrier Coated Plastic Films" $43^{rd}$ Annual Technical Conference Proceedings; Apr. 15, 2000; pp. 408-413.

Klemberg-Sapieha, J.E. et al.; "Transparent Gas Barrier Coatings Produced by Dual-Frequency PECVD" $36^{th}$ Annual Technical Conference Proceedings; Dec. 1993; pp. 445-449.

Krug, T. et al.; "New Developments in Transparent Barrier Coatings" $36^{th}$ Annual Technical Conference Proceedings; Dec. 1993; pp. 302-305.

Hoffmann, G. et al.; "Transparent Barrier Coatings by Reactive Evaporation" $37^{th}$ Annual Technical Conference Proceedings; Dec. 1994; pp. 155-160.

Kukla, R. et al.; "Transparent Barrier Coatings with EB-Evaporation, an Update; Section Five" Thirteenth International Conference on Vacuum Web Coating, Oct. 17-19, 1999; pp. 223-233.

Hibino, N. et al.; "Transparent Barrier AI203 Coating by Activated Reactive Evaporation" Thirteenth International Conference on Vacuum Web Coating; Oct. 17-19, 1999; pp. 234-246.

Henry, B.M. et al.; "Microstructural Studies of Transparent Gas Barrier Coatings on Polymer Substrates" Thirteenth International Conference on Vacuum Web Coatings; Oct. 17-19, 1999; pp. 265-273.

Bright, C.I. et al.; "Transparent Barrier Coatings Based on ITO for Flexible Plastic Displays" Thirteenth International Conference on Vacuum Web Coating; Oct. 17-19, 1999; pp. 247-255.

Finson, E. et al.; "Transparent SiO2 Barrier Coatings: Conversion and Production Status" $37^{th}$ Annual Technical Conference Proceedings; Dec. 1994; pp. 139-143.

Yamada, Y. et al.; "The Properties of a New Transparent and Colorless Barrier Film" $38^{th}$ Annual Technical Conference Proceedings; Dec. 1995; pp. 28-31.

Shi, M.K. et al.; Plasma treatment of PET and acrylic coating surfaces-I. In situ XPS measurements; Journal of Adhesion Science and Technology; Mar. 2000, 14(12); pp. 1-28.

Shi, M.K. et al.; In situ and real-time monitoring of plasma-induced etching PET and acrylic films, Plasmas and Polymers; Dec. 1999; 4(4); pp. 1-25.

Affinito, J.D. et al., Vacuum Deposited Conductive Polymer Films, The Eleventh International Conference on Vacuum Web Coating; no earlier than Feb. 1998; pp. 200-213.

Mahon, J.K. et al.; Requirements of Flexible Substrates for Organic Light Emitting Devices in Flat Panel Display Applications; Society of Vacuum Coaters; $42^{nd}$ Annual Technical Conference Proceedings; Apr. 1999; pp. 456-459.

Affinito, J.D. et al.; Vacuum Deposited Conductive Polymer Films; The Eleventh International Conference on Vacuum Web Coating; Nov. 9-11, 1997; pp. 1-12.

Henry, B.M. et al.; "Microstructural and Gas Barrier Properties of Transparent Aluminum Oxide and Indium Tin Oxide Films" $43^{rd}$ Annual Technical Conference Proceedings; Denver, Apr. 15-20, 2000; pp. 373-378.

Phillips, R.W. et al.; "Evaporated Dielectric Colorless Films on PET and OPP Exhibiting High Barriers Toward Moisture and Oxygen" $36^{th}$ Annual Technical Conference Proceedings; Dec. 1993; pp. 293-301.

Affinito, J.D. et al.; Vacuum deposited polymer/metal multi-layer films for optical application; Thin Solid Films 270; 1995; pp. 43-48.

Affinito, J.D. et al., PML/Oxide Transparent Barrier Layers; $39^{th}$ Annual Technical Conference Proceedings of the Society of Vacuum Coaters; Vacuum Web Coating Session; 1996; pp. 392-397.

Affinito, J.D. et al.; Polymer/Polymer, Polymer/Oxide, and Polymer/Metal Vacuum Deposited Interference Filters; Tenth International Vacuum Web Coating Conference; Nov. 1996; pp. 1-14.

Affinito, J.D. et al.; Ultra High Rate, Wide Area, Plasma Polymerized Films from High Molecular Weight/Low Vapor Pressure Liquid or Solid Monomer Precursors; $45^{th}$ International Symposium of the American Vacuum Society; Nov. 2-6, 1998; pp. 1-26.

Affinito, J.D. et al.; Molecularly Doped Polymer Composite Films for Light Emitting Polymer Applications Fabricated by the PML Process; $41^{st}$ Technical Conference of the Society of Vacuum Coaters; Apr. 1998; pp. 1-6.

Affinito, J.D. et al.; Vacuum Deposition of Polymer Electrolytes On Flexible Substrates; The Ninth International Conference on Vacuum Web Coating; 1995; pp. 1-16.

Shaw, D.G., et al.; Use of Vapor Deposited Acrylate Coatings to Improve the Barrier Properties of Metallized Film, Society of Vacuum Coaters; $37^{th}$ Annual Technical Conference Proceedings; Dec. 1994; pp. 240-244.

Chahroudi, D.; Transparent Glass Barrier Coatings for Flexible Film Packaging; Society of Vacuum Coaters; $34^{th}$ Annual Technical Conference Proceedings; Dec. 1991; pp. 130-133.

Tropsha, Y.G. et al.; Activated Rate Theory Treatment of Oxygen and Water Transport through Silicon Oxide/Poly(ethylene terephthalate) Composite Barrier Structures; J. Phys. Chem. B. vol. 101, No. 13; Mar. 1997; pp. 2259-2266.

Affinito, J.D. et al.; Vacuum Deposited Polymer/metal Multilayer Films for Optical Applications; Paper No. C1.13; International Conference on Metallurgical Coatings; Apr. 15-21, 1995; pp. 1-14.

Norenberg H. et al.; "Comparative Study of Oxygen Permeation Through Polymers and Gas Barrier Films" $43^{rd}$ Annual Technical Conference Proceedings; Denver, Apr. 15-20, 2000; pp. 347-351.

(56) References Cited

OTHER PUBLICATIONS

Affinito, J.D. et al.; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.

Affinito, J.D. et al.; Molecularly Doped Polymer Composite Films for Light Emitting Polymer Application Fabricated by the PML Process; 41$^{st}$ Technical Conference of the Society of Vacuum Coaters; Apr. 1998; pp. 220-225.

Felts, J.T.; Transparent Barrier Coatings Update: Flexible Substrates 36$^{th}$ Annual Technical Conference Proceedings; Apr. 25-30, 1993; pp. 324-331.

Notification of the Transmittal of the International Search Report or the Declaration, Mar. 3, 2000, PCT/US99/29853.

Affinito, J.D. et al.; "Vacuum Deposition of Polymer Electrolytes on Flexible Substrates," "Proceedings of the Ninth International Conference on Vacuum Web Coating," Nov. 1995 ed R. Bakish, Bakish Press 1995; pp. 20-36.

Vossen, J.L. et al.; Thin Film Processes, Academic Press; 1978, Part II, Chapter 11-1, Glow Discharge Sputter Deposition, p. 12-63; Part IV, Chapter IV-1, Plasma Deposition of Inorganic Compounds and Chapter IV-2 Glow Discharge Polymerization; p. 335-397.

Penning, F.M.; Electrical Discharges in Gasses; Gordon and Breach Science Publishers; 1965; Chapters 5-6; p. 19-35; and Chapter 8; p. 41-50.

Affinito, J.D. et al.; "High Rate Vacuum Deposition of Polymer Electrolytes;" Journal Vacuum Science Technology A (14)(3); May/Jun. 1996; pp. 733-738.

Inoue et al., Fabrication of a Thin Film of MNA by Vapour Deposition, Proc. Jpn. Cong. Mater. Res., vol. 33, pp. 177-9, 1990.

Affinito, J.D. et al.; "PML/Oxide/PML Barrier Layer Performance Differences Arising From Use of UV or Electron Beam Polymerization of the PML Layers;" Thin Solid Films; Elsevier Science S.A.; vol. 308-309; Oct. 31, 1997; pp. 19-25.

Gustafsson, G. et al.; "Flexible light-emitting diodes made from soluble conducting polymers;" Nature; vol. 357; Jun. 11, 1992; pp. 447-479.

Affinito, J.D. et al.; "PML/Oxide/PML Barrier Layer Performance Differences Arising From Use of UV or Electron Beam Polymerization of the PML Layers;" SVC 40$^{th}$ Annual Technical Conference; Apr. 12-17, 1997; pp. 19-25.

Wong, C.P.; "Recent Advances in IC Passivation and Encapsulation: Process Techniques and Materials;" Polymers for Electronic and Photonic Applications; AT&T Bell Laboratories; 1993; pp. 167-209.

De Gryse, R. et al.; "Sputtered Transparent Barrier Layers;" Tenth International Conference on Vacuum Web Coating; Nov. 1996; pp. 190-198.

Yializis A. et al.; "Ultra High Barrier Films" 43$^{rd}$ Annual Technical Conference Proceedings; Denver, Apr. 15-20, 2000; pp. 404-407.

Tropsha, Y.G. et al.; Combinatorial Barrier Effect of the Multilayer $SiO_x$ Coatings on Polymer Substrates; 1997 Society of Vacuum Coaters; 40$^{th}$ Annual Technical Conference Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Liquid/Solid Suspension Monomer Precursors; MRS Conference; Nov. 29-Dec. 3, 1998; Paper No. Y12.1.

\* cited by examiner

APPARATUS FOR DEPOSITING A MULTILAYER COATING ON DISCRETE SHEETS

CROSS-REFERENCE TO RELATED APPLICATIONS

This application is a continuation-in-part of U.S. patent application Ser. No. 10/412,133, filed Apr. 11, 2003, which claims the benefit of U.S. Provisional Application No. 60/372,559, filed Apr. 15, 2002.

BACKGROUND OF THE INVENTION

The present invention relates generally to an apparatus for depositing multilayer coatings onto sheet substrates and devices mounted thereon, and more particularly to an encapsulation tool that performs multilayer coating processing while simultaneously reducing the likelihood of individual layer contamination.

Multilayer coatings have been included in the packaging for environmentally sensitive products and devices to protect them from permeation of environmental gases or liquids, such as oxygen and water vapor in the atmosphere, or chemicals used in product or device processing, handling, storage, or use. In one form, these coatings may be made from layers of an inorganic metal or metal oxide separated by layers of an organic polymer. Such coatings have been described in, for example, U.S. Pat. Nos. 5,880,246, 6,268,695, 6,413,645 and 6,522,067, all incorporated herein by reference. One method commonly used to apply thin multilayer coatings to various web substrates is the "roll-to-roll" method, which involves mounting the continuous web substrate on a reel. A series of rotating drums are used to convey the substrate past one or more deposition stations. As the web passes around the drums in the system, polymer layers are deposited and cured at one or more polymer deposition and curing stations, while inorganic layers are deposited at one or more inorganic layer deposition stations. The deposition and curing stations are not separate chambers coupled together, but rather are adjacently spaced relative to one another within a single vacuum chamber. With such an open architecture, efforts must typically be made to minimize migration of the organic vapor which could otherwise lead to layer or substrate contamination. In addition, since vapor deposition imparts a significant heat load to the receiving substrate, one or more of the drums can be configured to provide a needed heat sink to control substrate temperature. While the roll-to-roll method is capable of high production rates, its practical use is limited to substrates that are continuous lengths (rolls). In addition, the flexure inherent in the roll-to-roll approach makes it difficult to deposit coatings onto rigid substrates or to substrates supporting inflexible devices mounted thereto.

When the substrate to be coated is in the form of discrete sheets, rather than a continuous web, another method, called the "cluster tool" method, is commonly used to apply the multilayer coatings to the sheet substrate. The cluster tool method, which is commonly used in the manufacture of semiconductor devices, involves the use of two or more independent vacuum chambers connected together via common interface, such as a "hub-and-spoke" configuration, where a central (or substantially central) hub including a robotic transport device can sequentially move a substrate into numerous individual processing chambers, often peripherally mounted around the central hub. One or more of the processing chambers are vacuum chambers that contain one or more deposition sources. In the cluster tool approach, discrete sheet substrates are moved from one vacuum chamber to another to accept the different layers thereon, with the process being repeated as many times as necessary to produce the desired built-up coating. One of the strong motivators for developing the cluster tool approach was the need to isolate potential contamination sources between adjacent yet disparate layers, where typically isolation valves are placed between adjacent chambers. In fact, the use of cluster tool-based machinery for the barrier coating industry was based in part on the perception that organic and inorganic deposition could not take place within a common vacuum chamber if contamination was to be avoided. Another attribute of the cluster tool approach is that the potential for precise temperature control of the substrate is greater within each discrete vacuum chamber than it is for the open chambers of the roll-to-roll configuration. While the cluster tool approach has the benefit of producing relatively contaminant-free finished products, the constant exchange of the sheet substrate from one isolated vacuum chamber to another while maintaining a vacuum adds considerable complexity to design and control systems.

Accordingly, there is a need for a tool that can apply multilayer coatings to a sheet substrate and devices or products mounted on a sheet substrate that combines the speed and efficiency of roll-to-roll devices with the ability to prevent cross contamination inherent in cluster tool-based machines.

SUMMARY OF THE INVENTION

This need is met by the apparatus of the present invention, where the individual layers making up the multilayer coating can be deposited in a modified cluster tool architecture that embodies some of the linearity inherent in roll-to-roll and related in-line configurations. The present invention is especially well-suited to coating discrete substrates through batch processing, as compared to the continuous processing associated with web-based substrates. In the present context, the modified cluster tool architecture includes both cluster and in-line attributes to define a hybrid design for deposition of multilayer coatings on a discrete sheet substrate. In the present context, a hybrid tool is to be distinguished from a roll-to-roll (or related continuous) tool in that first, a hybrid tool is configured to handle discrete sheets while the roll-to-roll tool handles continuous webs, and second, the deposition stations along a hybrid tool generally follow a linear, planar path (which may encompass either unidirectional/one pass movement or a shuttling/multi-pass movement) so that during coating processing the tool does not subject the substrate (and any devices mounted thereto) to overly curvaceous paths that might otherwise be harmful to either the coating or the device encapsulated by the coating. In this context, the deposition path is considered to be substantially linear. A hybrid tool is also distinguished from a cluster tool in that in the hybrid tool includes in-line attributes, where the deposition of at least some of the various layers of the multilayer coating occur in a sequential path while in a common environment, whereas in a cluster tool, the various layers are deposited in autonomous chambers isolated from both the ambient environment and neighboring chambers.

According to an aspect of the invention, a device for depositing organic material onto a discrete substrate is disclosed. The device includes an organic material deposition station, an organic material curing station cooperative with the organic material deposition station, a substrate-transport configured to convey the substrate between at least the organic material deposition station and the organic material curing station, a reduced-pressure source placed in vacuum communication with the organic material deposition station and a thermal control mechanism cooperative with at least one of the organic material deposition station and organic material curing station such that temperature inside can be controlled during deposition of the organic material on the substrate. The reduced-pressure source (such as a vacuum pump) can be used during at least a portion of deposition of the organic layer onto the discrete substrate, and operates to create an at least partially evacuated environment immediately around the substrate.

Optionally, the device may include additional components, including a control system configured to adjust at least one of the temperature and pressure conditions in the organic material deposition station. In a more particular option, the control system is configured to adjust both of the temperature and pressure conditions in the organic material deposition station. Other devices, such as an organic mask placement device (discussed in more detail below) configured to place an appropriately shaped and sized mask onto the substrate prior to entering the organic material deposition station, may also be incorporated. The device may also include a cleaning system coupled to the organic material deposition station. In one form, the cleaning system can create reactive plasmas that degrade or remove the material to be cleaned out of the organic material deposition station. For example, the apparatus may include a radio frequency (RF) electrode for generating the cleaning plasma.

This can be used to minimize down-time associated with the removal and related cleaning of uncured, partially cured or fully polymerized organic materials within the organic material deposition station without having to rely on the use of chemical solvents or abrasive mechanical wiping. Such a cleaning system may, for example, use a plasma source to enable in-situ cleaning and a concomitant minimization in the amount of time where the system has to be under non-vacuum conditions. The organic material deposition station may also include an adjustable substrate transport path. For example, by allowing up and down movement of a portion of a substrate transport path relative to a deposition nozzle, various operating modes can be facilitated, including a relatively closed position for process stabilization, an intermediate position for normal organic material deposition and a full open position for evacuation of a chamber surrounding the nozzle. A masking station configured to apply a mask to the substrate prior to deposition of at least one of the organic layers may also be included. Furthermore, this masking station may include mask alignment features to promote more accurate placement of a mask relative to the substrate. A magnetic clamp may also be used to keep the mask and the substrate properly aligned once they are connected to each other.

According to another aspect of the invention, a device for depositing material onto a discrete substrate is disclosed. The device includes a cluster tool configured to deposit at least one inorganic layer onto the substrate, an in-line tool operatively coupled to the cluster tool and configured to deposit at least one organic layer onto the substrate, and a reduced-pressure source placed in vacuum communication with the in-line tool.

Optionally, the device further includes a thermal control mechanism. In one form, the thermal control mechanism can include a cooling jacket situated around deposition chambers in the in-line tool. The in-line tool is made up of an organic material deposition station, an organic material curing station cooperative with the organic material deposition station and a substrate-transport configured to convey the substrate between at least the organic material deposition station and the organic material curing station. The organic material deposition station further includes an organic material evaporator, an organic material deposition nozzle in fluid communication with the evaporator and an organic material confinement system disposed about the nozzle. In a particular form, the organic material deposition station defines an isolatable interior chamber that defines a first region comprising the organic material confinement system, and a second region selectively isolatable from the first region through a moveable shutter. A cooling device in thermal communication with the second region may also be included. With such a device, a distributed approach based on cooling various surfaces adjacent to or part of the monomer deposition station could be used. In another form, the distributed approach is used to support the substrate as it is either transported or temporarily stored between process stations within the tool. The cooling device can be used to reduce the effect on the second region of a thermal load generated in the first region. Additional temperature control devices may also be employed. For example, at least one cold trap may be disposed in the isolatable interior chamber (such as adjacent an aperture separating the first and second regions). In a particular form, the cold trap is disposed in the second region to cooperate with the substrate-receiving path. One or more pumps For example, a rough pump operating in conjunction with a localized turbomolecular pump) can be fluidly coupled to at least one of the first and second regions to raise and lower local ambient pressure as needed.

The cluster tool section of the device may further comprise an inorganic deposition station, such as a station configured for planar cathode sputtering. This station can be used to deposit a first layer of inorganic material onto the substrate. In addition to the reduced-pressure source discussed above, one may also be placed in vacuum communication with the cluster tool such that during at least a portion of deposition of the inorganic layer onto the discrete substrate, the reduced-pressure source operates to create an at least partially evacuated environment about the substrate. This may be the same reduced-pressure source as used in conjunction with the in-line section of the device, or it may be a separate unit either autonomously or commonly controlled.

The inorganic layer deposition station is configured to deposit at least one inorganic layer of the multilayer coating into the substrate, while the organic layer deposition station and the curing station are configured to form at least one organic layer of the multilayer coating onto the substrate. In the present context, deposition of a layer "onto" the substrate encompasses both application in direct contact with the underlying substrate as well as application onto one or more layers previously deposited on the substrate as part of a contiguous stack. In this way, either the organic layer or the inorganic layer may be deposited first, yet both layers, even in a multilayer configuration, are considered to be deposited onto the substrate. The device can be configured such that either layer may be deposited first. For example, the inorganic layer may be placed onto the substrate prior to the placement of the first organic layer.

The device may further comprise at least one surface treatment mechanism configured to enhance the ability of individual layers of the multilayer coating to adhere to the substrate or an adjacent layer. For example, while the use of sputtering (discussed above in conjunction with the deposition of an inorganic layer onto a substrate) is beneficial, its use coincides with increases in temperature and plasma energy. Special measures may be undertaken to avoid damage to the environmentally sensitive device (such as an organic light emitting diode (OLED)) that can otherwise arise from being exposed to the plasmas and/or temperatures of the sputter coating process. Other deposition techniques, such as thermal evaporation, promote the deposition of inorganic layers without subjecting the environmentally sensitive device being encapsulated to harsh environments, e.g., high temperatures and/or plasmas. By way of example, since thermal evaporation is a currently-used approach for forming the metallic top electrode of an OLED, such an inorganic layer deposition approach could also be used as an encapsulation-enhancement approach, such as to deposit a protective layer. Unlike commonly-used oxides, such as aluminum oxide ($Al_2O_3$), that are applied by reactive sputtering, inorganics such as lithium fluoride (LiF) and magnesium fluoride ($MgF_2$) (both of which are optically transparent) can also be applied via thermal evaporation to create a protective layer without having to expose the environmentally sensitive device to the plasma. Similarly, the approach could utilize an inorganic transparent metal halide via thermal evaporation, a sputtered transparent inorganic or first deposited organic, or a simpler approach in which thermal evaporation is used for the first deposited inorganic. The latter would require a first deposited inorganic that can be applied by thermal evaporation and provide a combination of adhesion and transparency.

The device can be configured to have the substrate shuttle back and forth as many times as required to deposit the multilayer coating on the substrate. To effect the shuttling movement, one or more conveyors or related transport mechanisms may extend through the in-line section of the device to transport the substrate therethrough. As will be discussed in more detail below, features of such transport mechanisms can similarly be used in at least one of the portions of the inorganic layer deposition station. To assist in shuttling, the conveyor can be configured to move bidirectionally. A robotic mechanism may be placed in a central hub region of the cluster tool section of the device to not only coordinate substrate movement between various stations formed around the central hub, but also to cooperate with the conveyor or other transport device of the in-line tool. A control system may be included to determine operability of the various components and process conditions, as well as be responsive to process parameters, such as pressure, temperature, scanning speed, presence of contaminants or the like. The vacuum source may provide a different vacuum level during deposition of the inorganic layer than during deposition of the organic layer. By way of example, the vacuum level during deposition of the inorganic layer can be approximately 3 millitorr, while that during deposition of the organic layer can be approximately 10 millitorr.

As stated above, the inorganic layer may be deposited onto the substrate prior to the placement of the organic layer. The inventors have discovered that placing an inorganic (such as an oxide) layer before placing an organic layer results in improved adhesion between the substrate and between layers, as well as improved barrier properties. The inventors have further discovered that in situations involving encapsulation of an object (such as an OLED) placed on the substrate, superior adhesion and barrier properties are achieved using such "inorganic first" approaches. Thus, while the inclusion of an organic layer continues to make valuable contributions to the overall performance of the multilayer coating, the inventors' research suggests that attainment of a suitable base (or foundation) for effectively isolating the barrier from undesirable contributions from the underlying substrate (or device) may be best achieved with one or more inorganic layer/organic layer pairs led by an inorganic layer (possibly on top of the aforementioned protective layer). By placing an inorganic layer onto a substrate (such as glass or a plastic) prior to the organic layer, the inventors have achieved adhesion to substrates, to devices placed on substrates, and between layers of multilayer environmental barriers, all of which withstand the physical and thermal rigors of the environment in which they have to perform. Furthermore, when these layers form the surface upon which a device is placed, they survive all of the processing associated with fabrication of the device. The inventors believe that at least one explanation may be that migration of organic species from a plastic or related substrate to this first-applied layer is reduced compared to if the first layer is the organic layer, and that such migration reduction promotes and maintains enhanced adhesion between the substrate and the first-applied layer. In addition, in cases involving deposition onto a device mounted on the substrate, the inventors believe that with a first deposited organic layer, the layer does not adequately wet, or uniformly coat, the device surface. This could be due to species originating in the organic layers of the device being coated, not having a suitable formulation for the first deposited organic layer relative to the device, or a combination of both. On the other hand, an "organic first" approach (at least in encapsulation situations) would reduce or even eliminate the potential for damage to the device from the plasma used in depositing inorganic layers. As such, the choice of an "organic first" or an "inorganic first" deposition strategy can be made based on the particular needs of the substrate or device being coated.

As previously discussed, masks may be used to form particular deposition patterns on the substrate. To reduce the incidence of seepage and related capillary phenomena (which is especially prevalent when dealing with deposited organic layers), masks may be stacked to make an undercut mask, or the organic mask may be removed prior to the curing step. Removal of the mask prior to cure may also improve cure speed by eliminating mask shadowing of the edge of the organic material.

According to yet another aspect of the invention, a tool for depositing a multilayer coating on a discrete substrate is disclosed. The tool includes a plurality of peripheral stations disposed about a substantially central hub and coupled thereto such that the substantially central hub can transport the substrate between the peripheral stations. It will be appreciated that while a hub-and-spoke arrangement is shown in the accompanying figures as being representative of a central hub configuration, other comparable arrangements that facilitate the sequential or parallel feeding between the various peripheral stations are also envisioned as falling within the scope of the present invention. The peripheral stations include a barrier layer forming station, one or more organic (or related polymer precursor) layer forming stations, a reduced-pressure source placed in vacuum communication with at least one of the barrier layer and organic layer forming stations, and a temperature control device placed in thermal communication with at least one of the barrier layer and organic layer forming stations. The barrier layer forming station can be used to deposit at least one inorganic layer onto the substrate, while the one or more organic layer forming stations can be configured as an in-line tool to deposit at least one organic layer onto the substrate. By accommodating more than one organic later forming station, the present invention can handle higher throughput operations when required. The reduced pressure source (such as a vacuum) operates to create an at least partially evacuated environment about the substrate. Likewise, the temperature control device operates to adjust the temperature of the substrate. Optionally, the temperature control device is configured to reduce the temperature of the substrate. In addition, the tool further includes at least one masking station disposed in the tool, the masking station configured to place at least one mask on the substrate. The organic layer forming station includes monomer deposition, monomer curing and transport features to move substrates with the monomer coating between the deposition and curing portions of the tool.

According to still another aspect of the invention, a tool for depositing a multilayer coating on a discrete substrate is disclosed. The tool includes a monomer layer deposition station, a barrier layer deposition station cooperative with the monomer layer deposition station and a reduced-pressure source cooperative with one or both of the monomer and barrier layer deposition stations to create an at least partially evacuated environment about the substrate. As before, the monomer layer deposition station can be set up as an in-line tool to deposit at least one organic layer onto the substrate. The barrier layer deposition station is configured as a cluster tool to deposit one at least one inorganic layer onto the substrate.

Optionally, the tool further includes at least one curing station configured to cure an organic layer deposited by the monomer layer deposition station. The tool may also include one or more contamination reduction devices to control the migration of material making up the organic layer. The tool may also include a masking station configured to place at least one mask on the substrate. The monomer layer deposition station and the barrier layer deposition station may be configured to reverse the substrate along respective transport paths to promote the deposition of multiple layers of the multilayer coating. An environmental isolation valve may be disposed between the monomer layer deposition station and the barrier layer deposition station to avoid unnecessary contamination between adjacent compartments within the tool. In addition, one or more surface treatment chambers may be incorporated to enhance the ability of individual layers of the multilayer coating to adhere to the substrate or an adjacent layer of the multilayer coating. This surface treatment chamber, which may be made up of a plasma energy source or a thermal evaporation device, can be disposed in the monomer layer deposition station. In configurations where the surface treatment chamber includes a thermal evaporation device, one form would be configured to deposit a non-oxide material on the substrate or presently-exposed layer. In a particular version of this case, the non-oxide material can be lithium fluoride or magnesium fluoride. In a particular tool configuration, the inorganic layer deposition station places an inorganic layer onto the substrate prior to the placement of an organic layer from the organic layer deposition station. In addition, the vacuum source may be operated to provide a different vacuum level during deposition of the inorganic layer than during deposition of the organic layer.

According to yet another aspect of the invention, an encapsulating tool configured to deposit a multilayer coating onto an OLED is disclosed. The encapsulating tool includes a cluster tool configured to deposit one at least one inorganic layer onto the OLED, an in-line tool configured to deposit one at least one organic layer onto the OLED, and a vacuum source coupled to at least the in-line tool such that during at least a portion of deposition of the organic layer onto the OLED, the vacuum source operates to create an at least partially evacuated environment about the OLED. The in-line tool is operatively coupled to the cluster tool. Optionally, a thermal control mechanism is coupled to at least one of the cluster tool and the in-line tool. Furthermore, the encapsulation tool can be configured such that either the inorganic or organic layer can be first applied to the OLED.

According to still another aspect of the invention, a method of depositing a multilayer coating onto a substrate is disclosed. The method includes using an encapsulation tool that can be configured according to one or more of the previously-described aspects. In addition, the method includes loading the substrate into the tool, depositing at least a portion of the inorganic material onto the substrate as a component of the multilayer coating, operating the reduced-pressure source to create an at least partially evacuated environment about the substrate during at least a portion of deposition of the organic layer onto the substrate, depositing at least a portion of the organic layer onto the substrate as a component of the multilayer coating, and curing the deposited organic layer.

Optionally, the method further comprises treating at least one surface of the substrate prior to forming a first layer of the multilayer coating. This enhances adhesion between the substrate and the first formed layer. The method may further include placing an inorganic mask over the substrate prior to depositing the inorganic layer, and placing an organic mask over the substrate prior to depositing the organic layer. A plurality of masks may be stacked to make an undercut mask. In another approach, the undercut mask may be formed from a single layer with sufficient thickness. In one form, it is desirable to avoid contact between a portion of the deposited organic layer that is likely spread into a shadow region defined by the undercut mask and a portion of the undercut mask that is in substantial contact with the substrate, thereby minimizing the likelihood of wicking or related phenomena. Additionally, the organic mask can be removed prior to curing. In yet another option, at least a portion of the tool can be cooled to effect control over deposition of the organic layer. The method may also include depositing at least a portion of the inorganic layer prior to depositing at least a portion of the organic layer onto the substrate such that the first deposited layer on the substrate is an inorganic layer. In another form, the reverse may also be performed such that the first deposited layer on the substrate is an organic layer. The method may also include operating a thermal control mechanism such that a temperature in at least one of the cluster tool and the in-line tool can be controlled during the deposition.

According to another aspect of the invention, a method of encapsulating an OLED placed on a discrete substrate with a multilayer coating is disclosed. The method includes loading the OLED into an encapsulation tool, depositing at least a portion of an inorganic layer onto the OLED while it is in an inorganic layer deposition station portion of the tool, depositing at least a portion of an organic layer onto the OLED while it is in the organic layer deposition station portion of the tool, operating a vacuum source to create an at least partially evacuated environment about the OLED during at least a portion of deposition of the organic layer thereon; and curing the deposited organic layer.

Optionally, deposition of the organic and inorganic layers is repeated at least once, where the steps of depositing the organic and inorganic layers can be performed in an any order. Preferably, organic material used for the organic layer is introduced into the organic layer deposition station in vapor form, and more particularly, the organic material is a polymer precursor or a monomer. In addition, the inorganic material used for the inorganic layer is preferably a ceramic. It will be appreciated that these material choices are similarly applicable to any of the previously-described aspects for their corresponding cluster and in-line tool sections. In one form, the curing of the deposited organic layer comprises ultraviolet (UV) curing, although it will be appreciated that other known forms of curing may also be used. As with the previously-described aspects, a first applied layer may be an inorganic layer. Furthermore, a final applied layer may be an inorganic layer. The method may further comprise treating at least one of the deposited inorganic layers prior to deposition of an organic layer. Such treatment may be performed by a plasma source.

According to still another aspect of the invention, a tool includes an encapsulation device, a load lock for selective vacuum isolation between the encapsulation device and a remainder of the tool, and an exchange mechanism to help transport one or more encapsulated members formed on a substrate between the encapsulation device and the remainder of the tool. The encapsulation device includes an organic layer forming station and a barrier layer forming station, where the organic layer forming station may include an organic material deposition station, an organic material curing station cooperative with the organic material deposition station, a substrate-transport and a reduced-pressure source, the last placed in vacuum communication with the organic material deposition station such that during at least a portion of deposition of an organic layer onto the substrate, the reduced-pressure source operates to create an at least partially evacuated environment about the substrate. In addition, the organic layer forming station may include a thermal control mechanism cooperative with one or both of the deposition and curing stations such that a temperature therein can be controlled during formation of the organic material on the substrate.

Optionally, in one embodiment, the tool may be used to not only encapsulate a device on a substrate, but to also integrate the encapsulated device into a larger component, such as integrated circuitry or the like. The encapsulation device may be an OLED encapsulation device. Similarly, the exchange mechanism may be the accumulator discussed previously. Also as discussed in conjunction with previous aspects, the barrier layer forming station may be configured as a cluster tool, while the organic layer forming station may be configured as an in-line tool. The tool may also include a cleaning system placed in the organic layer forming station or elsewhere. The cleaning system may include the previously-discussed glow discharge device.

DETAILED DESCRIPTION

Figure 1:
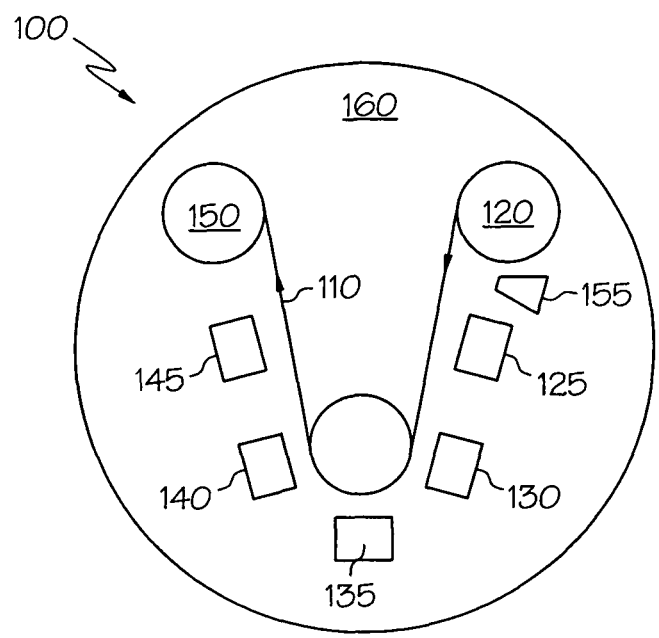
FIG. 1 is a simplified view of a roll-to-roll tool according to the prior art.

Referring first to FIG. 1, a roll-to-roll device 100 for depositing multilayer coatings on a continuous web of substrate according to the prior art is shown. A web of substrate 110 passes over a distribution reel 120 and past a first organic layer deposition station 125, curing station 130, inorganic layer deposition station 135, second organic layer deposition station 140 and curing station 145, and on to take-up reel 150. Optionally, the device 100 can include one or more surface treatment devices (such as plasma source 155) to improve the adhesion between the organic layer and the substrate 110. The interior of the device 100 defines a single chamber 160. A common vacuum is present among all of the aforementioned components. In one commonly used process, the polymer multilayer (PML) process, an organic precursor used at the first and second organic layer deposition stations 125 and 140 is flash evaporated such that when the organic precursor is introduced into the vacuum chamber 160, it evaporates, where it can then be directed to the relatively cool substrate 110 for condensation thereon. The formation of a vapor phase (evaporation) is accomplished through heating and increasing the surface area of the precursor, the latter preferably by atomization into numerous tiny droplets that increase precursor surface area by several orders of magnitude. Concurrent with the marked increase in surface area is the introduction of the droplets into a vacuum environment. U.S. Pat. No. 4,722, 515, hereby incorporated by reference, demonstrates the use of heat, atomization and an evacuated environment to effect evaporation of organic precursor materials. Optionally, in the aforementioned evaporation, additional heating (thermal input) results from impinging the output from an atomizer onto a hot surface. This process, referred to as flash evaporation, is further taught by U.S. Pat. No. 4,954,371, also hereby incorporated by reference. The condensed liquid tends to planarize, thus removing a significant portion of the inherent roughness of substrate 110.

Figure 2:
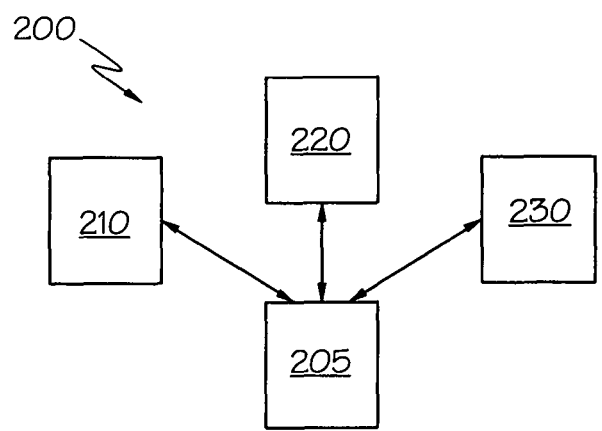
FIG. 2 is a simplified block diagram of a cluster tool according to the prior art.

Referring next to FIG. 2, a cluster tool system 200 of the prior art is shown. In a cluster tool configuration, a transport station 205 is common to all of the deposition stations 210, 220 and 230 such that the materials unique to each station do not permeate the remaining deposition stations. For example, discrete sheets of substrate (not shown) are sequentially routed between the transport station 205 and the first organic layer deposition station 210, inorganic layer deposition station 220 and second organic layer deposition station 230 until the desired finished product is obtained. Separate vacuums (not shown) are imposed on each of the deposition stations. This approach reduces the chance that the agents being deposited will be introduced at the wrong time or location, thus promoting a relatively cross-contaminant-free final product, but does so at considerable increases in time and production cost.

Figure 3:
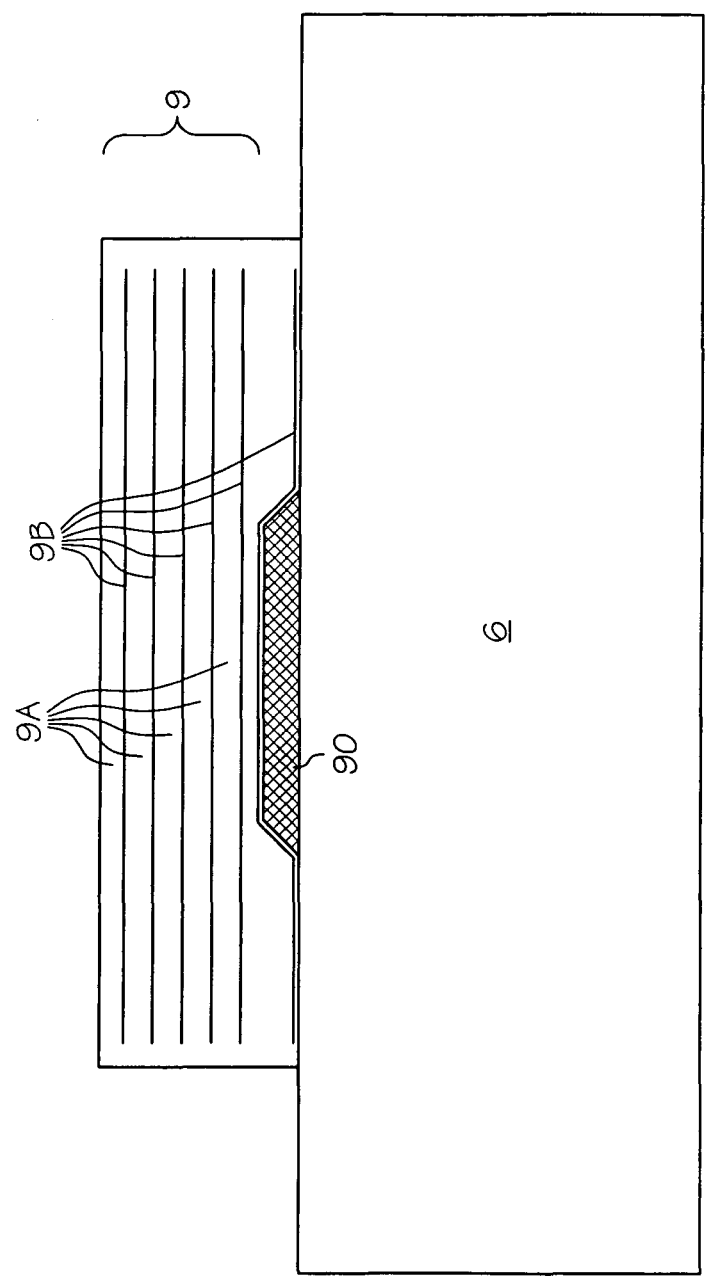
FIG. 3 shows a cutaway view of an object encapsulated by a multilayer coating, where the deposition of the layers is by a tool according to an aspect of the present invention.

Referring next to FIG. 3, the present invention can be used to encapsulate an environmentally sensitive device 90 between a sheet substrate 6 and multilayer permeation-resistant coating 9, or to rapidly deposit the coating 9 directly onto the sheet substrate 6. By way of example, the environmentally sensitive device 90 can be an OLED. The sheet substrate 6 can be configured to accept one or more of the environmentally sensitive devices 90 per sheet. Furthermore, the sheet substrate 6 can be either flexible or rigid; flexible substrates include, but are not limited to, polymers, metals, paper, fabric, flexible sheet glass, and combinations thereof, while rigid substrates include, but are not limited to ceramic, metals, glass, semiconductors, and combinations thereof. In the embodiment shown, the sheet substrate 6 is made of glass, although encapsulated devices could also be placed on a plastic film support (such as polyethylene terepthalate, PET), where a barrier can be placed between the film and the device 90. The layers that make up the multilayer coating 9 are organic layers 9A and inorganic layers 9B that can be stacked in any order, with each organic layer 9A capable of being made of the same or different materials as other organic layers, while the same is true for the inorganic layers 9B. The inorganic layer 9B is used to provide protection to the environmentally sensitive device 90, while the organic layer 9A blunts or otherwise inhibits the formation of cracks or similar defects in the inorganic layer 9B. The organic layer 9A is typically in the range of about 1,000 to 15,000 Å thick, while the inorganic layer 9B is typically in the range of about 100 to 500 Å thick, although it may be thicker. For example, in situations involving device encapsulation (such as shown in the figure), the first deposited inorganic layer 9B can be applied as a relatively thick layer (such as over a 1,000 Å) to obtain a more thorough encapsulation. It will be appreciated by those skilled in the art that the present drawing is shown in a simplified manner to highlight the various layers, and that the drawing is not necessarily in proportion to actual layer thickness or number. The number of organic and inorganic layers 9A, 9B can be user-selected, governed by coverage and permeation resistance requirements. Furthermore, the previously-discussed thermally evaporated coatings, such as LiF and $MgF_2$, can form an additional protective layer 9C, as shown in conjunction with FIGS. 14A and 14B.

The Organic Layer

In addition to performing the aforementioned crack-blunting function, organic layer 9A may (as shown in the figure) be made thicker to provide, among other things, planarization. Moreover, the layer 9A can provide thermal isolation of the underlying substrate or device, which is beneficial in reducing thermal inputs associated with subsequent depositions of inorganic layers 9B. The benefit in coating performance from alternating discrete layers over fewer thicker layers may be explained by simple redundancy, but could also be the result of nucleation of a subsequently deposited inorganic layer 9B on organic layer 9A initially deposited on first inorganic 9B layer with improved barrier properties that are not inherent in the bulk structure.

There are numerous approaches to initiating polymerizations, cross-linking and cure of an organic layer 9A based on plasma-based or evaporation techniques. One approach is based on passing a flash evaporated organic material through a charged cathode/anode assembly to form a glow discharge plasma. In glow discharge plasma, a partially ionized gas is used to bombard a substrate 6. The glow discharge is well established in the art, and as such conveys an understanding of required equipment configurations, process conditions, working gases and the like that can be used, and what results can be achieved. Reactive species in the gas are chemically deposited onto a substrate 6 or a layer of coating 9 thereon. After this, the organic material condenses to form an organic layer 9A that self-cures by polymerization reactions initiated by charged species resulting from plasma formation. The approach is taught by U.S. Pat. Nos. 5,902,641 and 6,224,948, both hereby incorporated by reference. A variation of this approach is based on plasma generation within a working gas that is then directed at an organic layer deposited using flash evaporation; this variation is taught by U.S. Pat. Nos. 6,203,898 and 6,348,237, and US Patent Application Publication 2002/0102361 A1, all three hereby incorporated by reference. Organic precursors suitable for forming organic layer 9A contain at least one species bearing an active functional group to enable reactions resulting in polymerization and/or cross-linking. Because it is desirable to control the onset of these reactions, and the reactions will take place in a vacuum environment, addition reactions are generally preferred. Exemplary addition reactions include the polymerization of the acrylate group ($—O—CO—CR=CH_2$, where R is typically H, $CH_3$ or CN), polymerization of the vinyl group ($R^1R^2C=CH_2$, where typically $R^1$ is H and $R^2$ is —O (oxygen linkage) or where $R^1$ is an aromatic or substituted aromatic and $R^2$ is H or $CH_3$), ring opening polymerization of the cycloaliphatic epoxy groups and the reactions of isocyante (—NCO) functional species with hydroxyl (—OH) or amine ($—NH_2$) functional species. Ease of reaction and availability favor acrylate and vinyl functional materials, but other materials may also be used.

The reactive species incorporated into suitable organic precursors can be monomers (simple structure/single unit) bearing at least one functional group, oligomers (composed of two to several repeating units) bearing at least one functional group, or polymers bearing at least one functional group. As used herein, monomer is meant to include species referred to as monomeric, and the terms oligomers and/or polymers are meant to include species referred to as oligomeric, polymeric, prepolymers, novalacs, adducts, and resins, when the last mentioned bears functional groups. The reactive species (i.e., monomer, oligomer or polymer) can bear two or more similar or dissimilar functional groups, while suitable organic precursors can include two or more of these reactive species. By way of example, these could be made up of two or more monomeric species, one or more monomeric species combined with an oligomeric species or one or more monomeric species combined with a polymeric species. It will be appreciated by those skilled in the art that the numbers and natures of the reactive species that can be used in combination are not subject to set limitations. In addition, the organic precursors may include one or more species that are not polymerizable and/or cross-linkable and are liquids or solids. Examples include the aforementioned photoinitiators, which are species that fragment to produce free radicals that induce free radical-based reactions (including polymerizations) in response to UV exposure. When solid, these species may be present as dispersions, colloidal dispersions, or in solution, and may be ionic in nature, such as salts of inorganic or organic species. When liquid, the non-reactive species may be present as emulsions, as colloids, or as miscible components.

The liquid multilayer (LML) process, disclosed by U.S. Pat. Nos. 5,260,095, 5,395,644 and 5,547,508 (incorporated herein by reference), bears some resemblance to the PML process previously described by employing many of the same organic materials used in the PML's flash evaporation-based approach, but can further work with a range of higher molecular weight materials that can not be used via flash evaporation. In essence, the LML process involves applying a liquid material to a surface and then inducing a cure (polymerization) in contrast to the PML approach of condensing a flash evaporated organic and then inducing the cure.

The Inorganic Layer

The inorganic layer 9B depicted in the figure can be a ceramic layer that can be vacuum deposited onto the top surface of device 90, onto the surface of sheet substrate 6, or onto the organic layer 9A already on sheet substrate 6. Vacuum deposition methods for the inorganic layer 9B include, but are not limited to, sputtering, chemical vapor deposition, plasma enhanced chemical vapor deposition, evaporation, sublimation, electron cyclotron resonance-plasma enhanced vapor deposition, and combinations thereof. Sputtering typically involves the bombardment of a cathode material by gas ions in a low pressure environment, thereby ejecting atoms of the cathode material from the cathode surface. The ejected atoms then impinge upon a substrate placed in their path, thereby resulting in a deposit of the cathode material atoms onto the substrate surface. Sputtering devices have used both electric and magnetic fields to accelerate the gas ions toward the cathode surface. By passing a magnetic field through the cathode material, enhanced deposition rates can be achieved. Moreover, to avoid burn-through of the cathode material created by the fixed presence of the adjacent magnets, the magnets were moved (such as being rotated) relative to the target cathode. Specific refinements of this idea include cylindrical tube cathodes that rotate about fixed magnets, thus promoting relatively even consumption of the cathode material. Rotary sputtering is taught by U.S. Pat. No. 6,488,824, the entire disclosure of which is incorporated herein by reference.

Sputtering can be reactive (in the case of depositing of ceramic or dielectric materials, such as the oxides and nitrides of metals) or non-reactive (where metals are deposited). By adding reactive capability, sputtering devices (including rotatable cylindrical devices) can be used to deposit ceramic and related non-metal materials formed for example by combining the liberated cathode material atoms with a reactive species gas, while the control of the buildup of electrically nonconductive layers of sputtered material avoids a drift in process parameters that would otherwise occur during deposition. In reactive sputtering, metal ions are generated from a sputter source (cathode) and subsequently converted in a reactive atmosphere to a metal compound that then is deposited on the substrate. For example, use of oxygen as the reactive gas will result in the deposition of a layer of metal oxide, while the use of nitrogen or a carbon source such as methane as reactive gases will result in the deposition of layers of metal nitride or metal carbide respectively. Reactive gas mixtures can be used to produce more complex layers. Alternatively, a ceramic target can be RF sputtered onto the substrate 6. In either case, the inert working gas is usually argon. In one form, the sputtered ceramic layer 9B can be $Al_2O_3$ because of its ready availability and known deposition parameters. It will be appreciated, however, that other suitable deposition processes and other inorganic layer materials 9C (such as the aforementioned non-oxides $MgF_2$ and LiF produced by the aforementioned thermal evaporation) could also be used. As with the organic layer 9A, in situations involving device encapsulation, either first deposited layer 9B or 9C can be applied relatively thickly (such as over a 1,000 Å) to obtain a higher quality encapsulation, while subsequently deposited barrier stacks can provide the required environmental protection for the encapsulated device. While either reactive or non-reactive sputtering can be used to facilitate deposition of inorganic layer 9B on either sheet substrate 6 or environmentally sensitive device 90, the reactive approach is preferred, as this technique provides higher deposition rate and denser film for a better barrier. As previously mentioned, non-reactive processes can be advantageous for deposition of a protective layer 9C where concerns about damage to the object being encapsulated are important.

The closeness of the deposition source to the surface being deposited on is determined in part by which of the aforementioned deposition approaches are used. By way of example, the inventors have discovered that an approximately six inch sputter spacing between the two produces good results. Generally, the closer the surface is to the source, the higher the deposition rate, the trade-off being that if the surface and source are too close, high heat build-up can occur on the surface. In one example, if the environmentally sensitive device 90 is the aforementioned OLED, it might be necessary to protect it its upper cathode layer from the effects of a reactive gas. In addition to closeness, the orientation of the surface relative to the source (whether above or below, for example) is dependent on the type of device being encapsulated. Upward deposition has been used more extensively in the past, because thermal evaporation is typically an upwardly-directed phenomenon. If the substrate is large, downward or sideways deposition may instead be preferred. The energy input for the various deposition processes can also come in many forms, and can interact with other deposition considerations, such as whether reactive or non-reactive methods are used. For example, a direct current (DC) input with a reverse bias pulse is currently compatible with an $Al_2O_3$ layer, and is relatively simple and provides a high deposition rate. This is also beneficial in arc suppression and control, as well as related particle generation. There are other possible energy sources for depositing ceramic and related dielectric materials, such as alternating current (AC) or RF, especially for situations where arcing is to be avoided, and where the relatively high speed deposition rates of pure metals is not required.

Figure 4A:
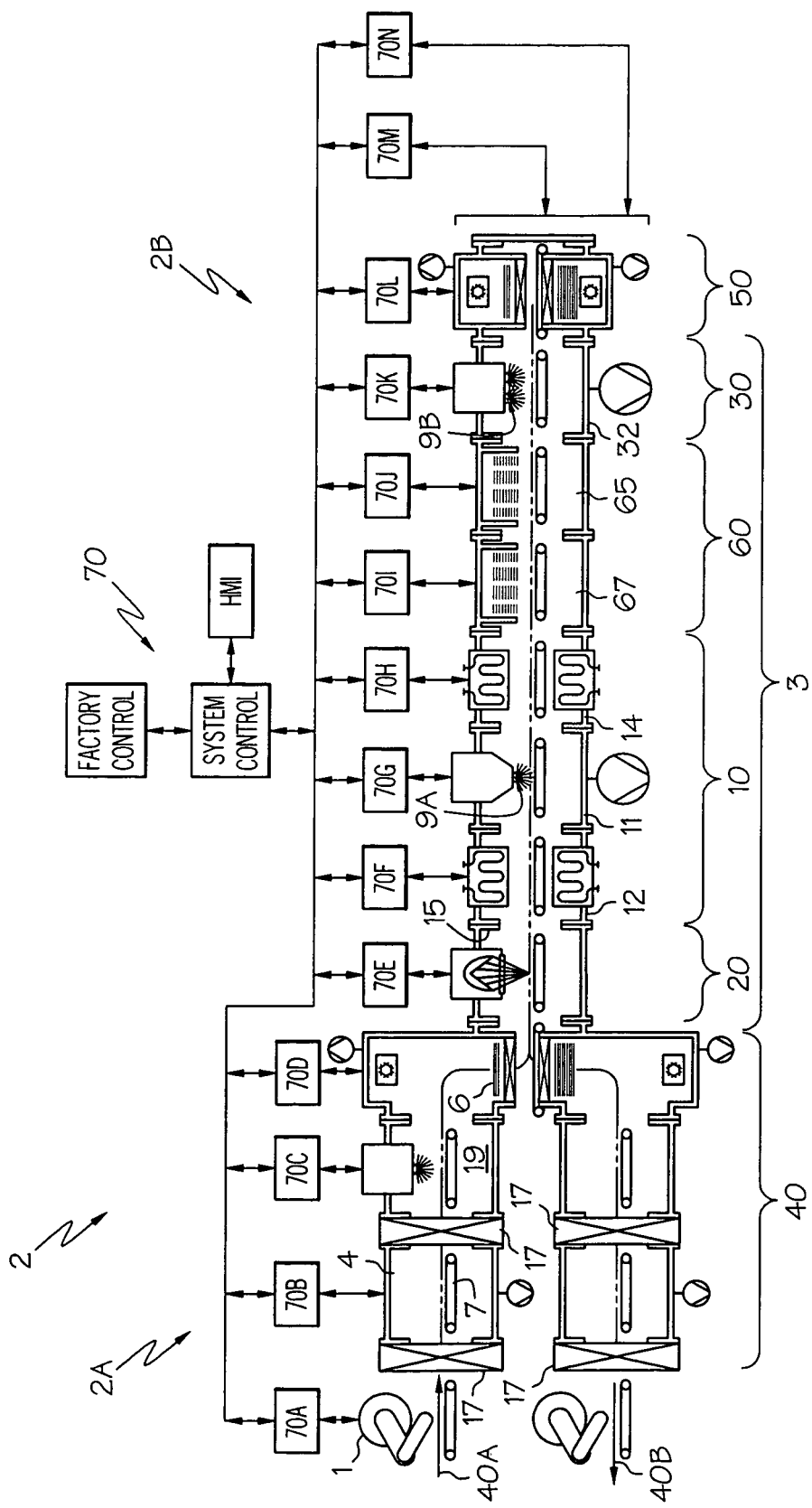
FIG. 4A is a diagrammatic view of an in-line encapsulation tool with a single organic layer deposition station according to an aspect of the present invention.

Referring next to FIG. 4A, an in-line encapsulation tool 2 for depositing multilayer coatings on the sheet substrate 6 according to an aspect of the present invention is shown. The encapsulation tool 2, with proximal end 2A and distal end 2B, includes a deposition housing 3, the inside of which can be evacuated. Deposition housing 3 collectively defines an organic layer deposition station 10, curing station 20, inorganic layer deposition station 30 and masking station 60 such that all four stations operate under a single vacuum. To ensure a common vacuum between the stations 10, 20, 30 and 60 inside deposition housing 3, openings between adjacent stations are coupled together to establish an open flowpath between them. As used herein, "coupled" refers to components that are connected to one another, but not necessarily directly connected. In the present context, intervening pieces of equipment between the two pieces "coupled" together would not be destructive of a coupled arrangement so long as some connectivity is present.

The configuration of the encapsulation tool 2 shown involves a shuttling of the sheet substrate 6 back and forth through the organic layer deposition station 10, curing station 20, inorganic layer deposition station 30 and masking station 60 over multiple bi-directional trips to achieve the desired number of deposited layers. As will be discussed in more detail below, the encapsulation tool 2 can also be configured as a unidirectional device such that the requisite number of layers can be deposited in a single pass through the system. The inorganic layer deposition station 30 comprises a deposition chamber 32 for depositing inorganic layer 9B, the details of which are discussed above. The organic layer deposition station 10 includes a first migration control chamber 12, a deposition chamber 11 for depositing organic layer 9A, and a second migration control chamber 14. Temperature control of the substrate is one way in which migration control of the material making up the organic layer 9A can be achieved. Since the organic layer deposition step is very sensitive to substrate temperature (particularly elevated substrate temperatures), where cooler substrates will condense more organic precursor uniformly and rapidly, particular emphasis has been placed on cooling the substrate. To that end, cooling (for example, in the form of chillers or thermal masses placed in migration control chambers 12, 14 can be introduced along the deposition path to keep the substrate 6 and the coating 9 or environmentally sensitive device 90 thereon from overheating. This cooling minimizes the dispersion of any organic precursor vapor to adjacent stations to avoid encapsulation tool hardware fouling. In addition, by reducing the quantity of excess organic precursor vapor before the sheet substrate 6 moves to the next station, the encapsulation tool 2 effects a concomitant reduction in the likelihood that subsequent coating layers will become contaminated. Coolant (cryogenic or other) feed tubes (not shown) connect the chiller (not shown) to the first migration control chamber 12 so that the feed tubes can disperse a chilling fluid (such as liquid nitrogen) over the top and bottom of the sheet substrate 6. The feed tubes have a supply and a return. The coolant is isolated from the vacuum.

In addition, cycle purge can be employed to reduce contamination in the feed interface section. Baffles 15 situated on the proximal and distal sides of organic layer deposition station 10 further contain the vaporous organic precursor within the localized space in which it is deposited. The baffles 15 could also be added to other stations to partially shield the open flowpath defined by the contiguous entrances and exits of the various stations from stray vapor dispersion. The flowpath is open enough to ensure that common vacuum between the stations is not compromised. Once the deposition process is complete, the sheet substrate 6 goes into a second migration control chamber 14 similar to that described in conjunction with the first migration control chamber 12 above.

Curing station 20 is configured to cure organic layer 9A that was deposited in organic layer deposition station 10. Upon curing of the organic layer 9A, additional layers may be deposited. Cure or cross-linking results from free radical polymerizations that can be initiated by exposure to an electron beam (EB) source or by exposure to a UV source when the aforementioned photoinitiators are incorporated into the organic precursor. In certain deposition scenarios, such as where a device 90 is placed on the substrate 6, the use of UV is preferred to that of EB, as relying on UV exposure to cure the condensed layer rather than an EB source helps to avoid concerns over the impact of the more harsh EB exposure. By way of example, EB exposure can be up to several kiloelectron volts (keV) on the underlying device 90. It will be appreciated by those skilled in the art that polymerization (cross-linking) based on UV exposure is not limited to free radical mechanisms. There are photoinitiators that liberate cationic initiators (so-called Lewis-acids, Bronstead-acids, onium salts, etc.) enabling the use of cationic polymerization mechanisms. Use of these curing mechanisms in combination with flash evaporation is taught by U.S. Pat. No. 6,468,595, hereby incorporated by reference. Cationic polymerization facilitates use of a large family of vinyl functional and cycloaliphatic epoxy function organic materials that are not ideally used in free radical polymerizations, but are still considered addition polymerizations.

Masking station 60 can include inorganic mask placement device 65 and organic mask placement device 67, each to overlay the environmentally sensitive objects 90 deposited on sheet substrate 6 with thin, card-like masks. The masks prevent deposition of organic layer 9A onto selected regions of substrate 90, such as electrical contacts, and can be used to define (control) the overlap relationship between inorganic layers 9B and organic layers 9A, where such relationship is beneficial in edge seal design. In the case of the organic mask placement device 67, the overlaid masks can further be used to allow selective exposure and subsequent cure of portions of the deposited organic layer 9A. In the deposition of inorganic layer 9B, portions of the mask may effect protection of the environmentally sensitive objects 90 (such as an OLED cathode) from heat or particulate matter by acting as shields, as they are placed between the source cathode and the substrate to be coated and act as a mask to limit (define) the area of the substrate exposed to the source.

The proximal end 2A of the encapsulation tool 2 can be configured as an accumulator 40 to allow an interface of the deposition stations of housing 3 to upstream or downstream equipment, or to the ambient external environment, such as for loading and unloading substrate 6. The accumulator 40 (or a related exchange mechanism) acts as a wait station for one or more of the substrates 6 that are about to be processed, providing a stable, relatively isolated environment where, for example, temperature and atmospheric agitation reduction can be effected, thereby improving the overall quality of the deposition process. The accumulator 40 includes an inlet 40A and an outlet 40B spaced apart from inlet 40A. The accumulator may include isolation chambers 4 defined by isolation valves 17 such that once the substrate 6 is loaded in the accumulator 40, at least partial isolation from the ambient environment may commence. As previously mentioned, vacuum and thermal control can be produced in the accumulator 40. The thermal reduction can be achieved by thermal mass heat sinks that are placed in contact with or adjacent the substrate 6 at one or more discrete locations, or by a chilled fluid (such as liquid nitrogen) system. These heat sinks can be used to reduce the temperature of the substrate 6 prior to the substrate 6 entering the various deposition stations, as well as cool the substrate during the deposition process.

In addition to supporting at least partial environmental isolation for the substrate 6, the accumulator 40 may also include one or more surface treatment chambers 19 to improve the adhesion of one of the organic layer 9A or inorganic layer 9B to substrate 6. The surface treatment chamber 19 may be a plasma energy (glow discharge) source and may use an inert working gas, a reactive working gas or a combination thereof. The energy source to generate the plasma can come from RF, AC and DC, and may include a downstream plasma source, where the plasma is generated remotely and delivered to remove organic contaminants that may have coated various components therein. The treating, which causes increased surface energies accompanied by increased hydrophilic behavior, enhances adhesion between the substrate and the first formed layer, thereby enabling formation of a better bond therebetween. In situations involving a flexible substrate, such as the aforementioned PET film, additional improvements in film compliance and contaminant reduction is also enabled by surface treating. This is important, as these contaminants (typically in the form of low-molecular-weight species) are migratory, thus capable of spreading to other layers. In addition, the inorganic layers can be treated to effect enhanced adhesion with subsequently deposited organic layers. For encapsulation, it is probably sufficient to treat only the surfaces of the inorganic layers of the multilayer coating. This is based on the inventors' belief that the improvements to adhesion occur by treating the inorganic layer surfaces rather than the surfaces of the organic layers. A second accumulator 50 can define the distal end 2B of encapsulation tool 2. This accumulator, while capable of possessing all of the features of accumulator 40, is preferably simpler, providing optional temperature control and turnaround and wait-state containment of one or more substrates 6.

Once the proper environmental conditions have been established for the substrate 6 in accumulator 40, the substrate 6 is transported along conveyor 7 to housing 3, where, depending on the deposition strategy, the layers 9A, 9B of multilayer coating 9 will be deposited. For example, an eleven layer coating 9 could be formed from five organic layers 9A interspersed among six inorganic layers 9B. Furthermore, it may be preferable to deposit the inorganic layer 9B as the first layer on the substrate 6, onto which alternating layers of organic and inorganic layers 9A, 9B may subsequently be placed. Contrarily, it may be preferable to reverse the order, having the organic layer 9A as the first layer on the substrate 6. Although shown in a one-sided configuration, the inorganic layer deposition station 30 can be configured to provide two-sided treatment of the substrate.

Next, the sheet substrate 6 travels to the deposition chamber 11 within organic layer deposition station 10, to receive an organic layer 9A of multilayer coating 9. The organic layer 9A is preferably deposited via an evaporative process such as PML, where the precursor material can be in the form of a liquid solution, liquid with solid dispersion or liquid with liquid-immiscible mixture. Evaporation may be performed by supplying a continuous liquid flow of the organic layer precursor material into the vacuum environment at a temperature below both the decomposition temperature and the polymerization temperature of the precursor, continuously atomizing the precursor into a continuous flow of droplets, and continuously vaporizing the droplets in a heated chamber having a temperature at or above a boiling point of the precursor, but below a pyrolysis temperature.

Once the sheet substrate 6 reaches the accumulator 50 at the distal end 2B of encapsulation tool 2, it may subsequently be sent in a reverse direction in order to pass through curing station 20 to harden the organic layer 9A that was just deposited in the organic layer deposition station 10. Similarly, such a configuration establishes a compact system for the deposition of additional layers 9A, 9B of multilayer coating 9 as the sheet substrate 6 can simply be turned around to pass through the existing components defined by the organic layer deposition station 10, curing station 20 and inorganic layer deposition station 30 in reverse order. The sheet substrate 6 can travel through the encapsulation tool 2 as many times as desired to receive the appropriate number and type of layers 9A, 9B of multilayer coating 9. The encapsulation tool 2 may also include other deposition stations (not shown) to deposit additional coatings on the sheet substrate 6 including, but not limited to, scratch resistant coatings, antireflective coatings, anti-fingerprint coatings, antistatic coatings, conductive coatings, transparent conductive coatings, and other functional layers. Additional equipment can be connected to encapsulation tool 2, including a testing (or measurement) chamber 8 (shown later) that can be used for quality-control purposes, such as to provide indicia of the adequacy of the multilayer coverage. For example, a calcium-based referee sample can be created to support oxygen and water permeability tests of the multilayer coating that is being applied via the apparatus of this invention. Such additional deposition stations (if present) could be included either upstream or downstream of the accumulator 50.

Control system 70, made up of individual controllers 70A through 70N, is used to dictate process parameters, including the order of deposition of the inorganic and organic layers, as well as thermal, motion and utilities control. For example, thermal control 70D can include hardware and software that is coupled to the thermal control devices in the accumulator 40 to chill the substrate 6, while thermal control 70F and 70H can be used to operate the contaminant reduction devices of the migration control chamber 12. Motion control 70M includes hardware and software that tracks the position of the substrate 6 while being transported by conveyor 7 along the encapsulation tool 2. Utilities control 70N includes hardware and software to provide electrical power, process gas, vacuum, compressed air and chilled water to the individual stations. Similarly, the factory control interfaces external systems for material management and process status. The human machine interface (HMI) is the control panel, computer, software, screen, keyboard, mouse and related equipment that allows an operator to run the system. The control system 70 can shuttle the sheet substrate 6 (and any environmentally sensitive device 90 thereon to be encapsulated, if present) in any order to accommodate particular encapsulation or barrier deposition configurations.

Figure 4B:
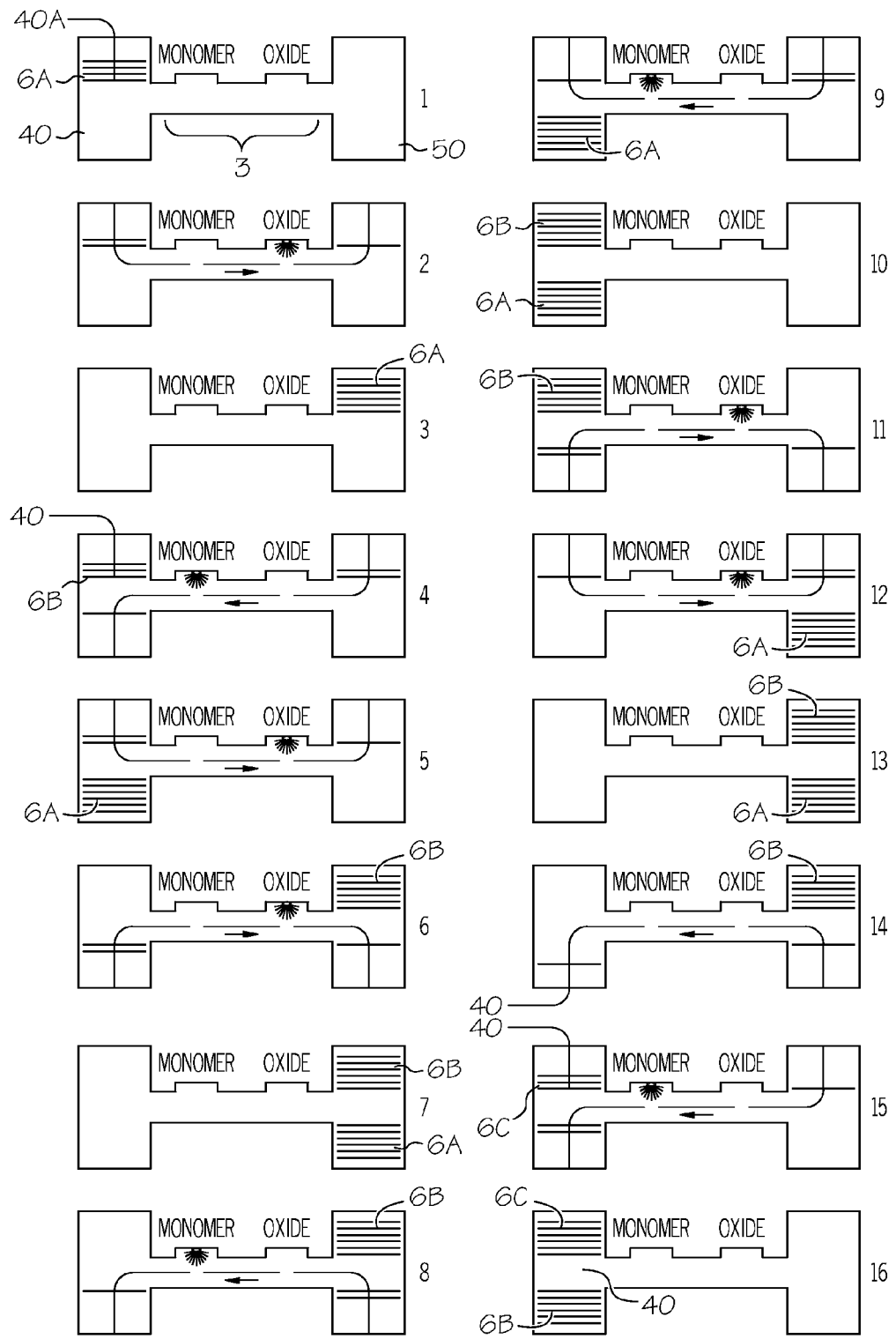
FIG. 4B is a diagrammatic view of the positions of the substrate as it traverses back and forth through the tool of FIG. 4A during the multilayer deposition process, highlighting the tool's ability to handle multiple batches of substrates simultaneously.
Figure 5A:
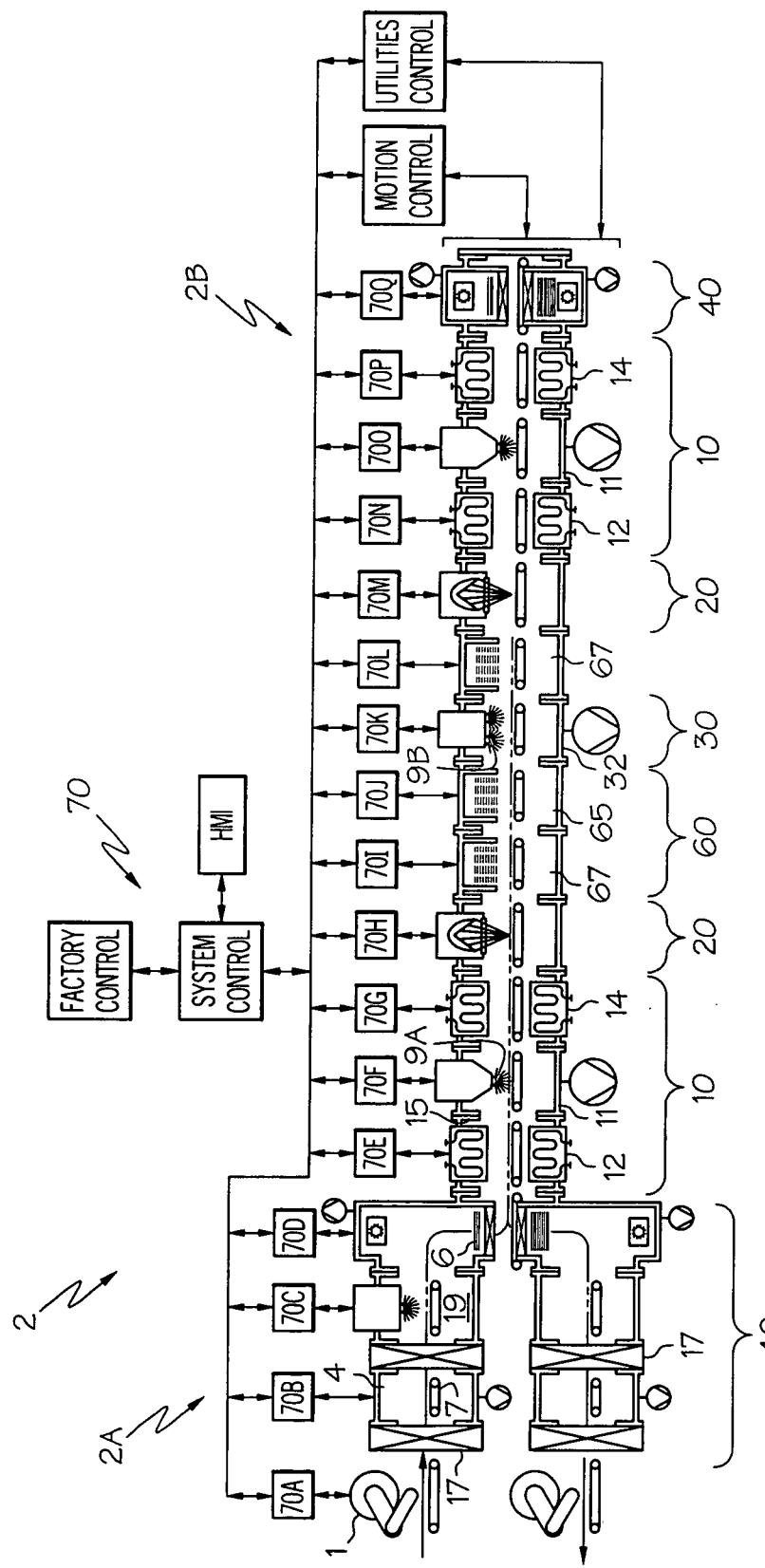
FIG. 5A is a diagrammatic view of the in-line encapsulation tool with dual organic layer deposition stations according to an alternate embodiment of the present invention.

Referring next to FIG. 4B in conjunction with FIG. 4A, sixteen simplified steps showing the preferred deposition order of a two-layer coating 9 traversing an encapsulation tool 2 comprising a single organic layer deposition station 10 are shown, noting with particularity that the device shown is capable of processing two batches of substrates 6A, 6B simultaneously. The configuration of the encapsulation tool 2 shown in FIG. 4A with accumulators 40, 50 disposed on opposite ends of housing 3 allows the substrate 6 to be routed in a bi-directional path through the encapsulation tool 2 as many times as needed to build up the multilayer coating 9. By having a second accumulator 50 disposed at the distal end 2B of encapsulation tool 2, multiple batches of substrate 6 can be loaded and processed simultaneously. It will be appreciated by those skilled in the art that while the number of batches that can be produced simultaneously in the tool of FIGS. 4A and 5A is preferably two in number, the present device is not so limited, as additional accumulators and related isolation containers (none of which are shown) can be coupled to the existing tool to improve batch throughput.

In step 1 of the operation, the first batch 6A of sheet substrates 6 is loaded into accumulator 40 at proximal end 2A. After stable environmental conditions are established in the accumulator 40 (such as temperature reduction, establishment of a predetermined vacuum level or the enhancement of surface properties in surface treatment chamber 19), the sheet substrates 6 are moved sequentially past the organic layer deposition station 10 and curing station 20 by a conveyor 7 to the masking station 60. A pallet (not shown) to carry the sheet substrate 6 may contain holes therethrough to facilitate deposition of the layers of multilayer coating to the bottom of the sheet substrate 6, if desired, such as for two-sided coating deposition. Furthermore, an open palette may allow the substrate to better "see" a chill plate or related thermal management device, thereby increasing the contribution of the chill plate to substrate thermal management.

Upon arrival at the masking station 60, the substrate 6 first receives a mask from inorganic mask placement device 65, after which it moves (as shown in step 2) to inorganic layer deposition station 30 to receive inorganic layer 9B. The energy applied (which may come from, by example, a 2 kilowatt pulsed DC source applying a reactive coating in an exothermic reaction) to the substrate 6 from the inorganic layer deposition station 30 may raise the temperature of the substrate significantly.

To counteract this increase in temperature (which could otherwise adversely impact the ability of the substrate to accept organic layer 9A in subsequent deposition steps), the substrate is temporarily placed in accumulator 50, as shown in step 3, where the thermal control features of accumulator 50 can be activated to both effect temperature reduction, as well as position the substrates 6 of batch 6A for a return trip through housing 3. At this time, as shown in step 4, a second batch 6B can be introduced into the inlet 40A of accumulator 40 at the proximal end of encapsulation tool 2, while the substrates 6 from batch 6A traverse the reverse direction, receiving an organic layer coating from organic layer deposition station 10 with subsequent curing (not presently shown). In step 5, the individual substrates 6 of second batch 6B receive the same layer deposition as the first batch 6A did in step 2. In step 6, the first batch 6A repeats that of step 2, being routed after deposition to separate wait space in accumulator 50 so as not to mix with second batch 6B. After this step, the first batch 6A has an inorganic-led first organic/inorganic layer pair 9A/9B of coating 9. As such, a first inorganic layer 9B is part of the foundation pair (composed of first inorganic layer 9B and first organic layer 9A) that decouples or isolates the barrier coating 9 from the underlying substrate 6 or device 90. In step 7, both batches 6A and 6B are contained in accumulator 50, while in step 8, the first batch 6A receives a second organic layer 9A and cure. In step 9, each substrate 6 of the second batch 6B receives its first deposition of organic layer 9A until both batches 6A and 6B are stored in the accumulator 40, as shown in step 10. After step 11, the first batch 6A has two organic/inorganic layer pairs 9A/9B of coating 9 disposed on the substrates 6. Step 12, once completed, leaves second batch substrates 6B with a first inorganic layer 9B and a first organic/inorganic layer pair 9A/9B of coating 9. Step 13 is a wait state similar to that of step 7. Step 14 depicts the substrates 6 from first batch 6A exiting the encapsulation tool 2 through outlet 40B in accumulator 40. In step 15 (which repeats the process of step 4), second batch 6B receives an organic layer 9A and curing, while a new batch 6C is loaded into the inlet 40A of accumulator 40. Step 16 shows the second and third batches 6B, 6C in a wait state in accumulator 40. It will be appreciated that modifications to the above steps are possible; for example, if greater or fewer numbers of layers are required, the number of passes through the encapsulation tool 2 can be varied accordingly. It will be appreciated by those skilled in the art that while the order (i.e., inorganic-led) of the foundation pair is currently preferred based on the substrates currently in use, the present system can be configured to provide an organic-first deposition strategy for other substrate compositions that would require such an approach.

Figure 4C:
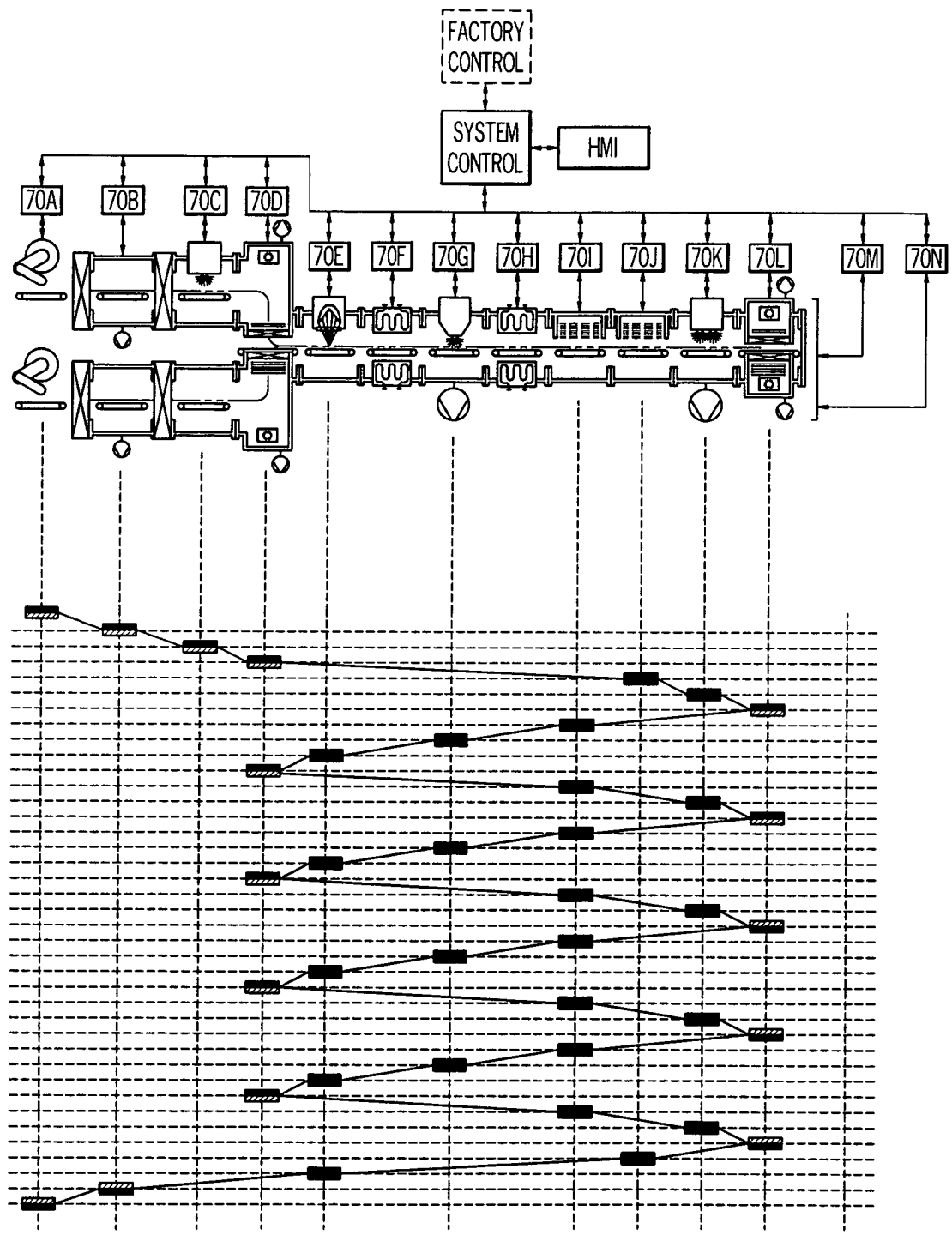
FIG. 4C shows a juxtaposition of the tool of FIG. 4A with a sequencing diagram, showing the order in which various components in the tool are activated to produce a multilayer coating.

Referring next to FIG. 4C, the juxtaposition of the encapsulation tool of FIG. 4A and a flowchart showing the shuttling of a substrate 6 is shown, producing a four-layer coating 9. In this case, the inorganic (oxide) mask can be applied once, followed by applying (overlaying) the organic mask only for inorganic (oxide) depositions. This configuration allows easy creation of undercut masks from two flat masks.

Figure 5B:
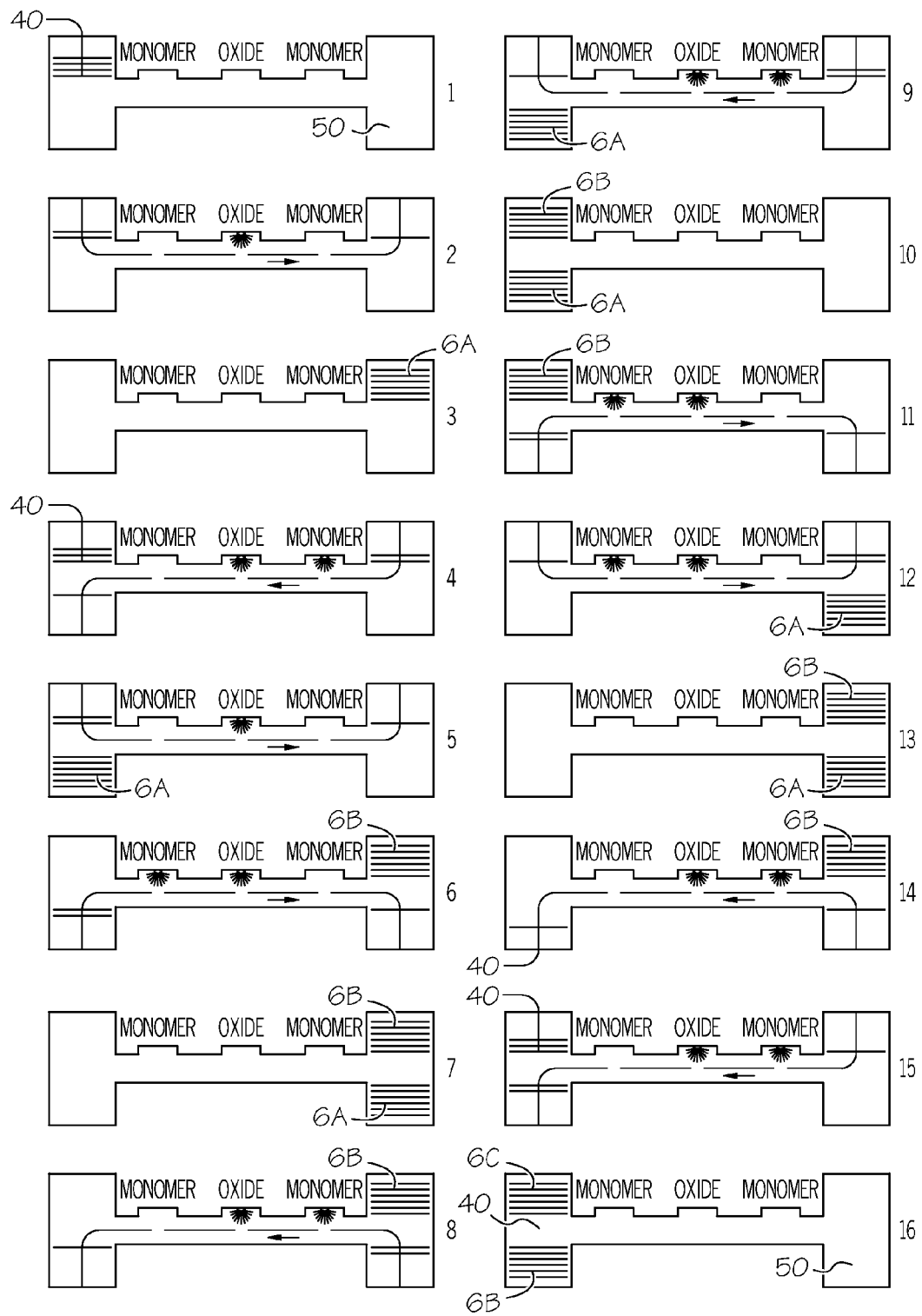
FIG. 5B is a diagrammatic view of the positions of the substrate as it traverses back and forth through the tool of FIG. 5A during the multilayer deposition process, highlighting the tool's ability to handle multiple batches of substrates simultaneously.

Referring next to FIGS. 5A and 5B, the encapsulation tool 2 has multiple organic layer deposition stations 10 such that, like the configuration shown in FIG. 4A, it can operate under a common vacuum. While this variant of the system includes extra components, it has the advantage of having the housing 3 be repeated (not shown) such that all of the required layers of multilayer coating 9 can be deposited a fewer passes, thus improving throughput. As an alternative, if enough housings 3 are juxtaposed, the substrate 6 can be made to travel unidirectionally, thus simplifying the accumulators 40, 50 which would no longer require turnaround features. The number and arrangement of such a station arrangement will depend on the required configuration of the layers in the multilayer coating 9, and can be configured accordingly. The encapsulation tool 2 can furthermore be configured to deposit the organic and inorganic layers 9A, 9B in any order, as well as to put an object either directly on the sheet substrate 6 or on one or more layers of the multilayer coating. For example, while the preferred embodiment is to have the sheet substrate 6 be placed into the encapsulation tool 2 with the object to be encapsulated already mounted, the tool can also be configured to have the substrate 6 enter the encapsulation tool 2 empty, to have the object placed onto it once it is in the tool 2. Also, as with the configuration of the tool 2 as shown in FIG. 4A, baffles 15 can be used to straddle the various stations, especially the organic layer deposition station 10, to reduce migration of the material used to make up the organic layer 9A. The simplified steps of FIG. 5B mimic those previously described in conjunction with FIG. 4B, modified to take into account the additional organic layer deposition station 10.

Figure 6:
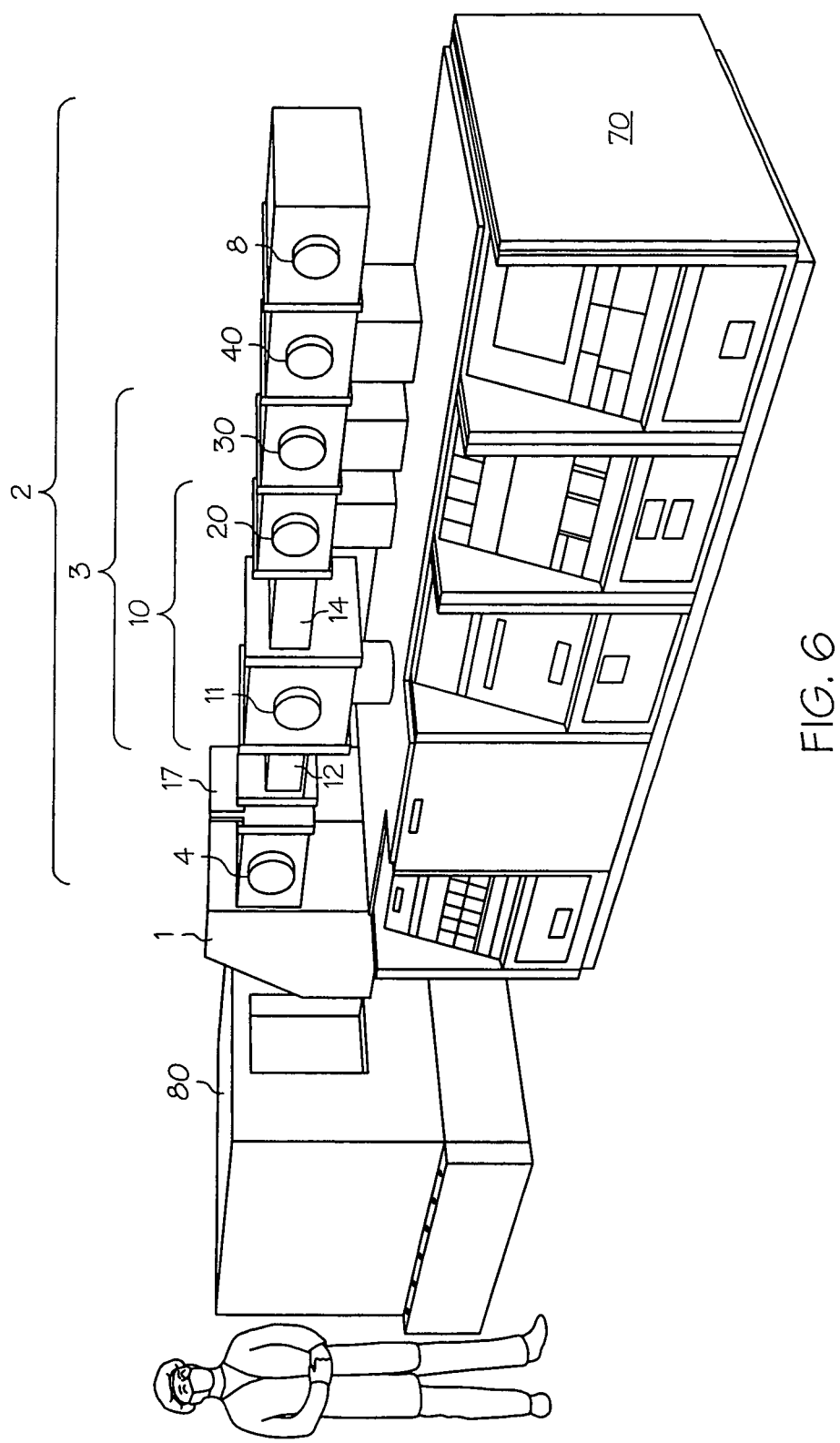
FIG. 6 is a perspective view showing the juxtaposition of the encapsulation tool with a controller of the present invention with an active device deposition apparatus.

Referring next to FIG. 6 in conjunction with FIG. 3, the encapsulation tool 2 of FIG. 4A is shown connected to control system 70 and an external material handling apparatus 80, all for depositing an environmentally sensitive device 90, such as an OLED, on sheet substrate 6. The external material handling apparatus 80 can be configured to allow either manual or automated interfacing with the encapsulation tool 2. Optional measurement chamber 8 is shown adjacent an accumulator 40 at the end of the tool 2. In situations where the tool can be used for in-line device (OLED) manufacturing, an interface that maintains a suitable vacuum and includes hand-off means to transfer substrates with devices in place to the tool 2 would be employed. Although not presently shown, an accumulator 40 positioned between the two is advantageous, providing a means to deal with speed matching, problem resolution (such as stop-and-fix), maintenance, cool downs, or the like. In another approach (not shown), the tool 2 is separate from the device (OLED) manufacturing line. The manufacturing line will need a delivery with means for emplacing substrates with devices into a transport container that can be sealed and afterwards maintain a suitable vacuum. In this circumstance, the tool 2 will require a feed with means for receiving the transport container, opening, and hand-off loading onto the tool transport system. The line delivery and the tool receiver have to include means to establish and maintain suitable vacuums. Also, contrary to that of FIGS. 4A and 5A, isolation chambers 4 need not be part of accumulator 40, but may be separate devices.

Referring next to FIGS. 7 through 17, an alternate embodiment of a tool 300 uses a hybrid design for deposition of multilayer coatings on discrete substrates. Its hybrid nature derives from its incorporation of cluster and in-line tool attributes into a single tool that employs a cluster tool section 310 for inorganic layer deposition and an in-line tool section 330 for organic layer deposition. The present combination of the two sections with a vacuum environment (enabled by vacuum source 350), facilitates the formation of multilayer protective coatings.

The Cluster Tool Section

In cluster tool section 310, a central robot 312 is disposed in a central hub region 313 to transport one or more workpieces (such as the aforementioned discrete substrates 6) in between various peripherally-coupled process stations in a programmed sequence. Examples of such peripheral stations include a thin film coating deposition station 314 (particularly, a plasma-enhanced chemical vapor deposition (PECVD) station), a thermal evaporation station 316, a mask stocker station 318, a load lock 320, an etching station 322, a sputtering station 324 and a mask aligner station 326. Each of the peripheral stations, as well as the central hub region 313, are coupled to a vacuum means 350 (which can be, for example, a vacuum pump) to establish and maintain internal vacuum as required. Door or related isolation valves (not shown) are placed between central hub region 313 and each of the peripheral stations to facilitate a selective between them. Because the robot 312 transfers substrates and related workpieces between discrete, isolatable stations, the need for continuous shuttling equipment (such as a conveyor-based transport device) is eliminated. Advantageously, once the robot 312 transfers a discrete substrate into a particular station, isolation devices (such as the aforementioned door valves) coupled thereto can be deployed to effect contamination reduction due to process byproducts or excess reactants. With the exception of the thermal evaporation station 316, the various stations can perform the same functions as their previously-described linear tool counterparts. It will be appreciated by those skilled in the art that the various stations in the cluster tool section 310 are interchangeable such that they can be configured in numerous ways as required.

The thermal evaporation station 316 can be used for immediate deposition of the previously-mentioned protective layer 9C onto a device 90 (shown, for example, in FIG. 3) to be encapsulated. For example, when the device 90 is an OLED, its topmost layer is a cathode typically made from a low-work function metal (such as calcium or magnesium) which reacts rapidly with oxygen or water. In this circumstance, the use of the thermal evaporation system 316 to immediately commence deposition of the protective layer 9C on top of a newly-formed cathode layer avoids cathode degradation. Thus, in OLED manufacturing process sequences, the thermal evaporation system 316 provides a valuable coating deposition. Thermal evaporation station 316 can also be used for the thermal evaporation of one or more protective layers (of which the aforementioned LiF and $MgF_2$ layers are examples) to avoid plasma damage to a sensitive substrate 6. The thermal evaporation station 316 may also include masking capability, (including mask alignment capability) to control where the protective layer 9C is deposited. Such an additional feature may be useful in both production operations as well as process optimization operations. Mask stocker station 318 has the ability to hold numerous masks, including masks for etching, sputtering, monomer deposition, PECVD and evaporation. Mask aligner station 326 can be used to ensure precise placement of the mask relative to a substrate 6 or device 90 placed on the substrate 6.

Figure 12:
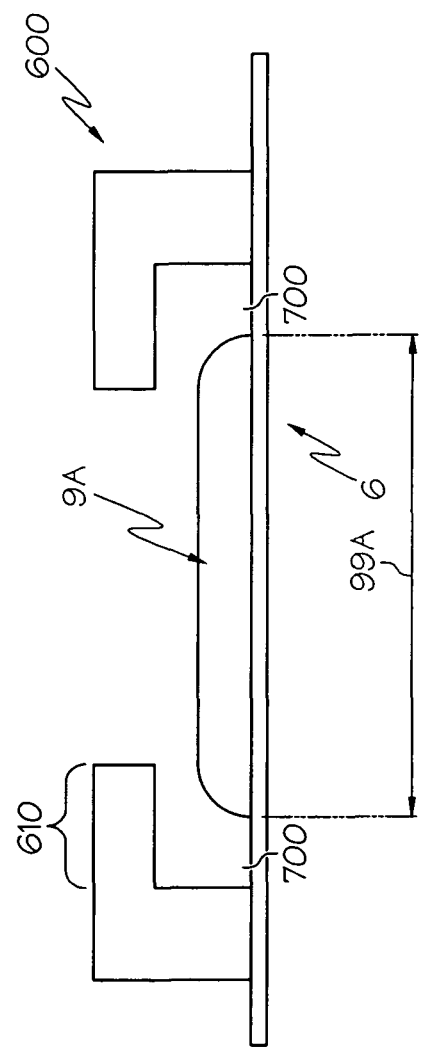
FIG. 12 shows an elevation view of a simplified masking arrangement about an environmentally sensitive device placed on a substrate.

Regarding the use of masking throughout hybrid tool 300, many of the same features discussed above in conjunction with the embodiment of FIGS. 4A and 5A (including undercut options) are applicable to both the cluster tool section 310 and the in-line tool section 330 of the hybrid tool 300. Referring next to FIGS. 12 through 15, comparisons between masking according to the prior art and the present invention are shown. Referring with particularity to FIG. 12, a representation of how an organic (polymer) layer 9A is deposited using a generalized undercut mask 600 is shown. The larger area that includes border area 700 is a combination of the deposition travel path and additional spreading of the condensed layer due to the phenomenon known as wetting. Accordingly, mask dimensions need to take monomer spread under the mask at the interface of the mask with substrate into account, as it is desirable to avoid contact between the monomer deposit that has spread and the edges of the mask undercut that rest on the substrate 6. By using the enhanced undercut 610 made possible by mask 600, the contact between the contact mask 600 and the substrate 6 occurs in the border area 700 at points beyond the monomer spread, but not at the area where the mask 600 and substrate 6 meet. A shadow region formed underneath enhanced undercut 610 allows the organic layer to be deposited with the inevitable spread without the troublesome buildup of a thick deposited layer or wicking at the area where they join. A similar configuration can be used for deposition of the oxide or other inorganic layers, although since the spread tends to be less, the amount undercutting required is generally less. By not having the oxide layer in contact with the mask avoids damage to the edge of oxide layer (and concomitant debris reduction) when the mask is removed following deposition. It will be appreciated that the shape of the undercut is not critical and so can be chosen based on the needs of the substrate, ease of preparation or the like.

The present mask configuration facilitates the forming of an uncoated edge in the border area 700 surrounding the monomer layer 9A. This uncoated edge can then receive additional inorganic layers 9B without intervening monomer layers 9A. The build-up of successive inorganic layers 9B builds a substantially impermeable edge seal structure. Not having undercut mask 600 contacting the exposed surface of the inorganic layer 9B avoids a potential for inadvertent contamination. In situations where the substrate 6 to be coated is made from a rigid material (such as glass), simplified mask configurations (such as those discussed next) may be beneficial.

Figure 13A:
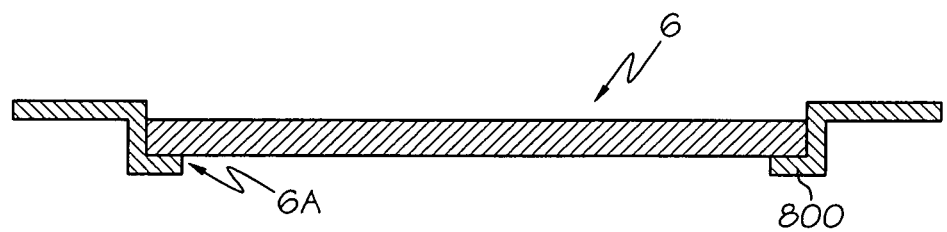
FIG. 13A shows an elevation view of a conventional mask of the prior art used to cover a substrate.
Figure 13B:
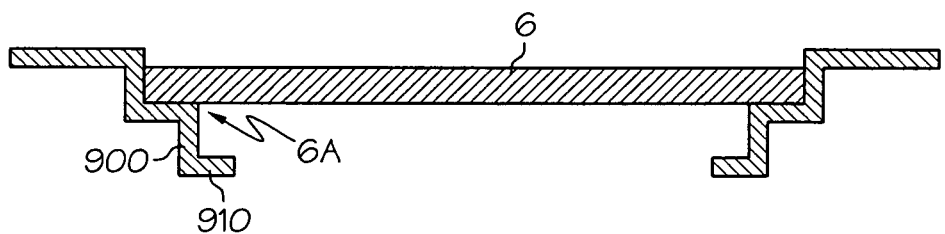
FIG. 13B shows an elevation view of a mask used to cover a substrate according to an embodiment of the present invention.

Referring with particularity to FIG. 13A, substrate 6 sitting in a conventional contact mask 800 of the prior art is shown. Organic material (not presently shown) piles up at the edge of the mask 800 due to capillary force effect. This leads to a thick organic edge layer and corresponding poor barrier performance. To overcome this problem, a mask 900 according to an embodiment of the present invention as shown in FIG. 13B is used. Unlike mask 800, mask 900 includes a built-in undercut 910 that overhangs the edge 6A of substrate 6 in a manner similar to that of the mask 600 of FIG. 12. The organic material (such as the aforementioned monomer vapor) is deposited upward on the lower surface of substrate 6, leaving a portion of edge 6A uncoated. The dimensions of the overhang produced by undercut 910 are adjusted to assure formation of an uncoated portion of edge 6A during organic material deposition. These built-in undercuts are also sufficient to allow upward deposition of an oxide (barrier) layer 9B that extends beyond the area covered by the deposited organic layer 9A, without having it completely coat the area underneath the undercut. This helps to avoid substrate or deposited layer damage when the mask is removed. The mask of FIG. 13B is particularly well-suited for encapsulation of OLEDs on glass or related rigid substrates using upwards deposition.

Figure 14A:
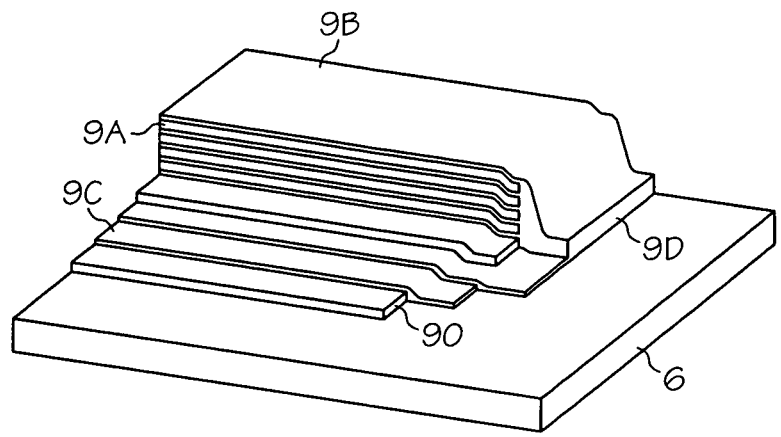
FIG. 14A shows a perspective cutaway view of a multilayer coating covering used to encapsulate an environmentally sensitive device that is placed on a rigid substrate according to an embodiment of the present invention.
Figure 14B:
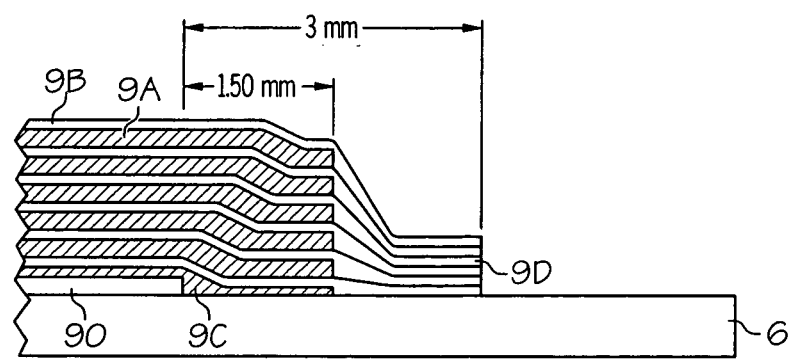
FIG. 14B shows an elevation detail view of an edge seal formed by the multilayer coating of FIG. 14A.

Referring with particularity to FIGS. 14A and 14B, the formation of alternating organic and inorganic layers on a substrate using one or more of the masks of the present invention is shown. Environmentally sensitive device 90 (such as an OLED) is placed on substrate 6 (shown presently as a glass substrate). On top of that, the optional protective layer 9C (such as the aforementioned thermally evaporated LiF or $MgF_2$) can be first deposited to overlap environmentally sensitive device 90. On top of that, inorganic layer 9B can be deposited to overlap protective layer 9C, after which alternating organic and inorganic layers 9A, 9B can be built up to form the desired coating 9. As can be seen from FIG. 14A, the dimensions of the organic layer 9A are substantially coincident with those of the protective layer 9C, while the edge seal 9D formed by inorganic layer 9B overlaps the organic layer 9A to reduce exposure of the edges of organic layer 9A to the ambient environment. The nature of the overlap can be seen in more detail in the cutaway view of FIG. 14B, where the width of edge seal 9D (including portions of it that overlap the organic and protective layers 9A, 9C) is approximately three millimeters, while the width of the deposited organic layers 9A and protective layer 9C is approximately one and one half millimeters. It will be appreciated by those skilled in the art that the dimensions discussed above are exemplary, and that the need for larger or smaller dimensions are embraced by the present disclosure and fall within the scope of the present invention.

Figure 15:
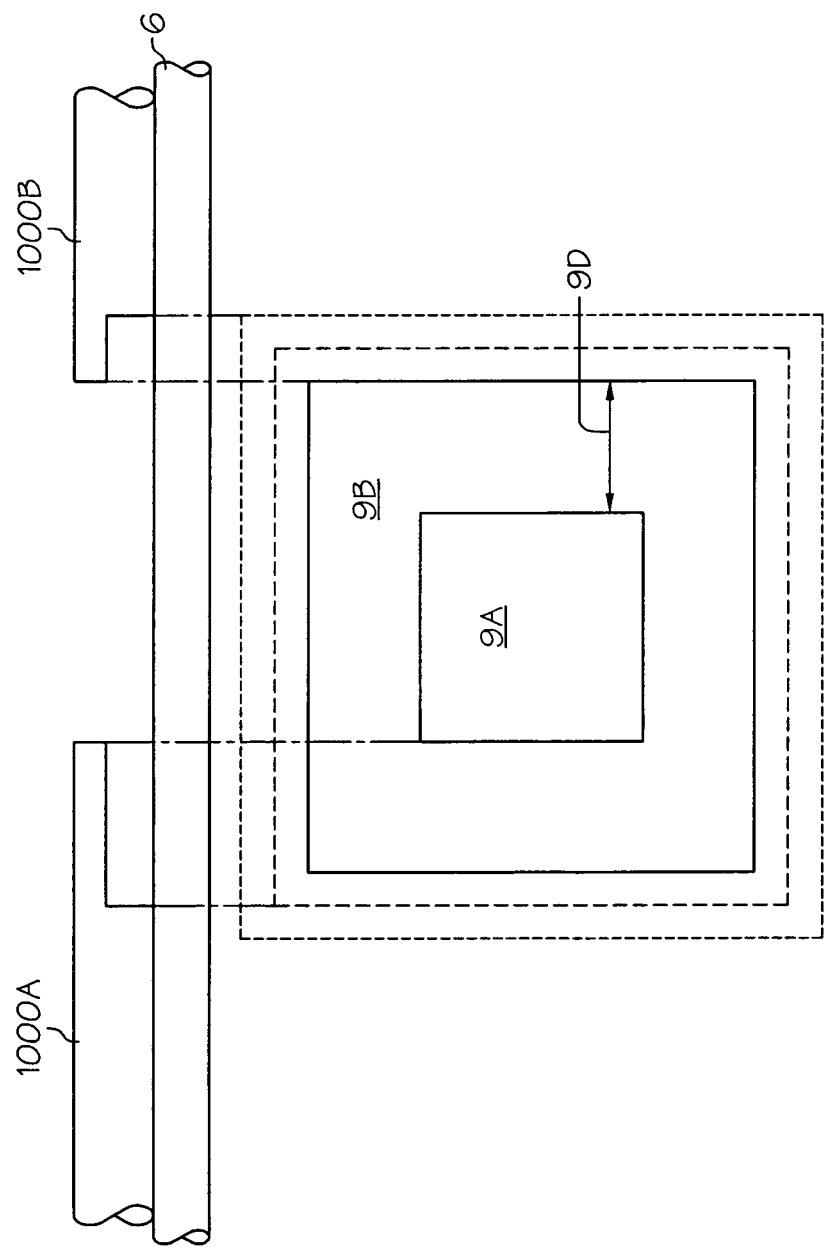
FIG. 15 shows a plan view of an edge seal formed on a substrate using the mask of FIG. 13B.

Referring with particularity to FIG. 15, the relationship between undercut dimensions and non-contact of a mask 1000 (which is generally similar to masks 600 and 900 of FIGS. 12 and 13B) with a deposited oxide layer can be achieved with at least one of two versions, one for the monomer layer 9A and a second for the inorganic layer 9B. Use of a pair of undercut masks can be exploited to deposit organic layer 9A and sputter (inorganic) layer 9B in specific areas in with a set relationship between the two, where the organic layer 9A covers less area so that barrier 9B is exposed at the edges. Exposing the barrier at the edges promotes formation of the multilayer structures depicted in FIGS. 14A and 14B, in which edge seal 9D is formed from a stack of the exposed barrier (inorganic layer 9B) edges. FIG. 15 additionally shows that a large undercut of the monomer mask 1000A is used so that contact of this mask with the substrate 6 falls outside the area covered by the barrier layer (oxide layer) 9B. This approach avoids accumulation and related contamination of the surfaces of the exposed oxide layer between oxide deposition steps.

Referring again to FIG. 7, since the various stations are not coupled by a conveyor or related continuous transport device, it is easier to maintain individual station autonomy and concomitant avoidance of cross-contamination. The use of robotic arms (not shown) from robot 312 coupled with an isolation valve (not shown) to allow placement of the substrate 6 within individual stations is more conducive to station autonomy than if the substrate 6 were carried on a conveyor-based system, as positive closure is easier than if there were a conveyor system present. A load lock station 320 can be used as an initial staging area for a substrate 6 waiting to be coated, and is isolatable from the external (ambient) environment, as well as from the central hub region 313 of cluster tool section 310 through isolation valves. Load lock station 320 can also be used to connect the hybrid tool 300 to other discrete components of a larger production tool (not shown). For example, if an encapsulated OLED formed in hybrid tool 300 is to become part of a larger finished product (such as integrated circuitry or the like), the load lock station 320, as well as an appropriate exchange mechanism (for example, the previously-discussed accumulator 40) could be employed to facilitate transport of coated substrates from the hybrid tool 300 to other stations along the larger tool.

Due to the extensive amounts of byproducts extant in some stations (for example, etching station 322), it is advantageous to keep such stations separable from the load lock station 320. The etch process of etching station 322 involves bulk removal, and therefore involves liberating a lot of material into an evacuated environment. The cluster approach employing robot 312 is simpler than a comparable linear tool design for achieving a combination of ease of conveying and environmental isolation in such a potentially contaminant-rich environment. Also, separation of the two allows for easier replacement or outright elimination of the etch station 322 if it turns out not to be needed. This also allows for easier customization of the tool for particular customer needs. Another option for separation is replacement of etching station 322 with a station to perform a different operation to meet a particular customer need.

Figure 8:
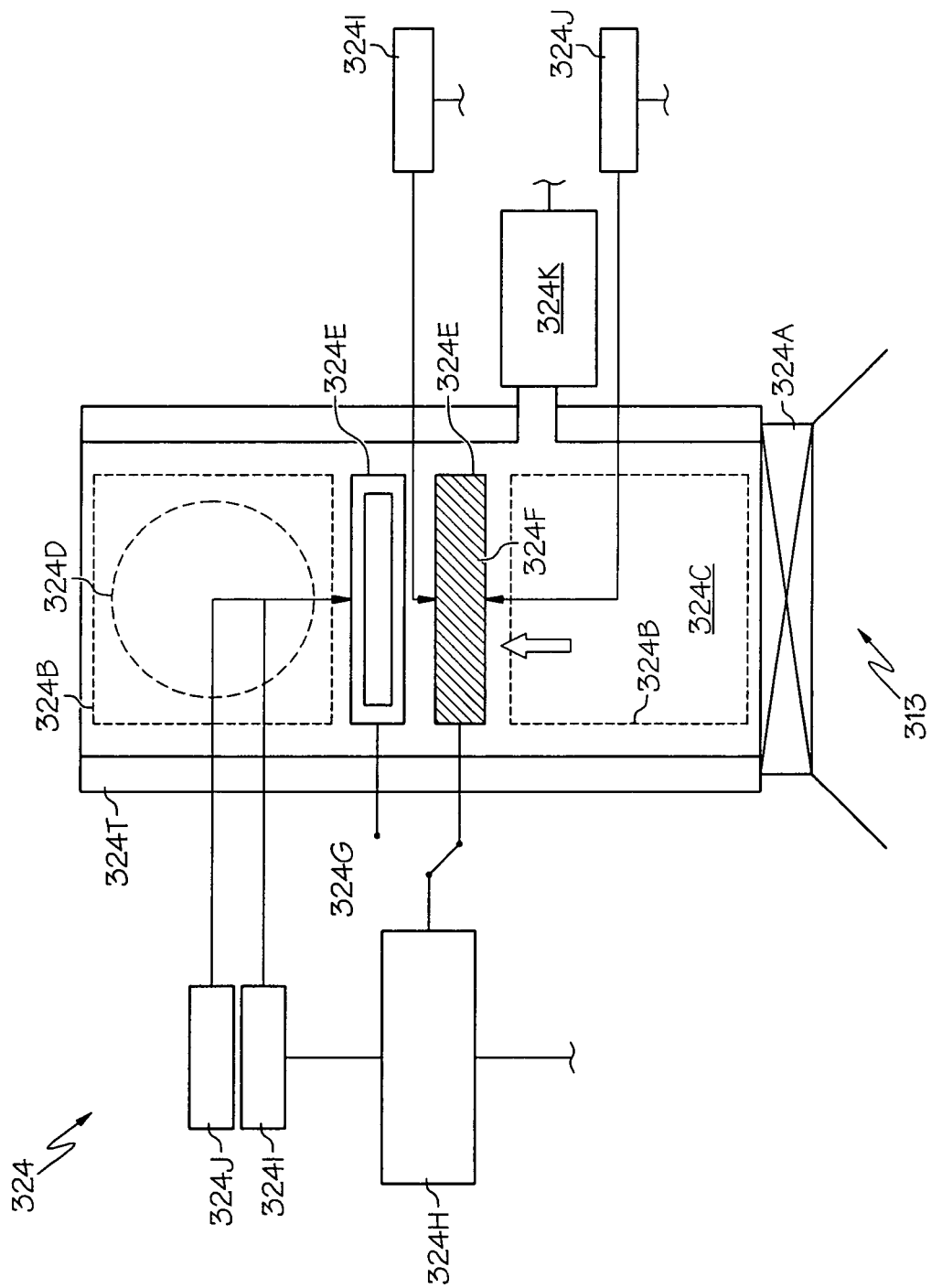
FIG. 8 is a simplified representation of a sputtering station portion of the cluster section of the tool of FIG. 7.
Figure 9:
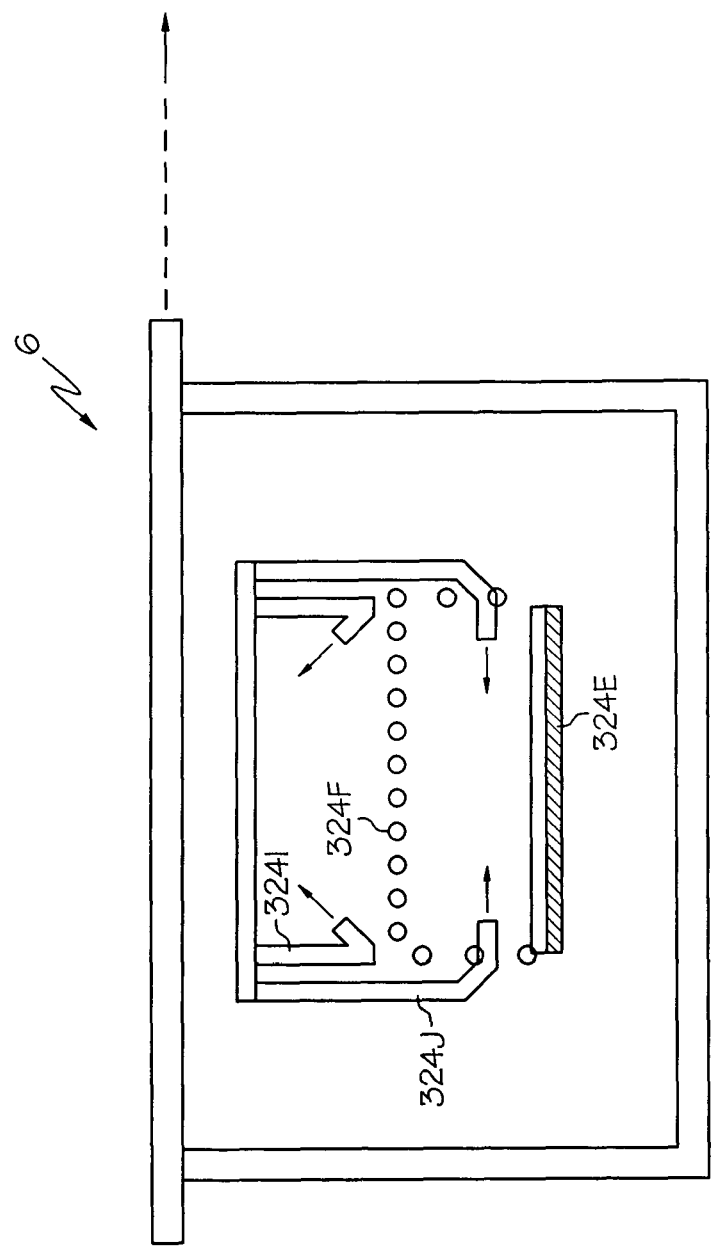
FIG. 9 is an elevation view of a portion of the sputtering station of FIG. 8 looking across the travel path of the substrate.
Figure 10:
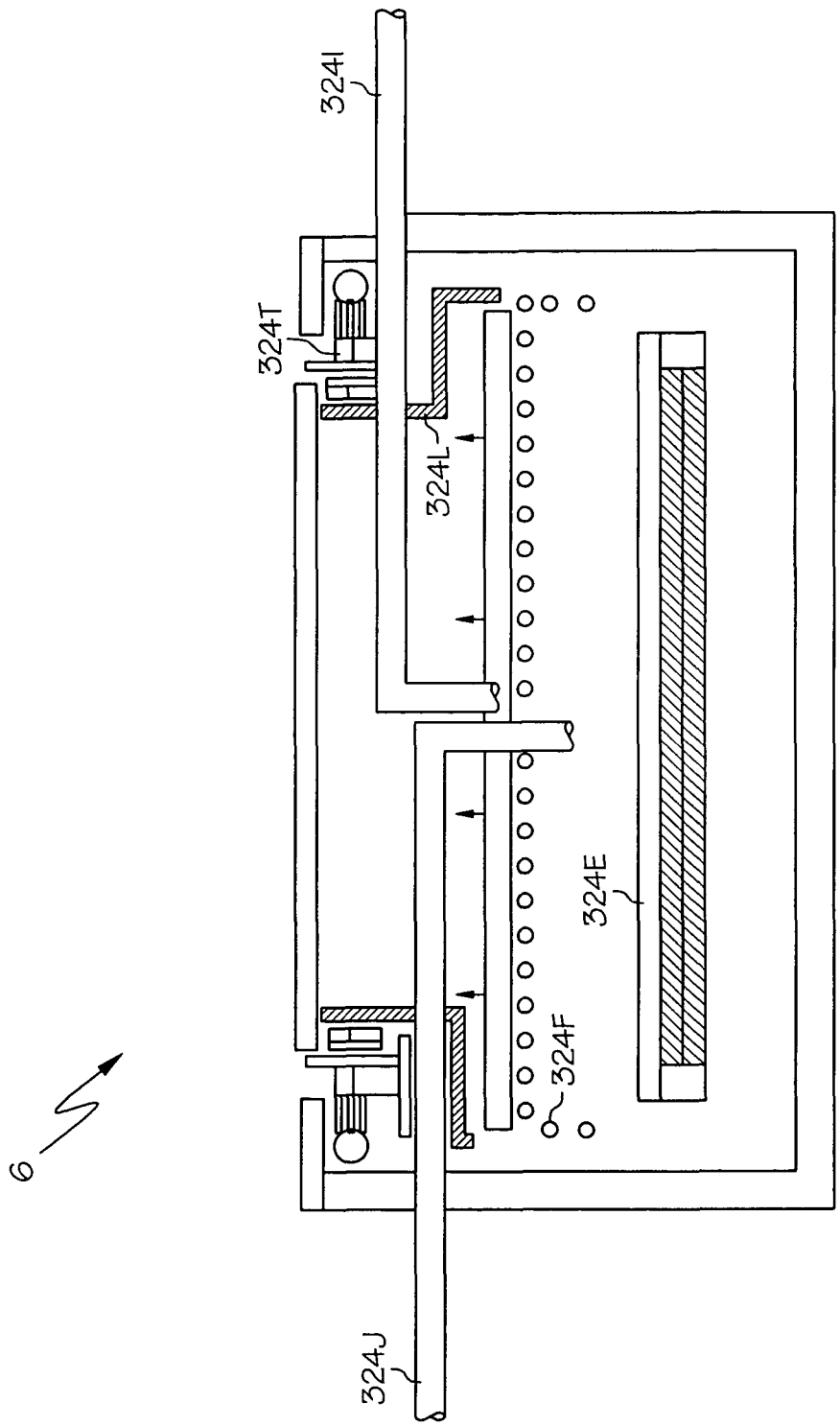
FIG. 10 is an elevation view of a portion of the sputtering station of FIG. 8 looking along the travel path of the substrate.

Referring next to FIGS. 8 through 10, details of the sputtering station 324 are shown. Referring with particularity to FIG. 8, access between sputtering station 324 and central hub region 313 is controlled by isolation valve 324A. Within sputtering station 324, the substrate (not presently shown) can be mounted on a pallet 324B that can shuttle back and forth between staging area 324C and remote area 324 D on a belt-driven or rail-based transport 324T. One example of such a transport system, which goes by the trade name of MagTran, is a magnetically coupled drive system sold by FEC Corporation of Japan. In such a configuration, traditional gears could be replaced by a non-contact magnetic coupling to provide the transfer or reorientation of rotational drive motion. This is beneficial in eliminating particle-generating contact between moving parts which may become coated with deposition materials. In a particular configuration, the transport may include shielding features to prevent deposition materials from contaminating transport surfaces. While such a transport approach is particularly appropriate for a linear tool, it can also be useful for an in-line tool section 330 of a hybrid tool 300. For example, two or more stations or processes can be combined within a single section.

Transport 324T can be used within individual sections in the cluster tool section 310 as well as across one or more portions of the in-line section 330. Referring with particularity to FIG. 8, automated gate valve 324D is used to control the process pressure for sputtering, while a turbomolecular pump (not shown) can be used to maintain a clean high vacuum.

Controller 324H (which in one embodiment, may be a microprocessor-based system) is used to regulate operations within sputtering station 324, including control of pallet shuttling, gas supplies (such as reactive supply 324I and inert supply 324J), main power 324G and feedback based on residual gas analysis 324K. The control of the vacuum level is also included in the functions assigned to the controller 324H. The deposition of an inorganic layer by reactive sputtering, particularly as it relates to substrate 6 heating or exposure of an environmentally sensitive device 90 (not presently shown), needs to be controlled to avoid damage to device 90. While prior efforts have used screens to reduce the impact of sputtering on a substrate, they do not disclose shielding an OLED from a sputtering plasma. For example, as previously mentioned, reactive sputtering is a preferred approach to the deposition of dielectric, transparent barriers; however, such barriers can damage OLEDs, sometimes despite the presence of a previously applied polymeric layer. While the mechanism for the damage is not clear, it is possible in situations involving an intervening polymeric layer that the damage occurs through implantation into and subsequent migration through the layer by a species.

Referring with particularity to FIG. 9 in conjunction with FIG. 8, as the substrate 6 shuttles back and forth, it passes adjacent two sputter cathodes (also known as sputter targets or target cathodes) 324E, one of which is covered with screen 324F to at least partially isolate the plasma from the substrate 6. Cathodes 324E include on an uppermost surface a layer of target material (for example, aluminum) that will be sputtered. The screen 324F also provides some measure of separation of the inert (preferably argon) and reactive (preferably oxygen) gases, which facilitates stable operation at a fixed oxygen flow. By way of example, the cathode 324E with the adjacent screen 324F might be used for only an initial layer (for example, approximately 400 Å) of oxide or related inorganic material. This layer can be used to protect the substrate from the remaining first layer deposition. The second cathode 324E is configured without a screen, thereby permitting higher sputter rates and much less maintenance than with a screened device. To control the process, a feedback system may be used to make rapid, precise adjustments to the oxygen flow to maintain a specific target bias voltage. This allows the sputter process to have stable operation with respect to changes in the environment.

The first sputter cathode 324E that is covered by screen 324F enables the deposition of an oxide film onto an OLED without damage. While blockage due to the screen 324F does result in slower deposition rate (i.e., low target utilization), and does involve the slow change in process parameters as the screen openings constrict with the deposition of sputtering materials onto the screen 324F, this approach is a simple way to control reactive sputtering. DC sputter power can be applied, and can involve a fixed process gas flow as seen by the controller 324H. Feedback, if required, can be done manually or through controller 324H. The second sputter cathode 324E that is not covered by screen 324F is appropriate to use after the OLED is encapsulated with a thin layer of oxide. In this case, the magnetron is optimized for deposition rate and target utilization. Advanced reactive sputter control, such as pulsed DC sputter power or active reactive gas control, may be required.

Placement of screen 324F relative to the target cathode 324E and substrate 6 for the deposition of inorganic barrier layers is shown looking across the travel path (FIG. 9) and lengthwise along the travel path (FIG. 10). As can be seen in the figures, the configuration employs the previously-discussed upward deposition to take advantage of upwardly-directed thermal evaporation or sputter phenomenon. The upward evaporation or sputter eliminates particulate debris falling onto the surface that is being coated. Both processes are controlled to favor maximum deposition onto a substrate surface, but because both are run in a vacuum, the deposition will extend to other interior surfaces. This deposition of material tends build over time to become a source of particulates that while easily disturbed, tend to move downwards away from the substrate surface due to the effect of gravity. Mixing a reactive gas (for example, oxygen from reactive supply 324I) with the inert sputtering gas (shown presently as argon from inert supply 324J) generally results in conversion of the target surface of cathode 324E to a compound composed of the cathode material and the reactive gas, a phenomena referred as poisoning.

Sputtering of such a reacted surface is referred to as poison mode sputtering, which is characterized by slower deposition rates that are preferably minimized or avoided. To reduce poison mode sputtering, the screen 324F can be introduced to beneficially reduce the concentration of reactive oxygen adjacent to the target cathode 324E. Oxygen required for oxide formation is introduced between the screen 324F and the substrate 6. By having the reaction between oxygen and the liberated material from cathode 324E take place nearer the receiving substrate 6 and away from the source cathode 324E (as shown by the upward arrows of oxygen coming from oxygen supply 324I in FIG. 10), oxide poisoning at cathode 324E is reduced. Of course (as mentioned above), the presence of the screen 324F in the sputtered flux acts as a blockage, causing a reduction in target material deposition rate. This blocking effect produced by screen 324F can be useful in decreasing plasma damage by blocking some of the UV component of the sputtering plasma. UV exposure is a known cause of degradation of organic (including monomeric and polymeric materials) and its reduction can contribute to plasma damage minimization. Periodic cleanup of screen 324F may be used to mitigate the buildup of material deposits on the screen that further reduce deposition rate.

The use of screen 324F is especially useful to formation of barrier assemblies on plastic and related organic-based films that can be substrates for OLED and other environmentally sensitive devices. This approach is also applicable to deposition of encapsulating assemblies on OLEDs. Also specific to OLED encapsulation, use of the screen 324F has been demonstrated to reduce the aforementioned plasma damage of a first deposited organic decoupling layer when such an "organic first" approach is adopted. The screen 324F is applicable to both discrete substrate and conventional roll substrate coating apparatus. Specific to encapsulation, the screen 324F provides one of two approaches to reduction in plasma damage of the OLED when a barrier layer is the first deposited layer of a multilayer coating. The other approach to avoid plasma damage involves the deposition of an inorganic protective layer prior to sputtering, as previously discussed.

The use of $Al_2O_3$ is well-suited to sputtering onto a substrate. Of course, since $Al_2O_3$ is an electrical insulator, it is not viable for non-RF magnetron sputtering, while RF sputtering has drawbacks, including slow deposition rates, complex implementation, and excessive substrate heating relative to other methods. The previously-discussed reactive sputtering is used as a way to achieve a thoroughly oxidized film on the substrate (leading to clear, stable, fully reacted film). The use of a screened cathode as discussed above with an inert sputter gas (such as argon) injected close to the sputter target and a reactive gas (such as oxygen) injected close to the substrate with a screen barrier between the two gas injection points helps to minimize the deleterious effects of reactive gas coming in contact with the sputter target. Target material that gets deposited on the target side of the screen acts as a getter pump to remove reactive gas that finds its way through the screen. This is beneficial in that it has the effect of leaving an oxygen rich environment near the substrate, and an argon rich environment near the sputter target. Thus, it is possible to create a clear coating on a substrate without poisoning the target in the same environment.

While the separate screen 324F placed over one of the cathodes 324E allows for manufacturing process flexibility, it will be appreciated by those skilled in the art that the system need not include the screen 324F. Various considerations, such as those discussed above, may effect the precise configuration, including what type of material is being deposited, as well as potential for damage to the substrate and quality of the deposited layer.

The In-Line Tool Section

Figure 7:
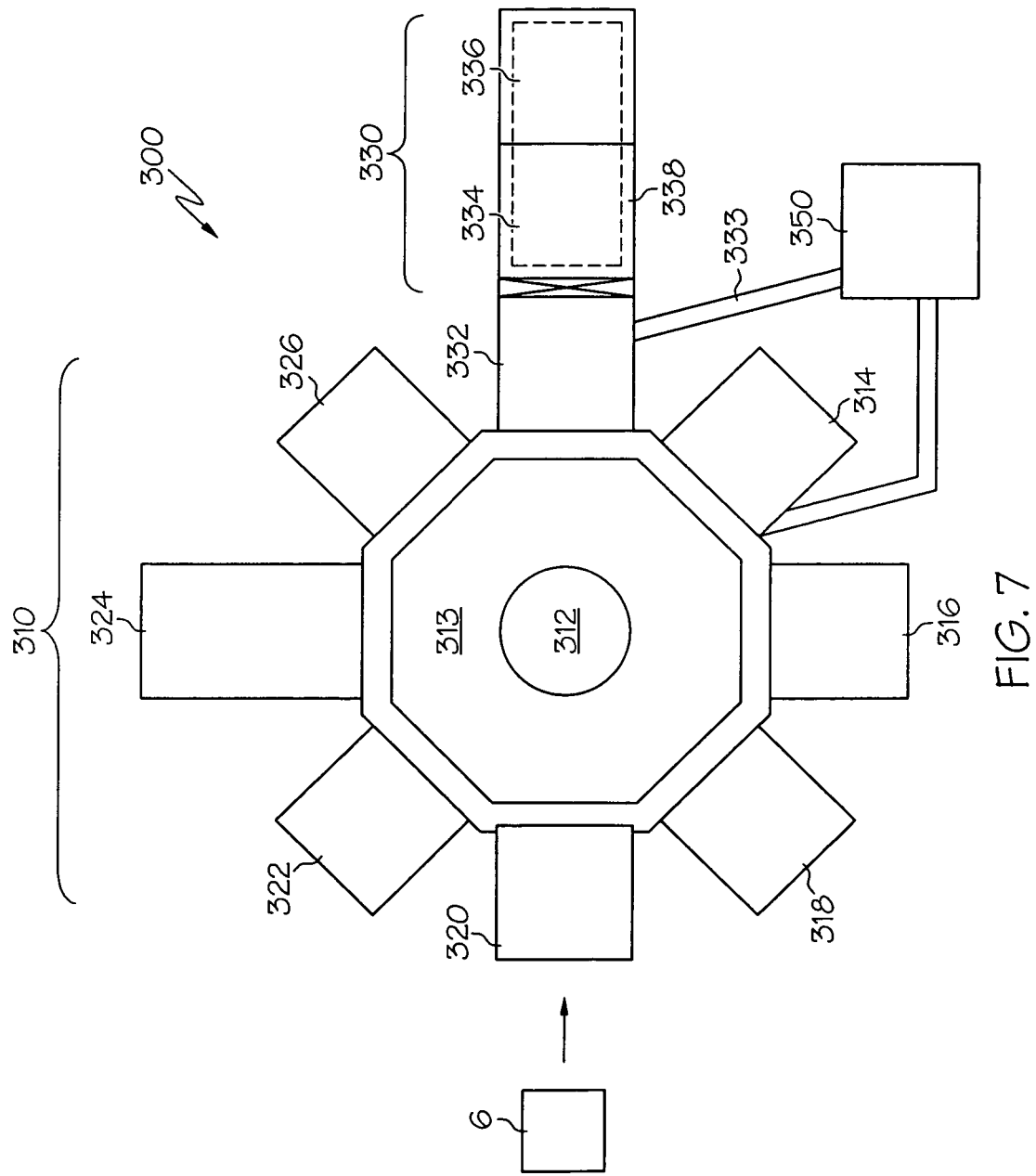
FIG. 7 is a block diagram of an arrangement of an alternate embodiment of a tool including cluster and in-line features.
Figure 11:
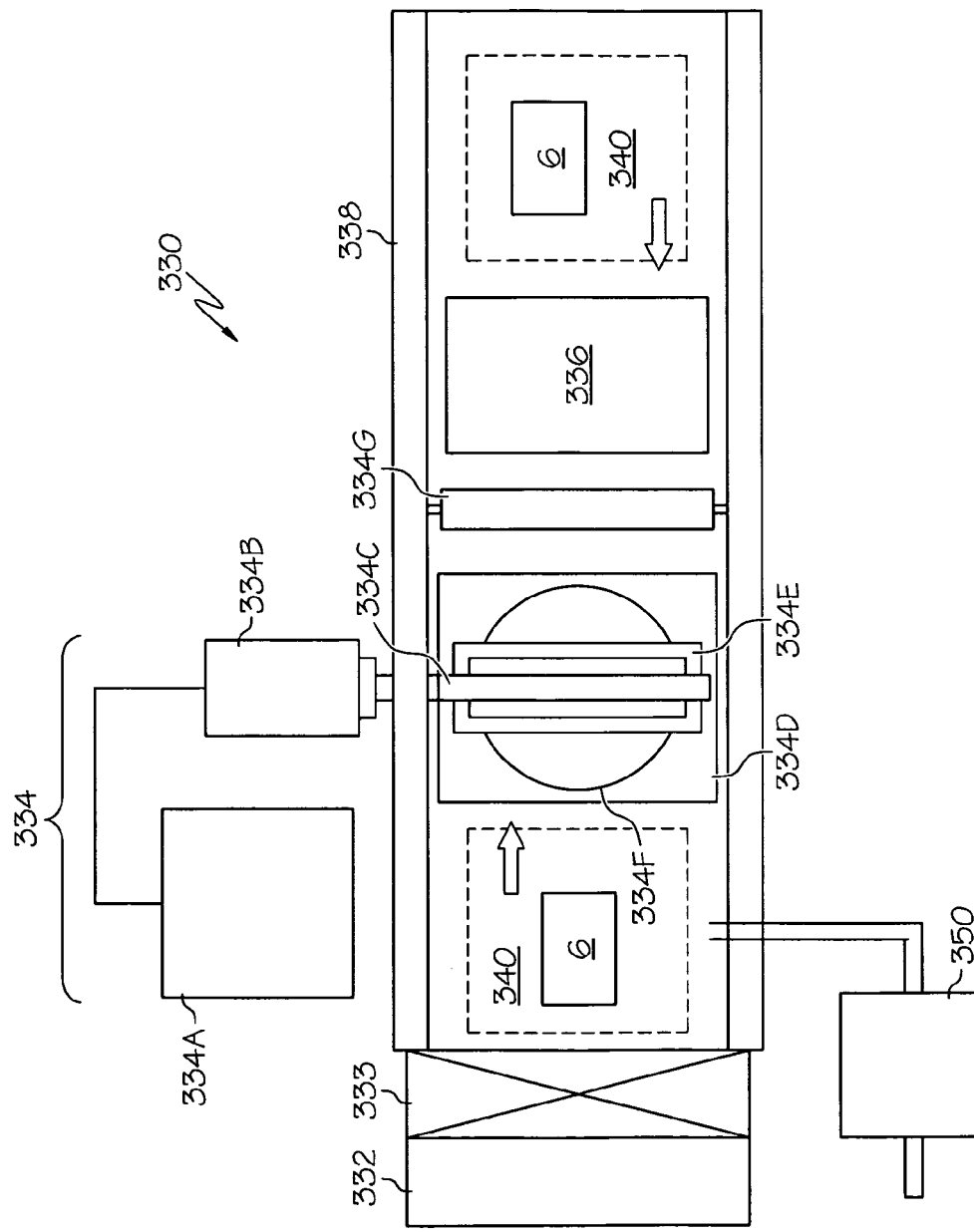
FIG. 11 is a simplified representation of the in-line section of the tool of FIG. 7.

Referring next to FIG. 11 in conjunction with FIG. 7, details of the in-line tool section 330 of the hybrid tool 300 are shown. In-line tool section 330 includes an organic material deposition station 334, an organic material curing station 336 and a substrate transport 338 capable of conveying substrate 6 between at least the organic material deposition station 334 and organic material curing station 336. In addition, an isolation valve (such as a gate valve) 333 is used to isolate organic material deposition station 334 from monomer mask alignment chamber 332 that acts as a substrate heating and cooling station. As previously discussed, a distributed approach based on cooling various surfaces adjacent to or part of the monomer deposition station could be used. For example, surfaces within mask alignment chamber 332 can be employed, but these will be complimented by use of additional temperature controlled surfaces within organic material deposition station 334 and organic material curing chamber 336.

The monomer mask alignment chamber 332 can further function in a manner similar to that of previously-discussed masking station 60, where magnetic masks are placed to control where monomer deposition occurs on the substrate 6. This could also be made to cooperate with chamber cleaning functions. While cleaning is especially appropriate in organic material deposition station 334 (where the greatest level of unwanted deposition of organic material will occur), there could also exist situations where masking at the close of a deposition step is necessary.

As with the cluster tool section 310, a vacuum source 350 can be used to control the internal pressure of the organic material deposition station 334. While vacuum source 350 is shown as a single unit configured to supply vacuum to both the cluster tool section 310 and in-line tool section 330, it will be appreciated by those skilled in the art that the present system can also be configured to have separate, autonomous vacuum sources for each tool section. Examples of pumps used as separate vacuum sources are discussed in more detail below. Additional provisions may be present in mask alignment chamber 332, including a heating and cooling plate (not shown).

The organic material deposition station 334 is made up of an organic material supply 334A, evaporator 334B, deposition nozzle 334C, confinement 334D, thermal barrier 334E, pumping port 334F and shutter 334G. The pumping port 334F is used to create the vacuum in the organic material deposition station 334, and can be vacuum connected to vacuum source 350 or to a dedicated pumping assembly. The addition of monomer confinement 334D helps reduce contamination. In essence, confinement 334D uses a "chamber within a chamber" approach that allows introduction of the monomer into a sub-section of the organic material deposition chamber 334. The intent is to have the higher monomer vapor concentrations within the smaller region adjacent the substrate be coated. The openings that allow the substrate to move into the smaller interior chamber can be adjacent cold traps to minimize organic vapors escaping through these openings and into the remainder of chamber 334. FIGS. 16A through 16F (discussed below) embody this "chamber within a chamber" approach. As with the sputtering station 324 discussed in conjunction with the cluster tool section 310 above, the substrate 6 can be mounted on a pallet 340 that can shuttle back and forth between opposing ends of the organic material deposition station 334 on a transport 338.

The rate of organic layer 9A condensation is a function of gaseous monomer partial pressure and surface temperature, where high partial pressure and low temperature promote condensation. One parameter variation that has a dramatic impact on organic layer deposition quality is substrate temperature. Regarding temperature, the gaseous monomer tends to condense on most surfaces, especially those with surface temperatures less than approximately 160° Celsius. While process parameters may be adjusted to meliorate monomer build-up on components such as a quartz window of the organic material curing station 336, such adjustment is undesirable, especially in situations where real time feedback is not available. Examples of such adjustments include changing the transit speed of the substrate and changing the intensity of the source. Unfortunately, attenuation of infrared (IR) radiation from the source is not equal, so any such process adjustments may increase the substrate temperature, leading to a reduction in the monomer deposition rate unless methods are included to the control substrate temperature. Instead of making process adjustments, a shutter 334G is disposed between the organic material deposition station 334 and the organic material curing station 336 to act as a contamination barrier between the two. By isolating stray organic material from the organic material curing station 336 at all times except for initial evacuation of organic material deposition station 334 and during transport of the pallet 340 and substrate 6, it minimizes the chance of organic material settling on the quartz window of the organic material curing station 336 and interfering with the amount of UV curing energy emanating therefrom.

Figure 17A:
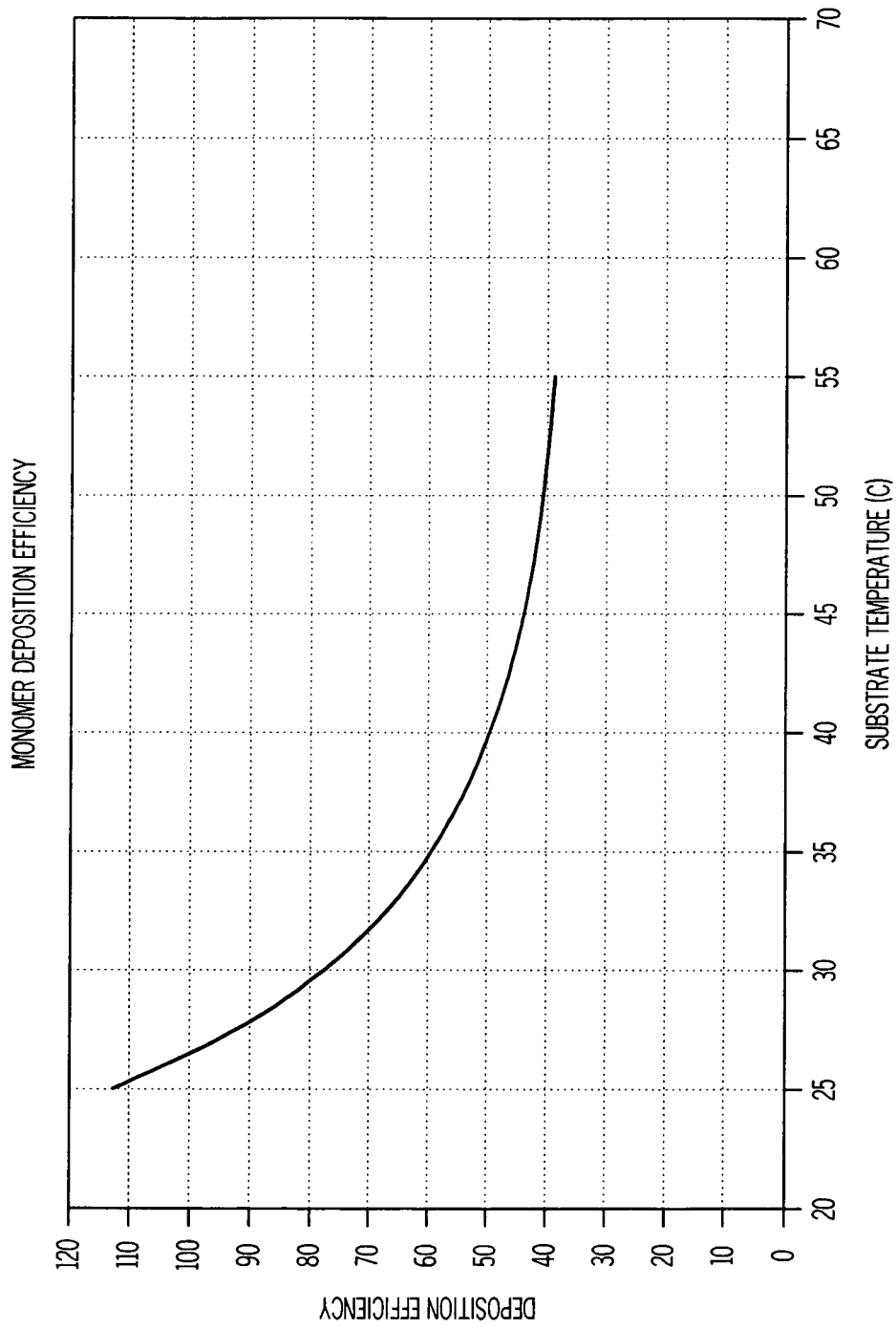
FIG. 17A shows a graph depicting organic material deposition efficiency versus substrate temperature.
Figure 17B:
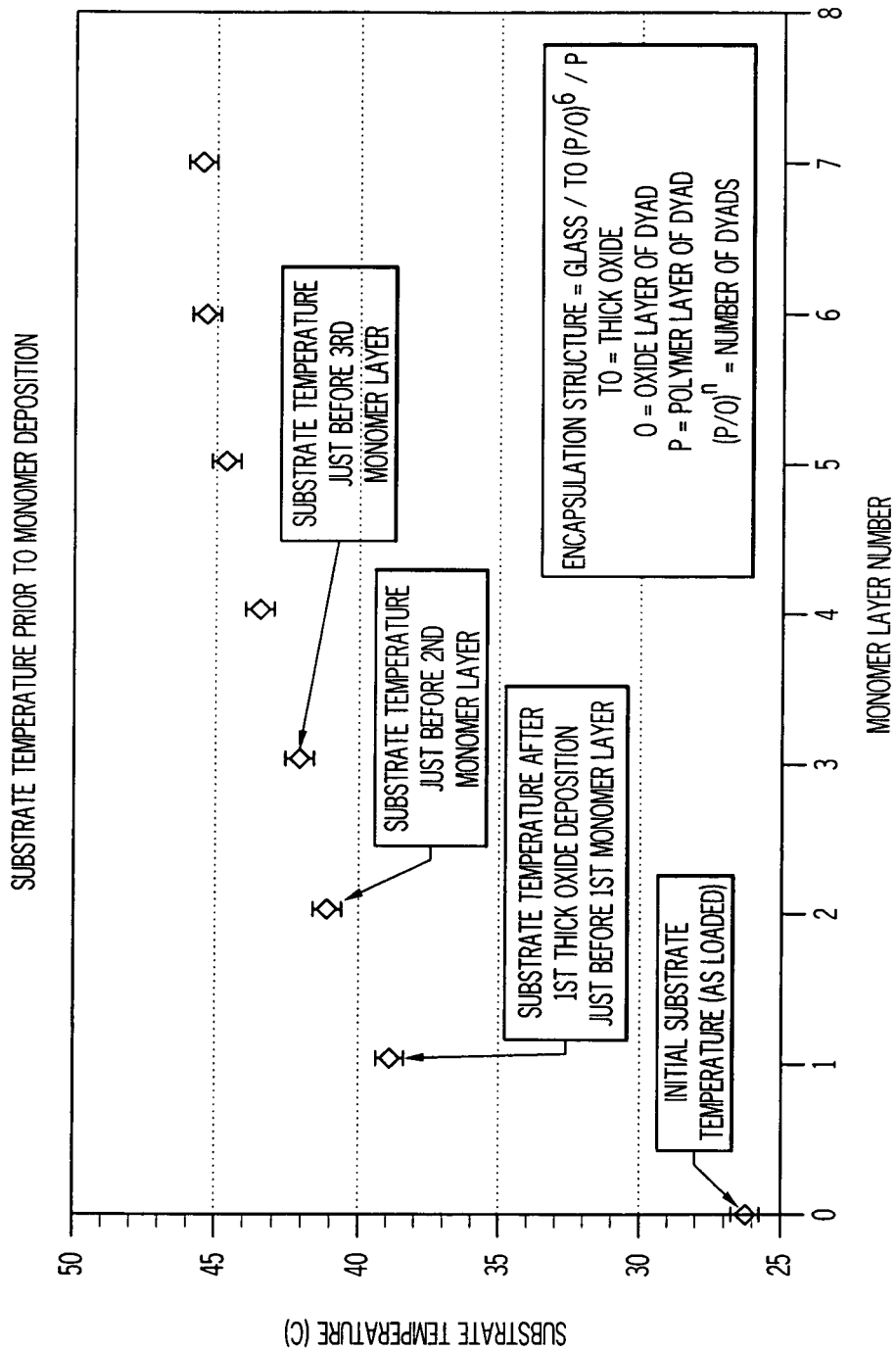
FIG. 17B shows a graph depicting the elevation in substrate temperature as a multilayer coating is being built up thereon.

Referring next to FIGS. 17A and 17B, the effect of varying substrate temperature on organic layer deposition quality is shown. While it is desirable to obtain the highest deposition efficiency, the strong dependence of deposition efficiency upon substrate temperature (especially at the lower end of the temperature scale) makes it difficult to maintain the polymer thickness within an acceptable range during the course of encapsulation. The promotion of uniform, repeatable deposition thickness is important in encapsulation work, where the polymer thickness is typically between approximately 4,000 Å and 6,000 Å. While an active substrate temperature control system is one way to promote uniform layer thickness, it is not the only way. The present inventors have been able to control the deposition to achieve substantially uniform thickness layers, resulting in successfully encapsulating OLEDs without requiring an active substrate temperature control system. Thus, while such an addition to an encapsulation tool is beneficial, it is not a necessity.

Measurements of substrate temperature and evaporator pressure are valuable indicators to (in a manual operating mode) an operator or a controller (in an automated operating mode) to control the deposition process. As previously mentioned, temperature (especially substrate temperature) provides valuable information as to deposition efficacy. In one form, the substrate temperature is measured prior to the start of movement of the substrate and pallet on the transport system. The evaporator pressure is measured directly in the evaporator but does not provide an absolute measure of the flux impinging on the substrate. The precise values of both of these parameters, temperature and flux, during the deposition process will depend on the details of the particular tool. However, data collected by the inventors has indicated that the sensitivity of measured temperatures, pressures and film thicknesses to these details is not great. Referring with particularity to FIG. 17A, an approximation of the deposition efficiency as a function of measured substrate 6 temperature between 25° Celsius to 65° Celsius prior to the start of the deposition is shown, where the deposition efficiency is defined by the layer thickness times the substrate/pallet speed divided by the monomer flow rate. The deposition efficiency appears to decrease with increasing temperature, although not as fast above about 50° Celsius as at lower temperatures.

During an encapsulation process, the substrate is exposed to thermal loads from both the monomer curing and oxide deposition. For example, if the monomer deposition starts at a substrate 6 temperature of 25° Celsius and reaches 35° Celsius to 40° Celsius for the last layers, the monomer layer thickness at these higher temperatures will have decreased to 50% of the initial layer, based on the chart shown in FIG. 17A. A control method that would increase the flow for each layer to compensate for the temperature would be difficult to implement for OLEDs. For substrates 6 that are at or near temperatures near ambient (roughly between 25° Celsius and 35° Celsius), the chart evidences a strong temperature dependence such that non-uniformities in the substrate 6 temperature may result in significant monomer thickness variations.

To avoid these two problems, the inventors have made use of the inherent process heating of the substrate 6 during the initial deposition of inorganic layer 9B (which may be a thick oxide). An example of the substrate 6 temperature measured just prior to the start of each organic layer 9A deposition is shown in FIG. 17B, where the results of a multilayer coating with seven organic layers 9A are plotted. From an initial substrate temperature of approximately 26° Celsius, the thick oxide deposition results in a substrate temperature of almost 40° Celsius just prior to application of the first organic layer 9A. As a result, the thickness of the seventh organic layer 9A is only about 15% less than that of the first organic layer 9A. To compensate for the increased substrate 6 temperature, an increase in monomer flow is applied. Of course, there is a trade-off between operating the substrate 6 at lower temperatures, where the process is highly efficient but difficult to control, and operating at higher temperatures that produce lower efficiencies with ease of control and concomitant reproducibility. The temperature control features of the in-line tool section 330 are well-suited to operating in either temperature regime.

When considering a general purpose tool (including such tools used for research and development of a process), it is valuable to have the capability to maintain the required process control of the organic layer 9A thickness for a more general encapsulation process. As discussed above, without substrate temperature control, the substrate 6 temperature would remain close to ambient at the start of the process, leading to uncertainty in the initial organic layer 9A thickness and a significant reduction in organic layer 9A thickness as the encapsulation process proceeds. The present inventors have found that there are several possible approaches to maintaining control of the monomer process for an arbitrary encapsulation layer structure. By way of non-limiting examples, it is possible to implement some form of active control of the substrate temperature prior to each organic layer 9A deposition. Another approach would be to measure the substrate temperature for each layer and adjust the monomer flow rate accordingly. Furthermore, it is also possible to establish a repeatable starting substrate temperature and accommodate the temperature change.

Ideally, a first approach would allow for a consistent organic layer 9A thickness. Increased deposition efficiency would be attained if a controlled lower substrate 6 temperature could be maintained. In addition, this method would also provide the greatest capability to accommodate different monomer and encapsulation processes. Use of an active control would entail additional control, while additional processing time may be required for temperature control and accounting for variations in emissivity across the substrate or OLED surface may be necessary.

A second approach requires a repeatable capability to measure the substrate 6 temperature. Non-contact measurement of the substrate 6 during the process poses the challenge of the changing emissivity of the substrate 6 during the encapsulation process. The relationship between substrate 6 temperature and deposition efficiency would need to be well characterized and stored as part of the control system program.

A third technique requires a temperature stabilization station that would bring the substrate to a specific moderate temperature. Chosen properly, this temperature involve an optimized trade-off between deposition efficiency and temperature sensitivity. The temperature stabilization station would function much as the thick oxide in adjusting the substrate temperature to a region of reduced sensitivity. A stocker type chamber would allow for longer stabilization times without increasing encapsulation process time. For the current monomer blend, the stabilization temperature would be in the range of about 35° to 40° Celsius. Other monomer blends may require a different stabilization temperature. This would be determined by characterizing the deposition efficiency sensitivity to substrate temperature. A temperature control system using a circulating fluid and a heater/chiller would provide the fastest and most precise control of the range of temperatures of interest. Such an approach may be easily applied to the masks used during the encapsulation process. A reduction in the difference in mask and substrate temperature would reduce the contribution of differential thermal expansion to the masking tolerance. It will be appreciated by those skilled in the art that the above approaches are mentioned as exemplary, and that other approaches could be used to meet monomer process control requirements.

Another method of regulating temperature in one or both of the organic material deposition station 334 and the organic material curing station 336 is to route heating or cooling fluid through the walls of the process chambers. For example, jacketed chambers and a means to circulate a temperature controlled (i.e., heated or chilled) fluid could be employed.

Referring next to FIGS. 16A through 16F, an alternate embodiment of the organic material deposition station 334 portion of the in-line tool section 330 of the hybrid tool 300 is shown. The figures show the various stages of a substrate 6 (preferably with a mask (not shown) connected thereto) passing through the station 334 for application of one or more layers of organic material. In the present configuration, monomer flows only when needed, such as when the substrate 6 (shown on the underside of pallet 340) is adjacent an aperture 335C during transit of the substrate 6, as shown with particularity in FIGS. 16C to 16D. The organic material deposition station 334 includes a containment vessel to confine at least some of the components used to deposit an organic layer onto substrate 6. The containment vessel is made up of an isolatable interior chamber 335 that is further divided into at least a first region 335A (alternately referred to as a monomer confinement sub-chamber) used to surround monomer deposition nozzle 334C, while a second region 335B defines the substantial remainder of the isolatable interior chamber 335. Preferably, the spacing (tolerance) is small between the substrate 6 (or, if present, the device 90) on the pallet 340 and a plane defined by the portion of first region 335A that contains the aperture 335C and cold traps 334I. Such a close fit minimizes the amount of fugitive material that would otherwise contaminate the inside of organic material deposition station 334. Pallet 340 has extended leading and trailing dimensions to reduce conductance when shutter 334G opens.

In one form, the thermal barrier 334E shields the substrate 6 from heat radiated by the relatively hot monomer deposition nozzle 334C, thereby reducing the heat input into the substrate. In addition, thermal barrier 334E shields surfaces of the second region 335B of interior chamber 335. A particular embodiment of the thermal barrier 334E can be in the form of a water cooled jacket that surrounds the monomer deposition nozzle 334C everywhere save the aperture in the nozzle, thereby reducing the spread of heat to second region 335B of interior chamber 335.

As previously discussed, the deposition rate of monomer onto the substrate 6 is strongly dependent upon the latter's temperature. To maintain a predictable deposition rate, all of the substrates should have as close to the same thermal history as each other. In addition, it is preferable that that exposure of the substrates 6 be relatively benign (in other words, that the temperatures they are exposed to be not far above ambient temperatures). To this end, it may be beneficial to keep line of sight radiant heating of the substrate 6 to a minimum by thermally insulating it from the elevated temperature produced in the first region 335A during monomer deposition. One approach may involve cooling the exterior of the first region 335A.

Figure 16A:
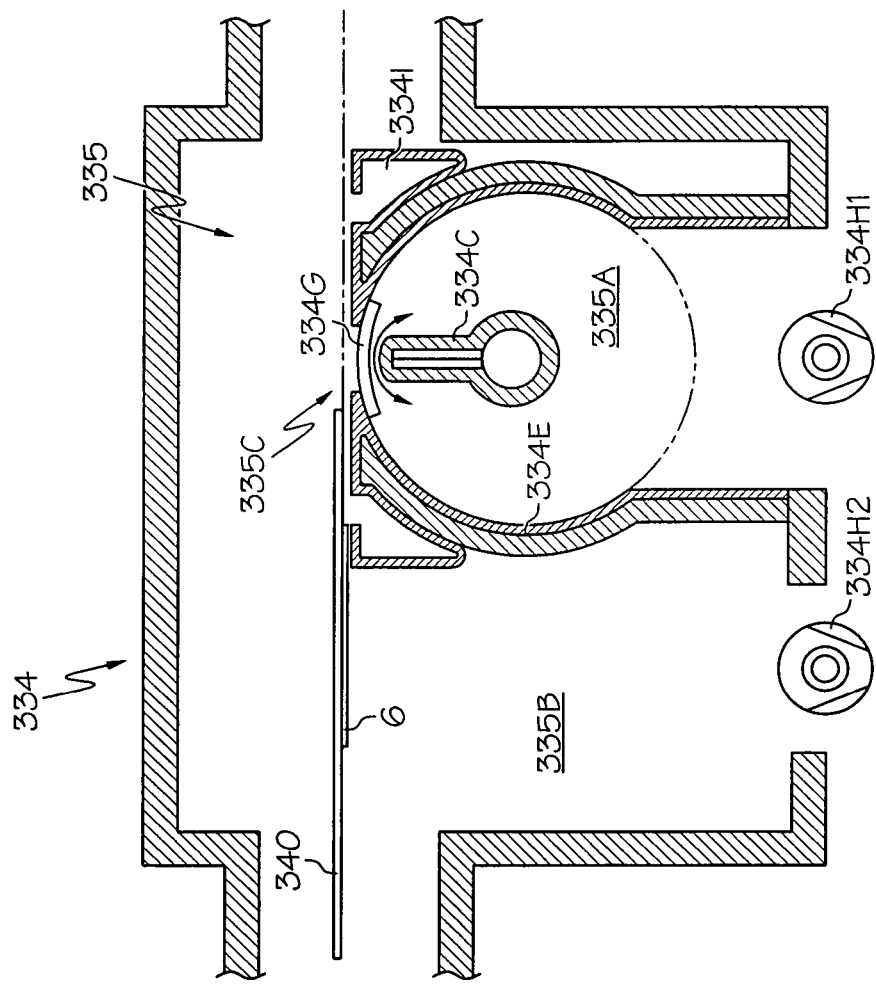
FIG. 16A through FIG. 16F show the various stages of a substrate-carrying pallet passing through the organic layer deposition station shown in FIG. 11.
Figure 16B:
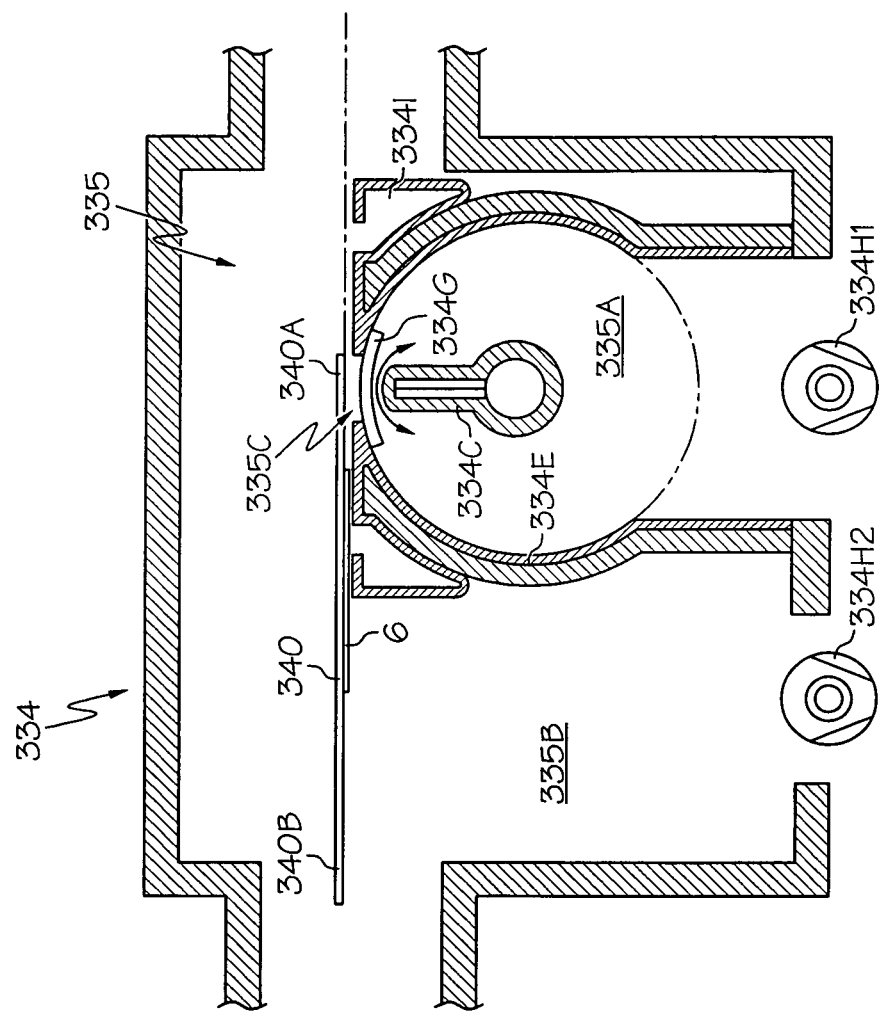
Figure 16C:
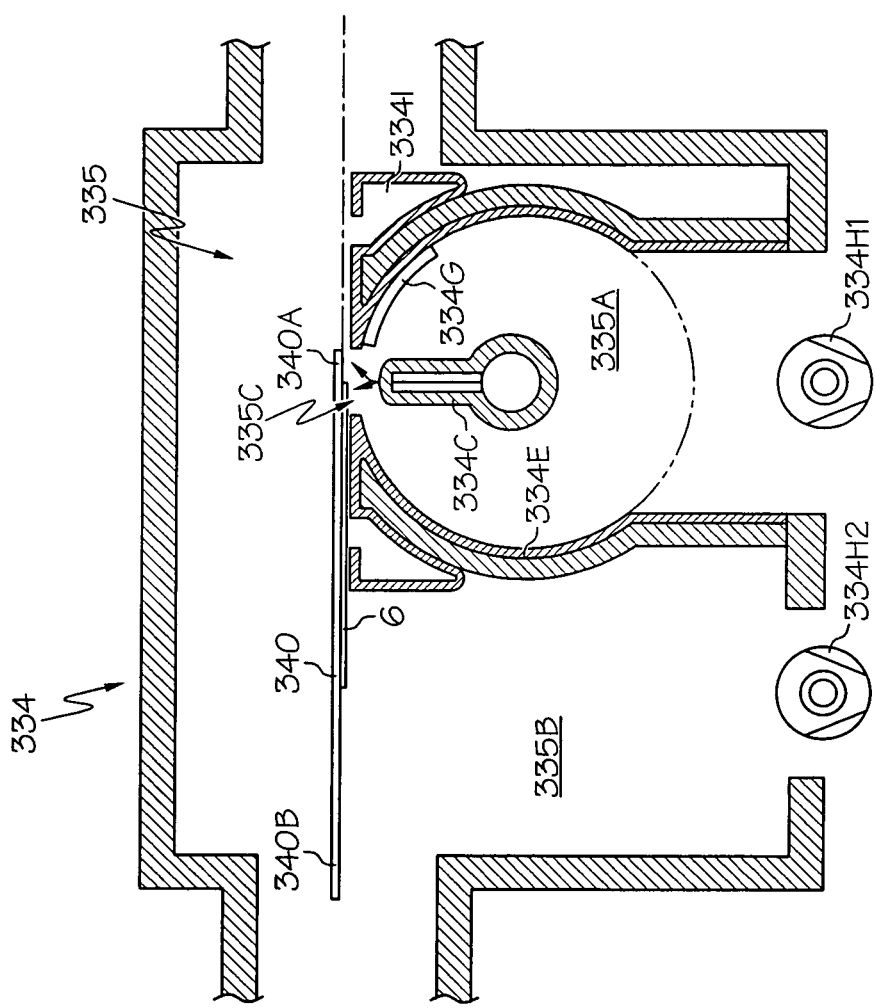
Figure 16D:
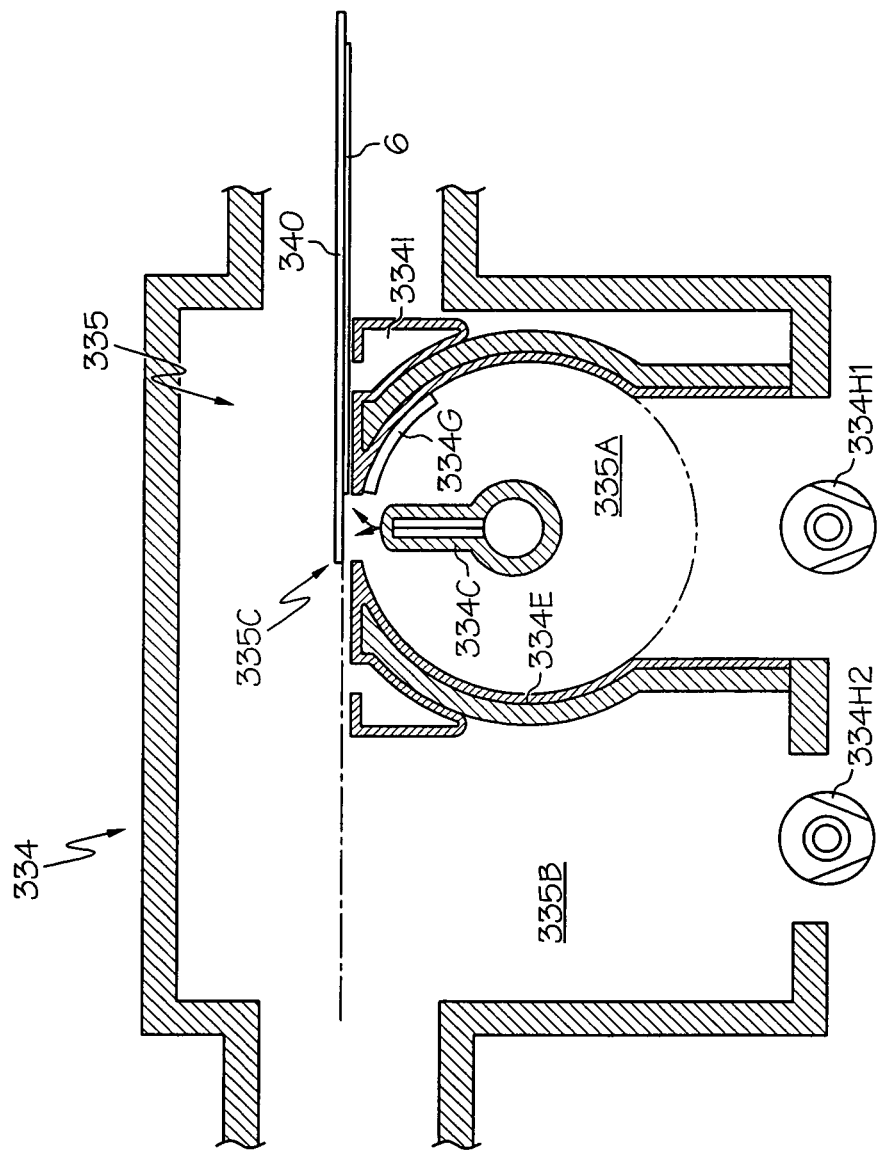
Figure 16E:
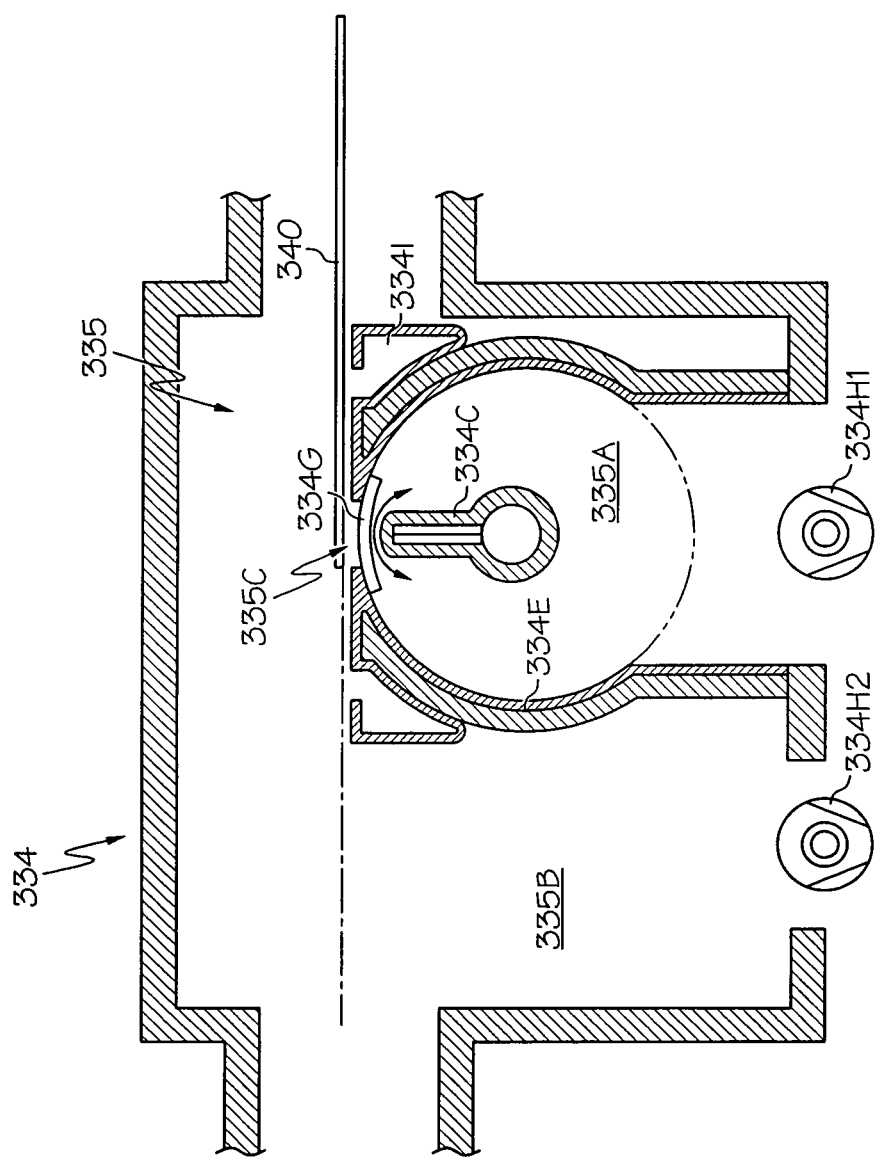
Figure 16F:
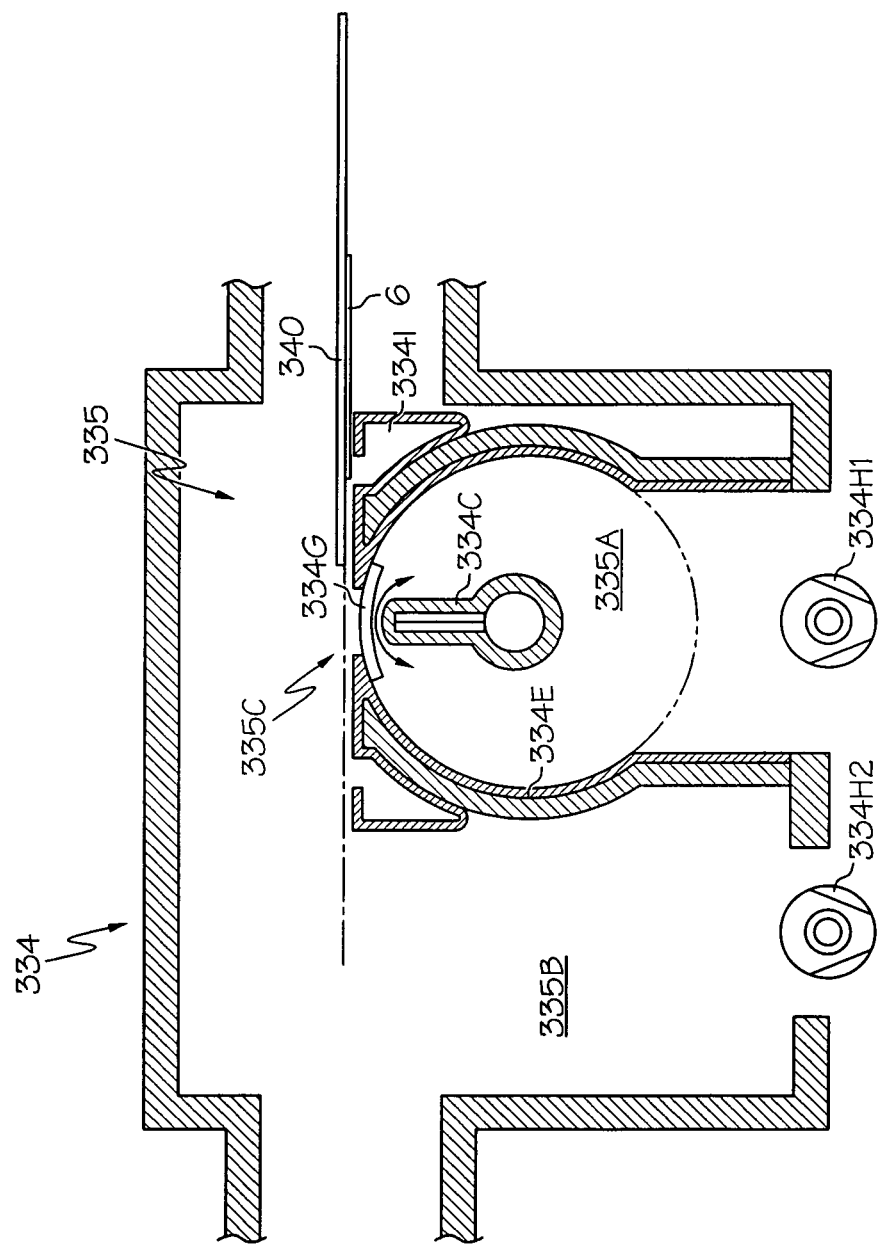

Whenever the flow rate of monomer introduced into the evaporator 334B (shown in FIG. 11) is changed, there is a period of time (typically on the order of ten seconds) required for the source to stabilize. No deposition to the substrate 6 should be made during this period. Shutter 334G isolates the first region 335A from the main chamber when a substrate is not present (such as shown in FIG. 16A). In such capacity, it keeps monomer from being deposited onto the substrate 6 during that period, during which it can divert monomer flow coming out of the monomer deposition nozzle 334C into a first region pump 334H1. It will be appreciated by those skilled in the art that the pumps 334H1 and 334H2 shown in FIGS. 16A through 16F may be used in conjunction with or in replacement of vacuum source 350 shown in FIGS. 7 and 11. First region pump 334H1 is used to keep monomer contamination of the first region 335A of interior chamber 335 low. In addition, first region pump 334H1 may be utilized to quickly achieve or maintain the vacuum quality in the isolatable interior chamber 335. In one form, the first region pump 334H1 may be a monomer-tolerant high vacuum pump (such as a heated turbo pump or dry mechanical pump) that is used to remove excess monomer gas from the first region 335A. Any gas exhausted from the first region pump 334H1 can be sent to a scrubber for additional clean-up before being released.

During periods of monomer flow, portions of the monomer passing through monomer deposition nozzle 334C may condense on the inside wall of the first region 335A, as well as on shutter 334G. This condensation on the backside of the shutter 334G can re-evaporate into the first region 335A when the shutter 334G is closed. In addition, accumulation of monomer upon the shutter 334G may interfere with its actuation. By heating the shutter 334G, accumulation due to such condensation can be minimized. This provides effective isolation of the first region 335A by minimizing conductance without liberating particles, where adjacent component rubbing presents such a risk. Thus, when the shutter 334G is closed, a low conductance gap is preferred over a tight closure. As with the shutter 334G, the interior walls of first region 335A can be heated to minimize condensation and subsequent accumulation of monomer. This prevents the possibility of monomer condensation forming a drip which could run into and damage the first region pump 334H1.

A cold trap 334I can be used to capture excess monomer that does escape from the first region 335A to the second region 335B. The efficiency of the cold trap 334I depends on the temperature and area of the cold trapping surfaces. In a preferred orientation, the cold trap 334I is offset from the perimeter of the shutter opening. In a more particular embodiment, there may be two traps, one on each side of and of similar length to the long edge of the shutter opening. Although cryogenic temperatures are the most efficient for cold trap 334I, mere sub-freezing temperatures (made possible, for example, with a chiller with a glycol-based heat transfer fluid) are probably sufficient, and more economical and safer to implement. To enhance serviceability, a removable trap with a snap-on cap can be used. This is also conducive to safe handling of the captured monomer.

Shutter 334G can provide additional protection of the aforementioned quartz window of the organic material curing station 336, thereby minimizing conductance between the monomer source and the window during monomer deposition. To be most effective, the shutter 334G would be located a sufficient distance from the monomer source 334A (shown in FIG. 11) as to permit complete transit of the substrate 6 over the source without interference.

Various forms of monomer confinement 334D may be used, either on its own or in conjunction with shutter 334G or other components. For example, referring again to FIGS. 7 and 11, if transport mechanism 338 is present, its various components that are in the path of the monomer flow motion will likely shed deposited monomer flakes and particles upon rubbing, vibration or related movement. This in turn can create film defects on the substrate 6. Unfortunately, periodic cleaning of transport mechanism 338 components is time intensive, and requires additional operational down time. Moreover, the monomer may be hazardous, necessitating additional maintenance technician protection and associated cost.

While it may not be practical to achieve complete monomer confinement in the tool 300, with the approach of the present invention, it is possible to reduce the amount of stray monomer to increase the mean time between service. For example, use of the separate first and second regions 335A, 335B in conjunction with the monomer confinement 334D and shutter 334G can promote up to approximately a ninety percent capture of excess monomer. In addition, the cold trap 334I can capture approximately three-fourths of the balance, with about half of that until the pallet 340 entirely covers the trap 334I. The shutter 334G is also well-suited to keeping monomer away from the window of the organic material curing station 336.

Referring again to FIG. 11, a cleaning system (not shown) may be included for the in-line tool section 330. Such a cleaning system can also be used to provide cleaning to the sputtering station 324 of the cluster toll section 310. Moreover, this cleaning system is configured to be performed in-situ, such that it can be done without having to break the vacuum present in the in-line tool section 330, thereby enabling similar or better levels of cleaning and removal of organic residues. The cleaning system utilizes a reactive plasma generated by exposure of a precursor gas to a discharge source. In one form, the cleaning system may include a glow discharge source (either local or remote) to generate reactive species that are in turn used to chemically remove residual organic deposits. Regardless of source electrode configuration, a plasma source operates at lower power to avoid unwanted sputtering from surfaces of the source electrodes.

As with the inorganic sputtering, radio frequency, related microwave activation or other means can be employed to generate the plasma. The precursor components (typically in gaseous form) are fed into a plasma enclosure (not shown) for the plasma source, while the reactive species are delivered into the organic material deposition station 334 through a suitable coupling port (not shown). One or more precursor gases may be used, including $O_2$, $O_3$, $H_2$, $N_2$, $NF_3$, $CF_4$, $C_2F_6$, and $C_3F_8$, to generate suitable levels of reactive species with long life times to feed to the internal surfaces of interest within the organic material deposition station 334. A substrate transport can be used to raise and lower substrate 6, thereby selectively placing it in the path of plasma source. Precursor gases and process settings are preferably chosen to create volatile byproducts that can then be easily removed via vacuum or related pumping source. Formation of particulate byproducts are preferably avoided because they can settle on surfaces and ultimately cause coating defects. The reactive plasma cleaning approach can be an effective way to minimize organic layer buildup on components within the in-line tool section 330. A cooling device (for example, a water-cooled jacket) can be included to keep chambers (or portions of chambers) within the in-line tool section 330 cooled.

It is desirable to either: locate a glow discharge source within a chamber containing the organic material deposition station 334 and configure a delivery means to supply the working (precursor) gas; or locate the glow discharge source in a secondary chamber connected (and under vacuum) to a chamber containing the organic material deposition station 334. In either case, considerations of internal space, serviceability or the like may dictate which configuration is preferable. For example, the basic need to address the organic deposition station may include considerations of adjacent UV curing station cleaning. The sputtering chamber can be self cleaning, where appropriate control settings can be used to produce a low power (glow discharge) plasma suitable for cleaning avoiding unwanted and potentially undesirable sputtering during a cleaning process.

In another form, auxiliary component electrodes can be placed in permanently fixed or movable satellite positions within the organic material deposition station 334 in order to strike and generate a cluster of localized reactive plasma cleaning processes in strategic positions of interest. As discussed in the previous paragraph, one or more precursor gases may be used to remove the organic residues. In either case, due to the temperature-dependant nature of the chemical reactive removal processes, the rate of reaction and removal of the organic deposits can be further enhanced by elevating the temperature of the surface of interest to be cleaned. Such temperature elevation may be achieved through external and/or internal sources of resistive and/or irradiative heating.

In one form of operation, use of an appropriately high-rate cleaning process at room temperature may be employed to clean and remove the deposited organic material residues immediately after every each multilayer deposition run. This has the advantage of maintaining similarity of the related starting background and conditions for every deposition run. Where separate chambers for organic and inorganic deposition are utilized, there will be the opportunity to clean the residues following every single organic layer 9A deposition. The process, of course, may be carried out more infrequently, depending on the compromises involved with regards to the economics of deposition tool uptime and utilization versus condition of the process chamber, drift and contamination.

While certain representative embodiments and details have been shown for purposes of illustrating the invention, it will be apparent to those skilled in the art that various changes may be made without departing from the scope of the invention, which is defined in the appended claims.

What is claimed is:

1. A device for depositing a stacked multilayer coating comprising a plurality of organic layers and a plurality of inorganic layers onto to an organic light-emitting diode that is placed onto a discrete, flexible substrate, said device comprising:
   an inorganic layer deposition station defining a cluster configuration; and
   a thermally-controlled organic layer deposition station defining an in-line configuration operatively coupled to said inorganic layer deposition station, said organic layer deposition station comprising:
   an organic material supply;
   an organic material evaporator;
   an organic material deposition nozzle;
   an organic material curing station; and
   an organic material confinement mechanism comprising a reduced-pressure source placed in vacuum communication with at least said substrate such that during at least a portion of deposition of said organic layer onto said substrate, said organic material confinement mechanism operates to substantially prevent stray organic material that is about said substrate from reaching said organic material curing station, wherein said inorganic layer deposition station and said organic layer deposition station cooperate with one another to deposit said plurality of organic layers and said plurality of inorganic layers in an alternating pattern to encapsulate said organic light-emitting diode that is situated on said substrate.

2. The device of claim 1, wherein said thermal control of said organic layer deposition station comprises a cooling device for reducing the temperature of said substrate during deposition of at least one of said plurality of organic layers and said plurality of inorganic layers thereon.

3. The device of claim 2, wherein said organic layer deposition station further comprises a substrate-transport configured to convey said substrate between at least said organic material deposition nozzle and said organic layer curing station.

4. The device of claim 3, wherein said organic layer deposition station defines an isolatable interior chamber.

5. The device of claim 4, wherein said isolatable interior chamber defines a first region comprising said organic material confinement mechanism, and a second region selectively isolatable from said first region through a moveable shutter.

6. The device of claim 5, wherein said cooling device is in thermal communication with said second region, said cooling device configured to reduce the effect of a thermal load generated in said first region on said second region.

7. The device of claim 6, wherein said cooling device further comprises at least one cold trap disposed in thermal communication with said isolatable interior chamber.

8. The device of claim 5, further comprising at least one pump fluidly coupled to at least one of said first and second regions, said at least one pump configured to provide a localized vacuum in at least one of said first or second region of said organic material confinement mechanism.

9. The device of claim 8, wherein said at least one pump comprises a turbomolecular pump.

10. The device of claim 1, wherein said inorganic layer deposition station is configured to deposit a first layer of said stacked multilayer coating onto said substrate.

11. The device of claim 1, wherein said reduced-pressure source is placed in vacuum communication with said inorganic layer deposition station such that during at least a portion of deposition of said inorganic layer onto said substrate, said reduced-pressure source operates to create an at least partially evacuated environment about said substrate.

12. The device of claim 1, wherein said organic layer deposition station is further configured to deposit at least one inorganic layer onto said substrate.

13. The device of claim 12, wherein the part of said organic layer deposition station that is further configured to deposit at least one inorganic layer onto said substrate and the part of said organic layer deposition tool that is configured to deposit at least one organic layer onto said substrate cooperate with one another to deposit said multilayer coating onto said substrate.

14. The device of claim 1, wherein said reduced-pressure source comprises a pumping port that is vacuum connected to at least one of a vacuum source and a pumping assembly.

15. The device of claim 14, wherein said organic material confinement mechanism is cooperative with said pumping port and comprises an organic material thermal barrier and a shutter.

16. The device of claim 15, wherein said organic material confinement mechanism comprises a chamber within a chamber.

17. A tool for depositing a multilayer coating on a discrete substrate, said tool comprising:
    a plurality of peripheral stations disposed about a substantially central hub and coupled thereto such that said substantially central hub can transport said substrate between at least one of said peripheral stations, said plurality of peripheral stations comprising:
        an inorganic barrier layer forming station comprising a cluster configuration; and
        at least one organic layer forming station comprising an in-line configuration with an organic material supply, an organic material evaporator, an organic material deposition nozzle, an organic material curing station and a vacuum-based organic material confinement mechanism such that during at least a portion of deposition of said organic layer onto said substrate, said organic material confinement mechanism operates to substantially prevent stray organic material that is about said substrate from reaching said organic material curing station, wherein said inorganic layer forming station and said organic layer forming station cooperate with one another to deposit said multilayer coating that comprises an alternating pattern of organic layers and inorganic layers to encapsulate an organic light-emitting diode that is situated on said substrate;
    a reduced-pressure source placed in vacuum communication with at least one of said inorganic barrier layer forming station and said organic layer forming station such that during at least a portion of deposition of said multilayer coating onto said substrate, said reduced-pressure source operates to create an at least partially evacuated environment about said substrate; and
    a temperature control device placed in thermal communication with at least said organic layer forming station such that during at least a portion of deposition of said multilayer coating onto said substrate, said temperature control device operates to adjust the temperature of said substrate.

18. The tool of claim 17, wherein said temperature control device is configured to reduce the temperature of said substrate.

19. The tool of claim 17, further comprising at least one masking station disposed in said tool, said masking station configured to place at least one mask on said substrate.

20. The tool of claim 17, wherein said at least one organic layer forming station comprises a substrate-transport configured to convey said substrate between at least said organic material deposition nozzle and said organic material curing station.

21. The tool of claim 17, wherein said at least one organic layer forming station is further configured to deposit at least one inorganic layer onto said substrate.

22. The tool of claim 21, wherein the part of said at least one organic layer forming station that is further configured to deposit at least one inorganic layer onto said substrate and the part of said at least one organic layer forming station that is configured to deposit at least one organic layer on said substrate cooperate with one another to deposit said multilayer coating onto said substrate.

23. A tool for depositing a multilayer coating that comprises an alternating pattern of organic layers and inorganic layers to encapsulate an organic light-emitting diode that is situated on a discrete substrate, said tool comprising:
    a monomer layer deposition station comprising an in-line tool to deposit at least one organic layer onto said substrate, said in-line tool comprising an organic material supply, an organic material evaporator, an organic material deposition nozzle, an organic material curing station and a vacuum-based organic material confinement mechanism;
    an inorganic barrier layer deposition station cooperative with said monomer layer deposition station, said barrier layer deposition station comprising a cluster tool to deposit at least one inorganic layer onto said substrate; and
    a reduced-pressure source placed in vacuum communication with said at least said organic material confinement mechanism such that during at least a portion of deposition of said multilayer coating onto said discrete substrate, said reduced-pressure source operates to create an at least partially evacuated environment about said substrate, with said organic material confinement mechanism operative to substantially prevent stray organic material that is about said substrate from reaching said organic material curing station during said encapsulation of said organic light-emitting diode between substrate and said multilayer coating.

24. The tool of claim 23, further comprising a masking station cooperative with said tool, said masking station configured to place at least one mask on said substrate.

25. The tool of claim 24, wherein said masking station comprises an organic mask placement device and an inorganic mask placement device.

26. The tool of claim 23, wherein said monomer layer deposition station and said barrier layer deposition station are configured to reverse said substrate along respective transport paths therein such that multiple layers of said multilayer coating may be deposited.

27. The tool of claim 23, further comprising an environmental isolation valve disposed between said monomer layer deposition station and said barrier layer deposition station.

28. The tool of claim 23, further comprising at least one surface treatment chamber configured to enhance the ability of individual layers of said multilayer coating to adhere to said substrate or an adjacent layer of said multilayer coating.

29. The tool of claim 28, wherein said surface treatment chamber is disposed in said monomer layer deposition station.

30. The tool of claim 29, wherein said surface treatment chamber comprises a plasma energy source.

31. The tool of claim 29, wherein said surface treatment chamber comprises a thermal evaporation device.

32. The tool of claim 29, wherein said thermal evaporation device is configured to deposit a non-oxide material.

33. The tool of claim 32, wherein said non-oxide material comprises at least one of lithium fluoride or magnesium fluoride.

34. The tool of claim 23, wherein said barrier layer deposition station is configured to place an inorganic layer onto said substrate prior to the placement of an organic layer from said monomer layer deposition station.

35. The tool of claim 23, wherein said reduced-pressure source is configured to provide a different vacuum level during deposition of said inorganic layer than during deposition of said organic layer.

36. The tool of claim 23, wherein said monomer layer deposition station configured as an in-line tool is further configured to deposit at least one inorganic layer onto said substrate.

37. The tool of claim 36, wherein the part of said monomer layer deposition station configured as an in-line tool that is further configured to deposit at least one inorganic layer on said substrate and the part of said monomer layer deposition station configured as an in-line tool that is configured to deposit at least one organic layer on said substrate cooperate with one another to deposit a multilayer coating onto said substrate.

38. An encapsulating tool configured to deposit a multilayer coating onto an organic light emitting diode placed on a discrete substrate, said encapsulating tool comprising:
an inorganic layer deposition tool comprising a cluster configuration, said inorganic layer deposition tool configured to deposit at least one inorganic layer onto said organic light emitting diode;
an organic layer deposition tool comprising an in-line configuration with an organic material supply, an organic material evaporator, an organic material deposition nozzle, an organic material curing station and a vacuum-based organic material confinement mechanism, said organic layer deposition tool operatively coupled to said inorganic layer deposition tool and configured to deposit at least one organic layer onto said organic light emitting diode; and
a vacuum source coupled to at least said organic layer deposition tool such that during at least a portion of deposition of said organic layer onto said organic light emitting diode, said vacuum source operates to create an at least partially evacuated environment about said organic light emitting diode to substantially prevent stray organic material that is about said substrate from reaching said organic material curing station during said encapsulation of said organic light-emitting diode between substrate and said multilayer coating.

39. The encapsulation tool of claim 38, wherein said encapsulation tool is configured such that either said inorganic or organic layer can be first applied to said organic light emitting diode.

40. The encapsulation tool of claim 38, wherein said organic layer deposition tool is further configured to deposit at least one inorganic layer onto said substrate.

41. The encapsulation tool of claim 40, wherein the part of said organic layer deposition tool that is further configured to deposit at least one inorganic layer onto said substrate and the part of said organic layer deposition tool that is configured to deposit at least one organic layer onto said substrate cooperate with one another to deposit a multilayer coating onto said substrate.

42. A hybrid tool for encapsulating an organic light-emitting diode, said tool comprising:
an encapsulation device comprising:
an in-line organic layer forming station comprising:
an organic material deposition station comprising an organic material supply, an organic material evaporator and an organic material deposition nozzle;
an organic material curing station cooperative with said organic material deposition station;
a substrate-transport configured to convey a substrate between at least said organic material deposition station and said organic material curing station;
a vacuum-based organic material confinement mechanism comprising a reduced-pressure source placed in vacuum communication with said organic material deposition station such that during at least a portion of deposition of an organic layer onto a discrete substrate, said reduced-pressure source operates to create an at least partially evacuated environment about said substrate to substantially prevent stray organic material that is about said substrate from reaching said organic material curing station during encapsulation of said organic light-emitting diode between substrate and a multilayer coating comprising an alternating arrangement of organic and inorganic layers; and
a thermal control mechanism cooperative with at least one of said organic material deposition station and organic material curing station such that a temperature therein can be controlled during formation of said organic material on said substrate; and
a cluster-based barrier layer forming station configured to place at least one inorganic layer or said organic layer onto or over said substrate, said barrier layer forming station and said organic layer forming station cooperative with one another such that upon operation thereof said multilayer coating that comprises an alternating arrangement of said organic and barrier layers cooperates with said substrate to form said organic light-emitting diode into said encapsulated member;
a load lock to facilitate selective vacuum isolation between said encapsulation device and a remainder of said tool; and
an exchange mechanism to facilitate transport of said at least one encapsulated member between said encapsulation device and said remainder of said tool.

43. The tool of claim 42, wherein said exchange mechanism comprises an accumulator.

44. The tool of claim 42, wherein said organic layer forming station further comprises a cleaning system.

45. The tool of claim 44, wherein said cleaning system comprises a glow discharge device.

46. The tool of claim 42, wherein said organic layer forming station is further configured to deposit said at least one inorganic layer onto said substrate.

47. The tool of claim 46, wherein the part of said organic layer forming station that is further configured to deposit at least one inorganic layer onto said substrate and the part of said organic layer forming station that is configured to deposit at least one organic layer on said substrate cooperate with one another to deposit said multilayer coating onto said substrate.

* * * * *

UNITED STATES PATENT AND TRADEMARK OFFICE
CERTIFICATE OF CORRECTION

| | | |
|---|---|---|
| PATENT NO. | : 8,900,366 B2 | Page 1 of 1 |
| APPLICATION NO. | : 11/112880 | |
| DATED | : December 2, 2014 | |
| INVENTOR(S) | : Martin Philip Rosenblum et al. | |

It is certified that error appears in the above-identified patent and that said Letters Patent is hereby corrected as shown below:

On the Title Page

(57) "ABSTRACT
A tool for depositing multilayer coatings onto a substrate. In one configuration, the tool includes a includes an in-line organic material deposition station operating under at least one of a pressure or temperature controlled environment. In another, it further is of a hybrid design that incorporates both in-line and cluster tool features. In this latter configuration, at least one of the deposition stations is configured to deposit an inorganic layer, while at least one other deposition station is configured to deposit an organic layer. The tool is particularly well-suited to depositing multilayer coatings onto discrete substrates, as well as to encapsulating environmentally-sensitive devices placed on the flexible substrate."

should read

(57) --ABSTRACT
A tool for depositing multilayer coatings onto a substrate. In one configuration, the tool includes an in-line organic material deposition station operating under at least one of a pressure or temperature controlled environment. In another, it further is of a hybrid design that incorporates both in-line and cluster tool features. In this latter configuration, at least one of the deposition stations is configured to deposit an inorganic layer, while at least one other deposition station is configured to deposit an organic layer. The tool is particularly well-suited to depositing multilayer coatings onto discrete substrates, as well as to encapsulating environmentally-sensitive devices placed on the flexible substrate.--; and In the Claims Col. 34, Claim 1, Line 4,
"inorganic layers onto to an organic light-emitting diode that is" should read
--inorganic layers onto an organic light-emitting diode that is--.

Signed and Sealed this
Fourteenth Day of July, 2015

Michelle K. Lee
*Director of the United States Patent and Trademark Office*